(12) United States Patent  
Yamazaki

(10) Patent No.: US 10,153,307 B2  
(45) Date of Patent: Dec. 11, 2018

(54) SEMICONDUCTOR DEVICE WITH REDUCED ELECTROSTATIC DISCHARGE (ESD) IN A MANUFACTURING PROCESS

(71) Applicant: Semiconductor Energy Laboratory Co., Ltd., Atsugi-shi, Kanagawa-ken (JP)

(72) Inventor: Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/886,831

(22) Filed: Oct. 19, 2015

(65) Prior Publication Data

US 2016/0043112 A1    Feb. 11, 2016

Related U.S. Application Data

(63) Continuation of application No. 13/833,370, filed on Mar. 15, 2013, now Pat. No. 9,166,054.

(30) Foreign Application Priority Data

Apr. 13, 2012   (JP) ................................ 2012-092351

(51) Int. Cl.
    *H01L 27/12*         (2006.01)
    *H01L 27/02*         (2006.01)
    (Continued)

(52) U.S. Cl.
    CPC .......... *H01L 27/1244* (2013.01); *H01L 23/52* (2013.01); *H01L 23/60* (2013.01);
    (Continued)

(58) Field of Classification Search
    CPC . H01L 27/1244; H01L 27/0248; H01L 23/60; H01L 27/1225; H01L 27/124;
    (Continued)

(56) References Cited

U.S. PATENT DOCUMENTS 5,781,253 A    7/1998   Koike et al.
5,929,948 A    7/1999   Ohori et al.
(Continued)

FOREIGN PATENT DOCUMENTS

EP         0772073 A    5/1997
JP         63-276030 A   11/1988
(Continued)

*Primary Examiner* — Allen Parker
*Assistant Examiner* — Didarul Mazumder
(74) *Attorney, Agent, or Firm* — Robinson Intellectual Property Law Office; Eric J. Robinson

(57) ABSTRACT

A semiconductor device is provided in which ESD is less likely to occur in a manufacturing process thereof. In manufacture of a semiconductor device including a long lead wiring A, during steps with direct exposure to a plasma atmosphere, a plurality of island-shaped wirings is formed for the wiring A and then electrically connected to one another in series. Specifically, a plurality of island-shaped wirings is formed, covered with an insulating layer, and electrically connected to one another in series by a wiring formed over the insulating layer. The island-shaped wiring and the wiring formed over the insulating layer are electrically connected to each other through an opening formed in the insulating layer.

14 Claims, 24 Drawing Sheets

(51) Int. Cl.
  *H01L 23/60* (2006.01)
  *H01L 23/52* (2006.01)
  *H01L 29/66* (2006.01)
  *H01L 29/78* (2006.01)
  *H01L 29/00* (2006.01)
  *H01L 29/786* (2006.01)
(52) U.S. Cl.
  CPC ........ *H01L 27/0248* (2013.01); *H01L 27/124* (2013.01); *H01L 27/1225* (2013.01); *H01L 29/66477* (2013.01); *H01L 29/786* (2013.01); *H01L 2924/0002* (2013.01)
(58) Field of Classification Search
  CPC . H01L 23/52; H01L 29/66477; H01L 29/786; H01L 2924/0002; H01L 2924/00
  USPC ............... 257/57, 59, 66, 72, 758, 759, 760, 257/E23.145
  See application file for complete search history.

(56) References Cited

U.S. PATENT DOCUMENTS

| | | | |
|---|---|---|---|
| 6,124,604 A | 9/2000 | Koyama et al. | |
| 6,825,488 B2 | 11/2004 | Yamazaki et al. | |
| 7,061,565 B2 | 6/2006 | Kwon et al. | |
| 7,088,401 B1 | 8/2006 | Ihara et al. | |
| 7,607,113 B2 | 10/2009 | Kitamura | |
| 7,652,740 B2 | 1/2010 | Hwang et al. | |
| 7,791,072 B2 | 9/2010 | Kumomi et al. | |
| 8,017,456 B2 | 9/2011 | Yamazaki et al. | |
| 8,168,975 B2 | 5/2012 | Koyama et al. | |
| 8,294,147 B2 | 10/2012 | Yamazaki et al. | |
| 8,945,982 B2 | 2/2015 | Yamazaki | |
| 9,390,918 B2 | 7/2016 | Yamazaki | |
| 2003/0201484 A1 | 10/2003 | Ozawa | |
| 2004/0041958 A1* | 3/2004 | Hwang | G02F 1/136286 349/43 |
| 2004/0145018 A1 | 7/2004 | Inoue et al. | |
| 2004/0263706 A1* | 12/2004 | Cho | G02F 1/136286 349/43 |
| 2005/0050505 A1 | 3/2005 | Bednar et al. | |
| 2006/0028598 A1 | 2/2006 | Lee et al. | |
| 2006/0088949 A1 | 4/2006 | Smayling et al. | |
| 2006/0108916 A1* | 5/2006 | Koo | H01L 27/3262 313/504 |
| 2008/0068524 A1* | 3/2008 | Kim | G02F 1/136286 349/38 |
| 2008/0265422 A1 | 10/2008 | Ellis-Monaghan et al. | |
| 2009/0008744 A1* | 1/2009 | Nishi | H01L 27/10855 257/532 |
| 2009/0065841 A1 | 3/2009 | Shappir et al. | |
| 2009/0102059 A1 | 4/2009 | Ishii | |
| 2010/0012940 A1* | 1/2010 | Sato | H01L 27/1214 257/59 |
| 2010/0051933 A1* | 3/2010 | Kim | H01L 29/7869 257/43 |
| 2010/0110623 A1* | 5/2010 | Koyama | H01L 27/1225 361/679.01 |
| 2010/0201000 A1 | 8/2010 | Antol et al. | |
| 2011/0240998 A1 | 10/2011 | Morosawa et al. | |
| 2011/0309353 A1 | 12/2011 | Kaneko et al. | |
| 2012/0061673 A1* | 3/2012 | Yamazaki | H01L 27/1225 257/59 |
| 2012/0133878 A1* | 5/2012 | Hirakata | G02F 1/133528 349/141 |
| 2012/0228619 A1 | 9/2012 | Youn et al. | |
| 2013/0146862 A1* | 6/2013 | Kim | H01L 27/1225 257/43 |
| 2013/0285057 A1 | 10/2013 | Ishii | |
| 2016/0322506 A1 | 11/2016 | Yamazaki | |

FOREIGN PATENT DOCUMENTS

| | | |
|---|---|---|
| JP | 02-039029 A | 2/1990 |
| JP | 07-092448 A | 4/1995 |
| JP | 08-106108 A | 4/1996 |
| JP | 09-146107 A | 6/1997 |
| JP | 2001-013523 A | 1/2001 |
| JP | 2008-066680 A | 3/2008 |
| JP | 2009-105160 A | 5/2009 |
| JP | 2011-228622 A | 11/2011 |
| JP | 2011-243973 A | 12/2011 |
| KR | 2008-0048261 A | 6/2008 |
| WO | WO-2011/132625 | 10/2011 |

\* cited by examiner

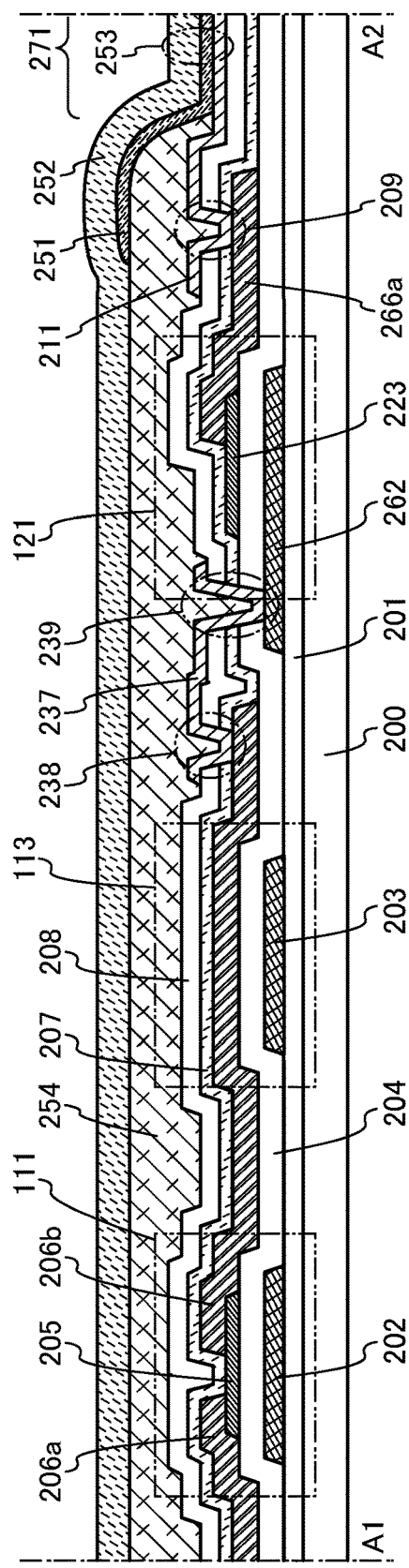
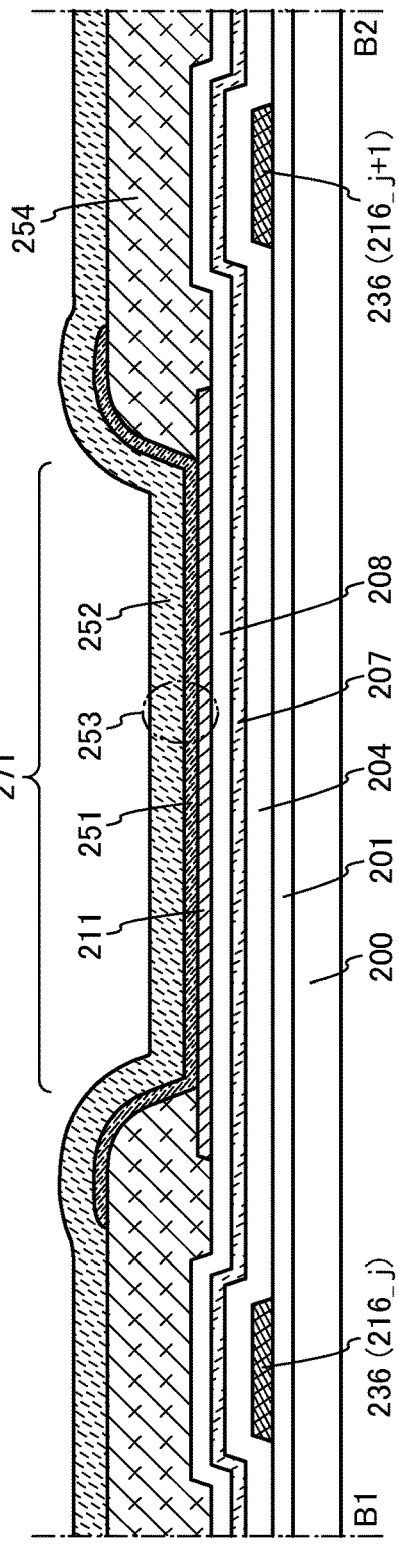

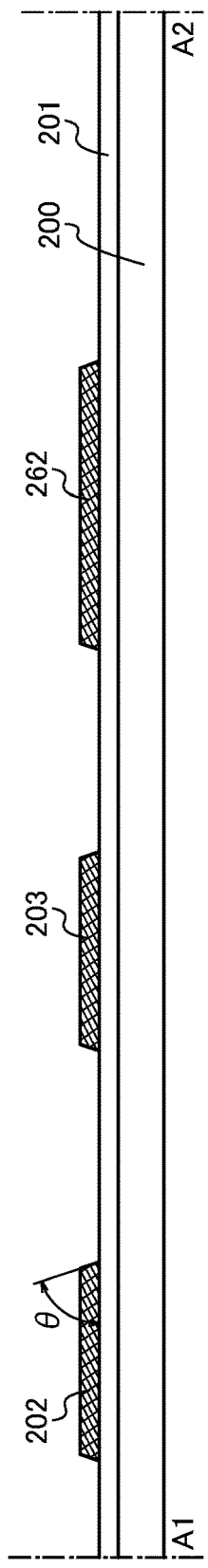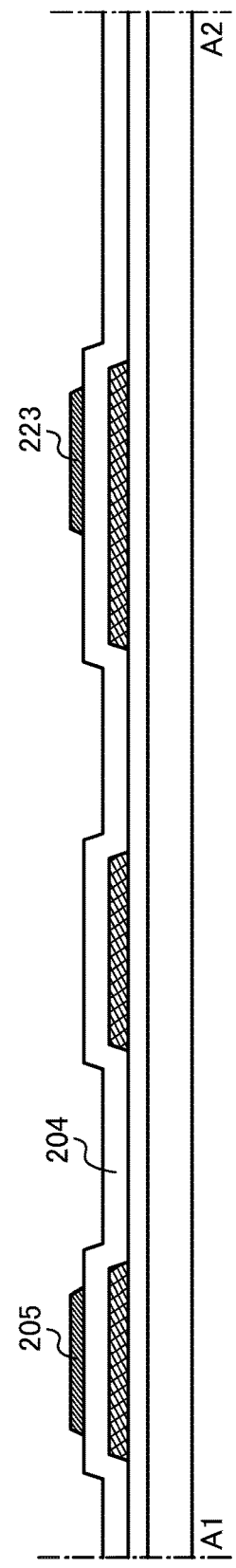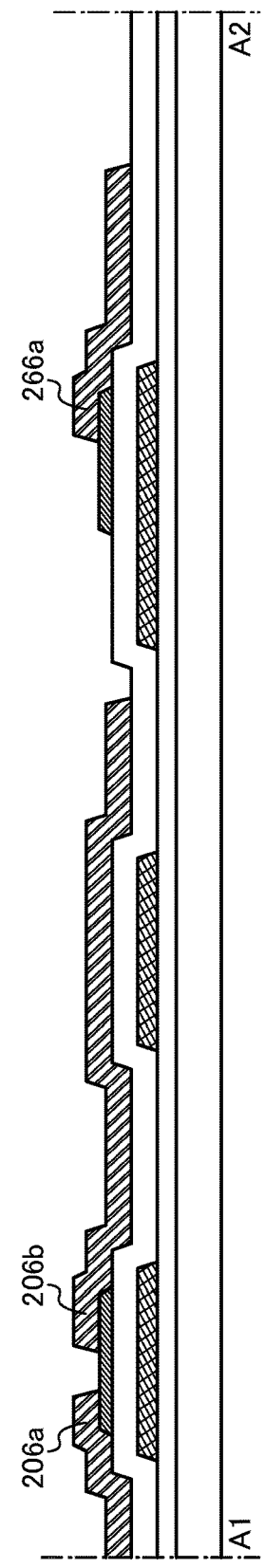

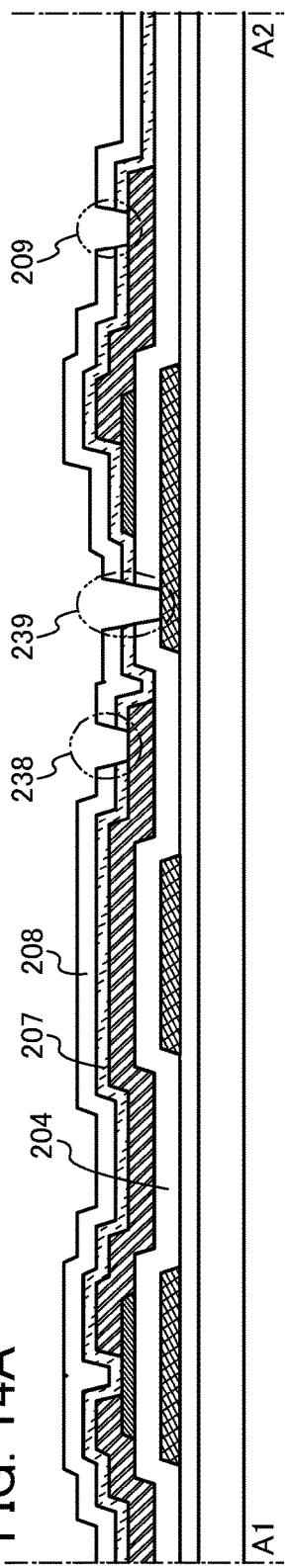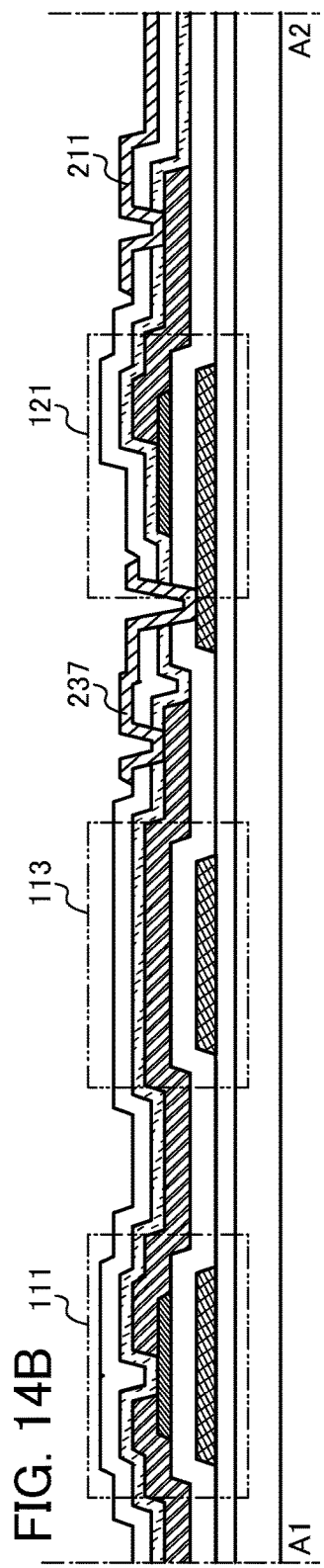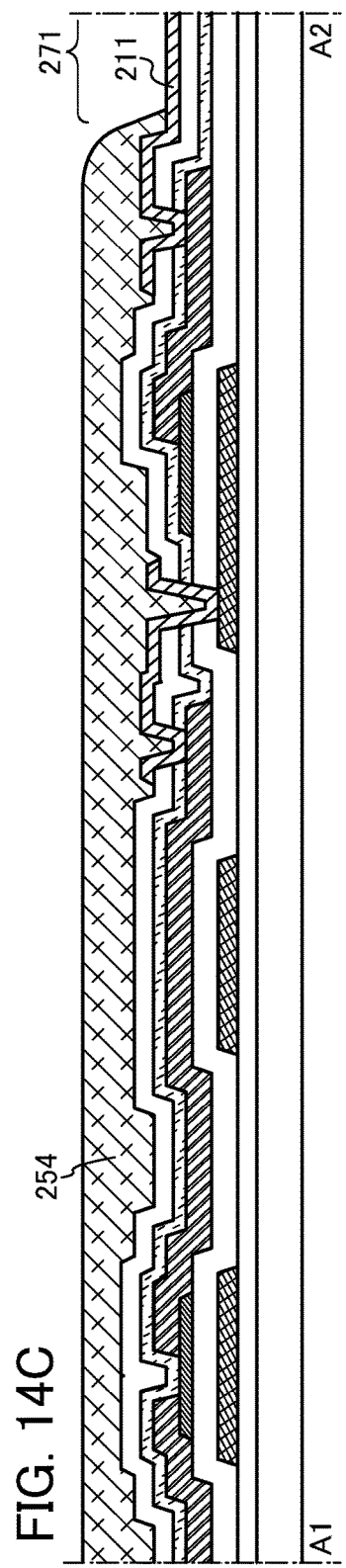

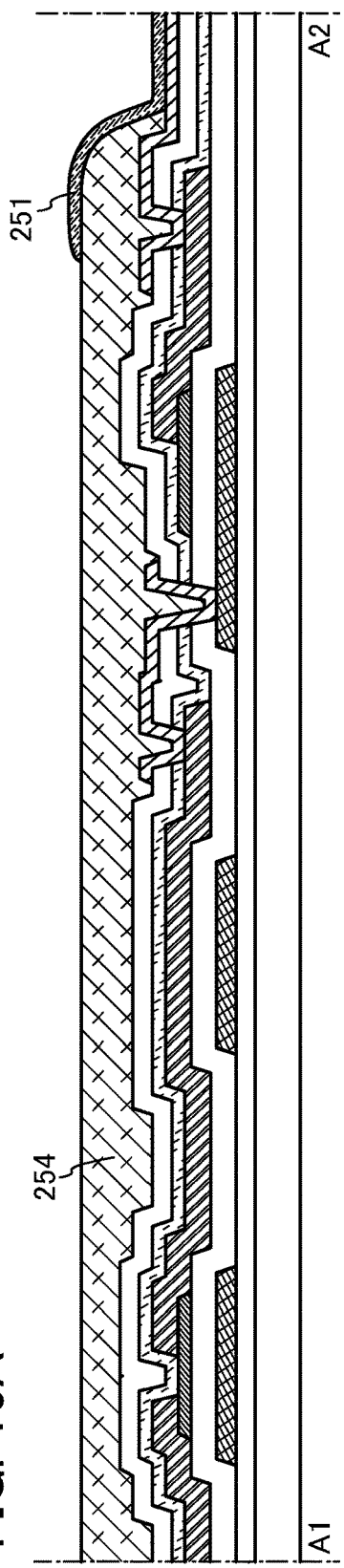
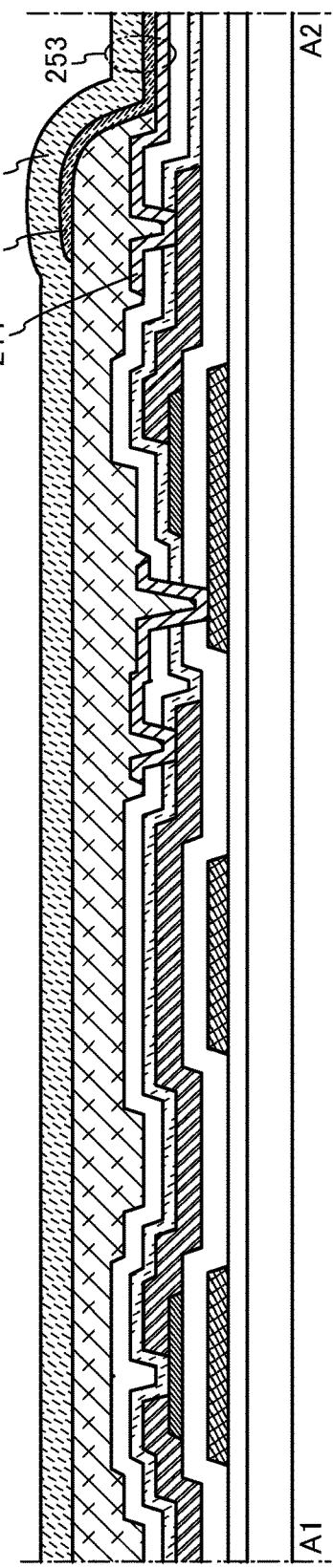
FIG. 15A
FIG. 15B

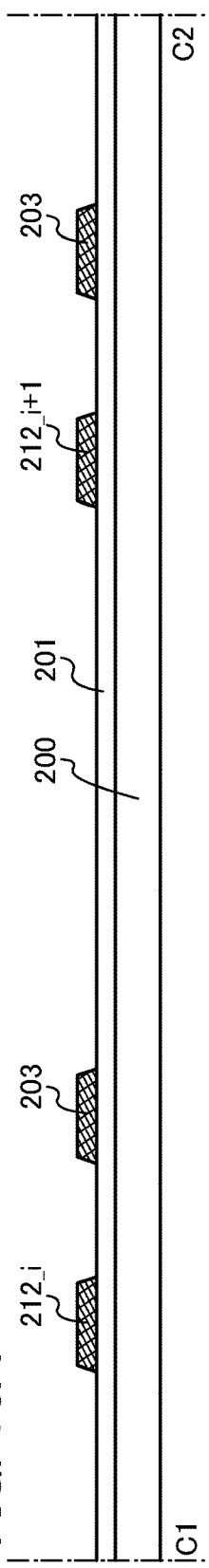
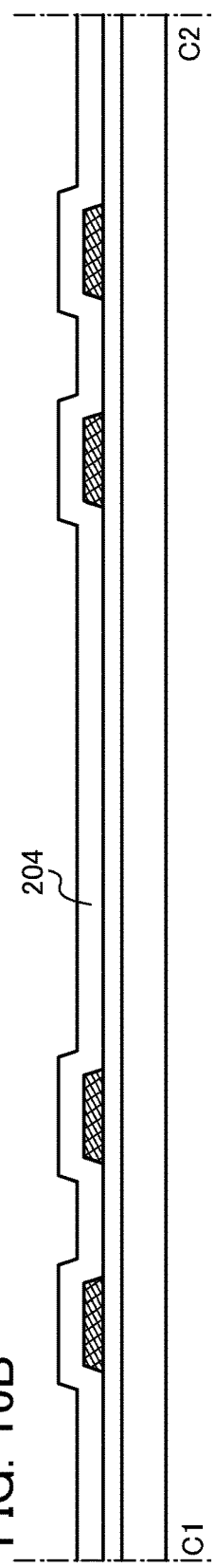
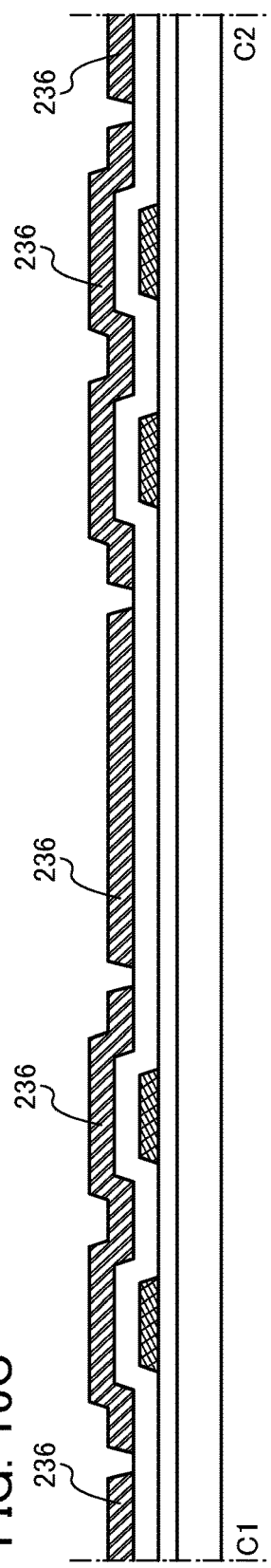

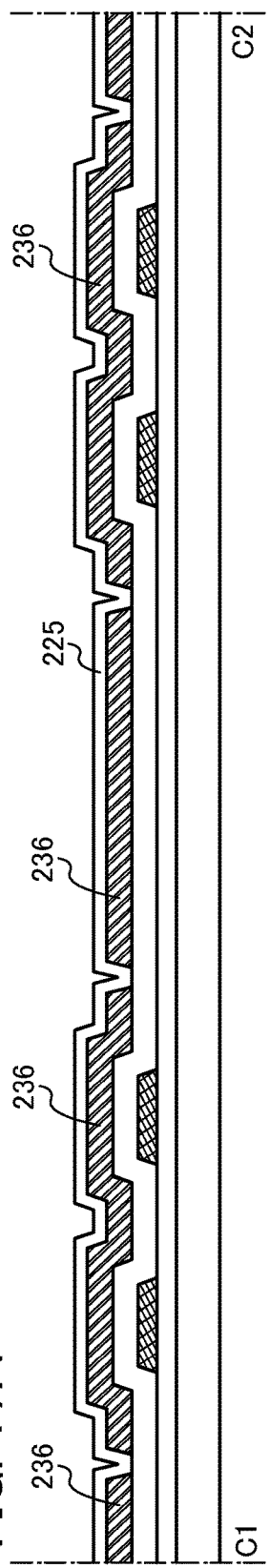
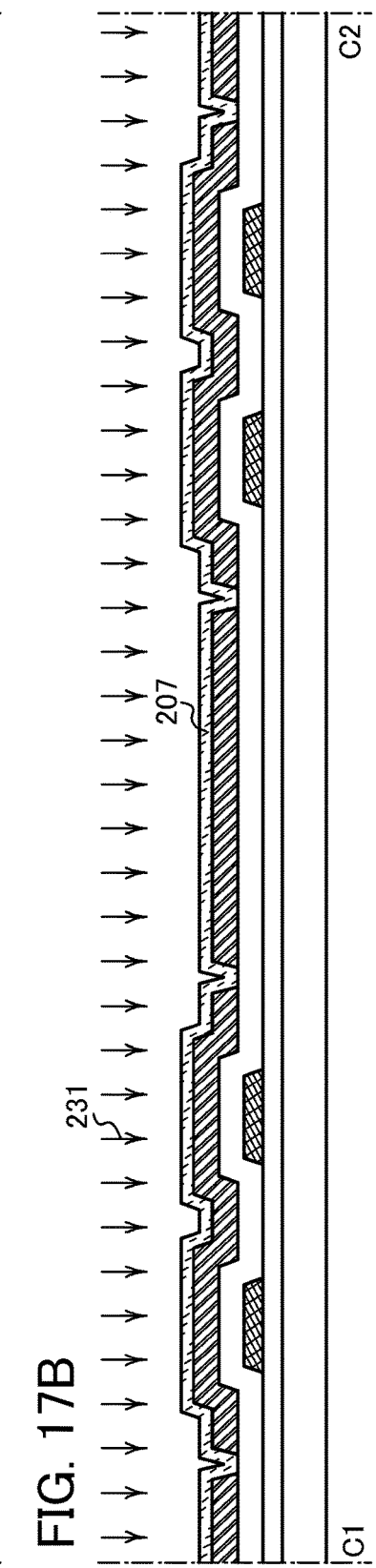
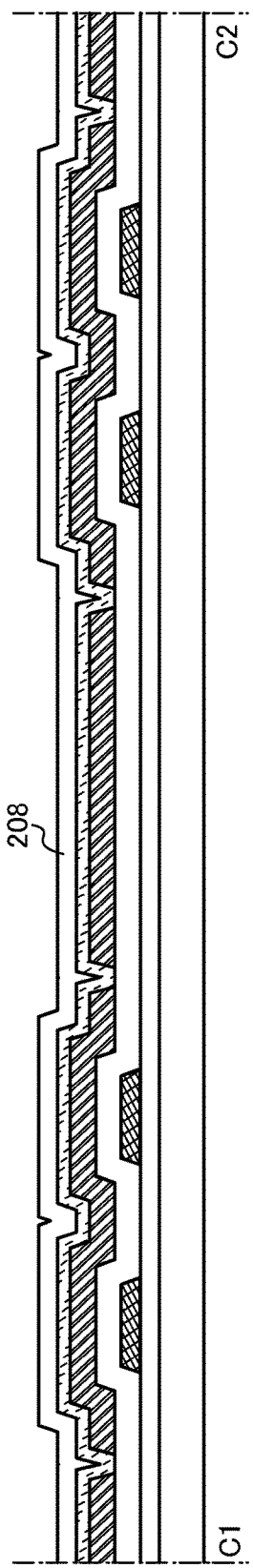
FIG. 17A
FIG. 17B
FIG. 17C

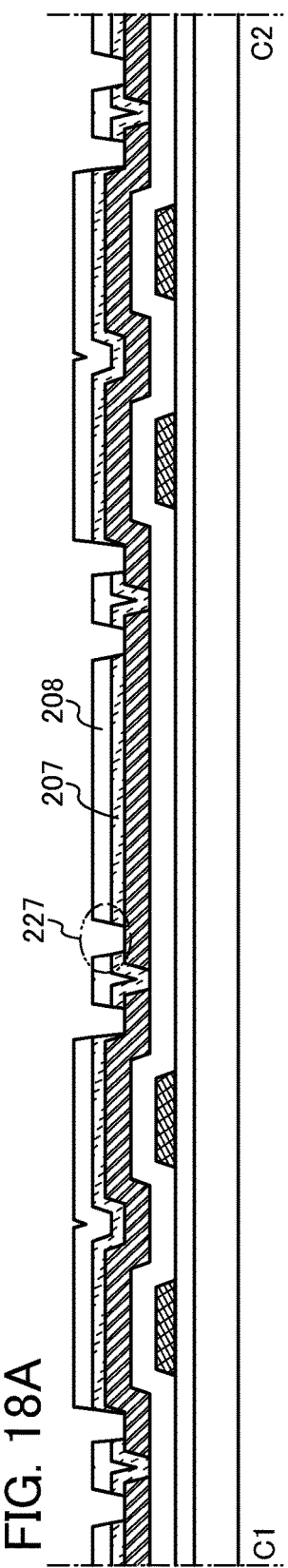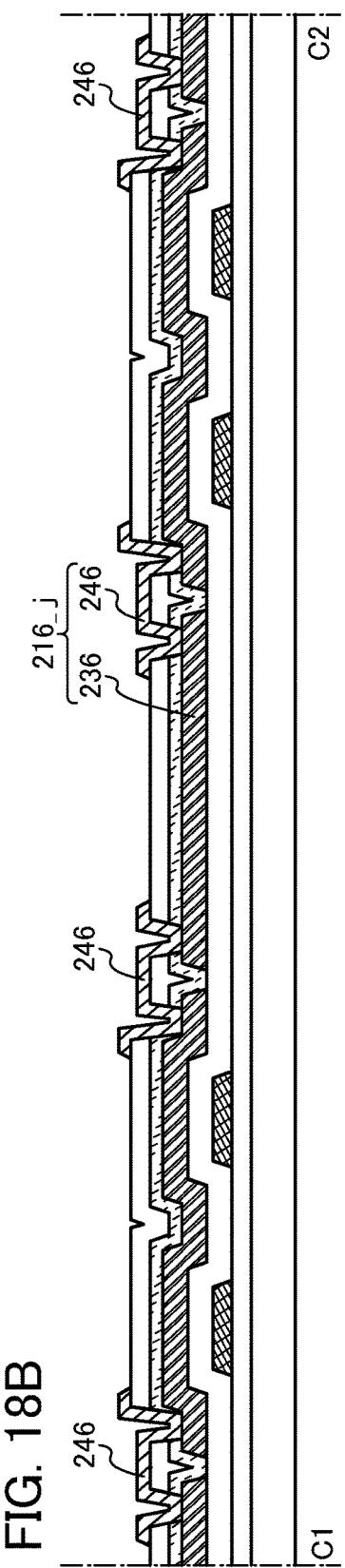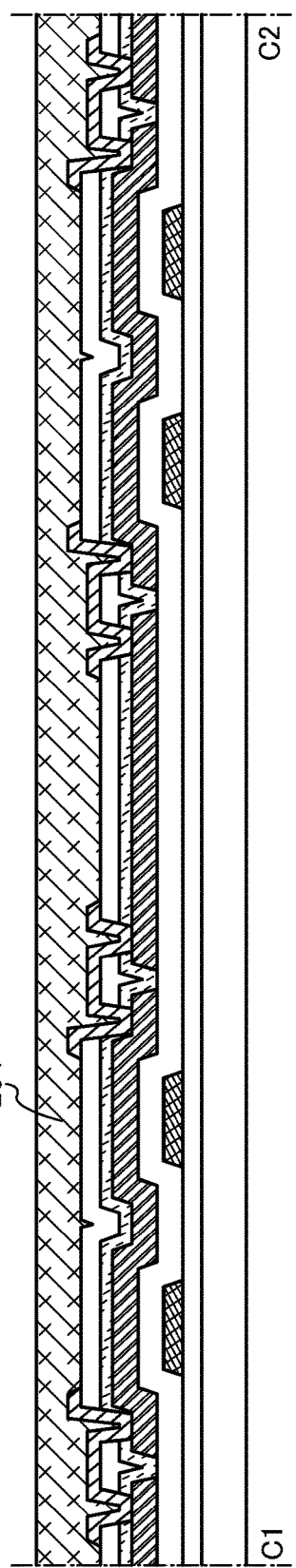

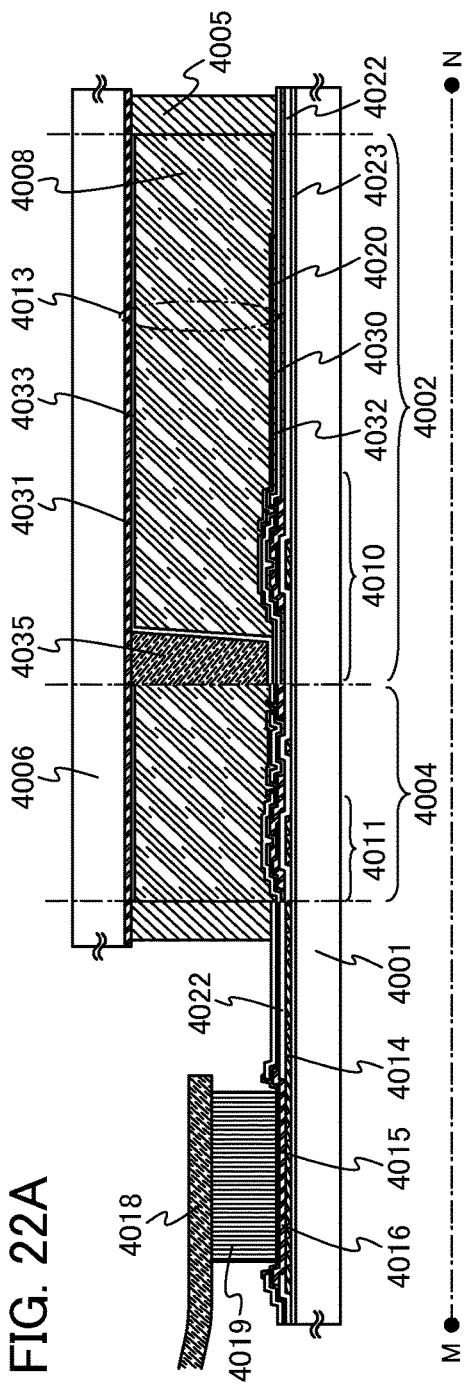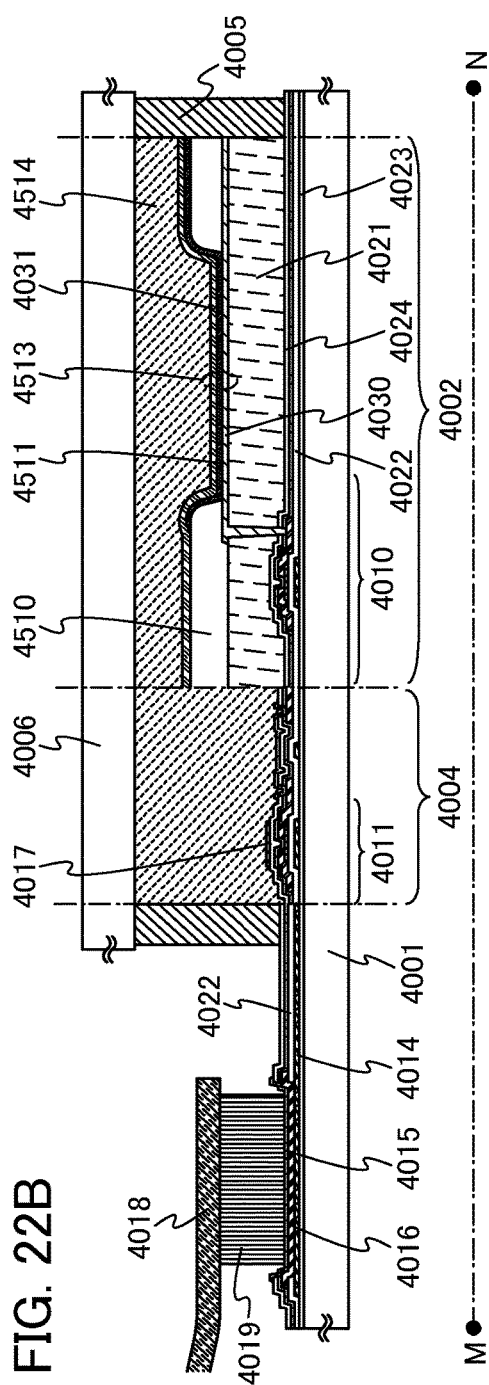

SEMICONDUCTOR DEVICE WITH REDUCED ELECTROSTATIC DISCHARGE (ESD) IN A MANUFACTURING PROCESS

BACKGROUND OF THE INVENTION

1. Field of the Invention

The present invention relates to a semiconductor device in which ESD is less likely to occur in a manufacturing process and a manufacturing method thereof.

In this specification and the like, the semiconductor device refers to any device which can function by utilizing semiconductor characteristics; an electro-optical device, a display device, a semiconductor circuit, and an electronic device are all included in the category of the semiconductor device.

2. Description of the Related Art

In a semiconductor circuit used in a semiconductor device such as a display device, a semiconductor element, an electrode, an insulating layer, or the like could be damaged by electrostatic discharge (hereinafter referred to as "ESD"). As a measure to prevent damage of a semiconductor circuit due to ESD, a protection circuit is connected to a semiconductor circuit in many cases. A protection circuit refers to a circuit for preventing overvoltage applied to a terminal, a wiring, or the like from being supplied to a semiconductor circuit. A resistor, a diode, a transistor, and a capacitor are typically used in the protection circuit.

Even when noise as well as a signal and power supply voltage is input to a wiring or the like, the protection circuit can also prevent a malfunction of a semiconductor circuit in a later stage due to the noise and degradation or damage of the semiconductor element due to the noise.

Patent Document 1, for example, discloses a technique of connecting a protection circuit in which a MOS transistor whose source and gate are short-circuited and a MOS transistor whose gate and drain are short-circuited are connected in series between a scan electrode of a display device and a conductive line provided in the periphery of a display portion.

REFERENCE

Patent Document

[Patent Document 1] Japanese Published Patent Application No. H7-092448

SUMMARY OF THE INVENTION

However, only the protection circuit formed between the scan electrode of the display device and the conductive line provided in the periphery of the display portion, as described in Patent Document 1, is not sufficient to prevent a semiconductor element such as a transistor provided in the display device from being damaged by ESD. In particular, the display device includes long lead wirings. When the long lead wiring in a floating state (an electrically isolated state) is exposed to a plasma atmosphere, charge is easily accumulated, and ESD is caused by the charge accumulated in the wiring; thus, a transistor might be damaged. Further, ESD occurs between the wiring and a wiring below the wiring with an insulating layer provided therebetween and the insulating layer is damaged, thus, both the wirings might be short-circuited.

In view of the above problem, it is an object of one embodiment of the disclosed invention to provide a semiconductor device in which ESD is less likely to occur in a manufacturing process.

When a conductive layer formed using metal or the like in a floating state is exposed to a plasma atmosphere, charge is easily accumulated. As an example of a step in which the conductive layer in a floating state is exposed to a plasma atmosphere, there are an etching step for forming a wiring by processing the conductive layer by a dry etching method, a step of forming an insulating layer over the formed wiring by a plasma CVD method or the like, and the like.

The amount of accumulated charge is increased as the surface area of the conductive layer becomes larger. Thus, the amount of accumulated charge is increased in a long lead wiring, so that ESD easily occurs in a transistor connected to the wiring or between the wiring and a wiring overlapping with the wiring.

Therefore, in formation of the long lead wiring, a plurality of island-shaped wirings is formed during steps in which the wirings in a floating state are directly exposed to a plasma atmosphere and then electrically connected to one another in series, so that the long lead wiring is formed; thus, a semiconductor device can be prevented from being damaged by ESD.

Specifically, in the case where a long lead wiring is formed over a first wiring with a first insulating layer provided therebetween, a plurality of second island-shaped wirings is formed over the first insulating layer, covered with a second insulating layer, and then electrically connected to one another in series by a plurality of third island-shaped wirings formed over the second insulating layer. The second wirings and the third wirings over the second insulating layer are electrically connected to one another through openings formed in the second insulating layer.

Further, it is preferable that the second island-shaped wiring formed over the first insulating layer do not overlap with the first wiring.

One embodiment of the present invention includes a first wiring, a first insulating layer covering the first wiring, a plurality of second wirings having island shapes over the first insulating layer, a second insulating layer covering the second wiring, and a plurality of third wirings having island shapes over the second insulating layer. The second wiring is electrically connected to the third wiring through an opening in the second insulating layer. The plurality of second wirings is electrically connected to one another in series by the plurality of third wirings.

At least part of the plurality of second wirings may be formed using the same conductive layer as the first wiring.

According to one embodiment of the present invention, a gate electrode is formed; a gate insulating layer covering the gate electrode is formed; an island-shaped semiconductor layer at least partly overlapping with the gate electrode is formed over the gate insulating layer; a plurality of wirings electrically isolated, a first electrode electrically connecting part of the wiring and the semiconductor layer, and a second electrode are formed over the gate insulating layer; an insulating layer covering the wirings, the first electrode, and the second electrode is formed; part of the insulating layer is removed and first openings are formed over the plurality of wirings; part of the insulating layer is removed and a second opening is formed over the second electrode; a connection wiring electrically connecting the plurality of wirings is formed over the insulating layer and the first openings; and a pixel electrode electrically connected to the second electrode is formed over the insulating layer and the second opening.

Further, the first openings and the second opening can be formed at the same time. Furthermore, the connection wiring and the pixel electrode can be formed using the same conductive layer.

According to one embodiment of the present invention, a semiconductor device can be provided in which ESD is less likely to occur in a manufacturing process thereof.

BRIEF DESCRIPTION OF THE DRAWINGS

In the accompanying drawings:

FIGS. 3A and 3B are cross-sectional views illustrating one embodiment of the present invention;

FIGS. 12A to 12C illustrate a manufacturing method;
FIGS. 14A to 14C illustrate a manufacturing method;
FIGS. 15A and 15B illustrate a manufacturing method;
FIGS. 16A to 16C illustrate a manufacturing method;
FIGS. 17A to 17C illustrate a manufacturing method;
FIGS. 18A to 18C illustrate a manufacturing method.

FIGS. 22A and 22B illustrate embodiments of the present invention;

DETAILED DESCRIPTION OF THE INVENTION

Figure 1:
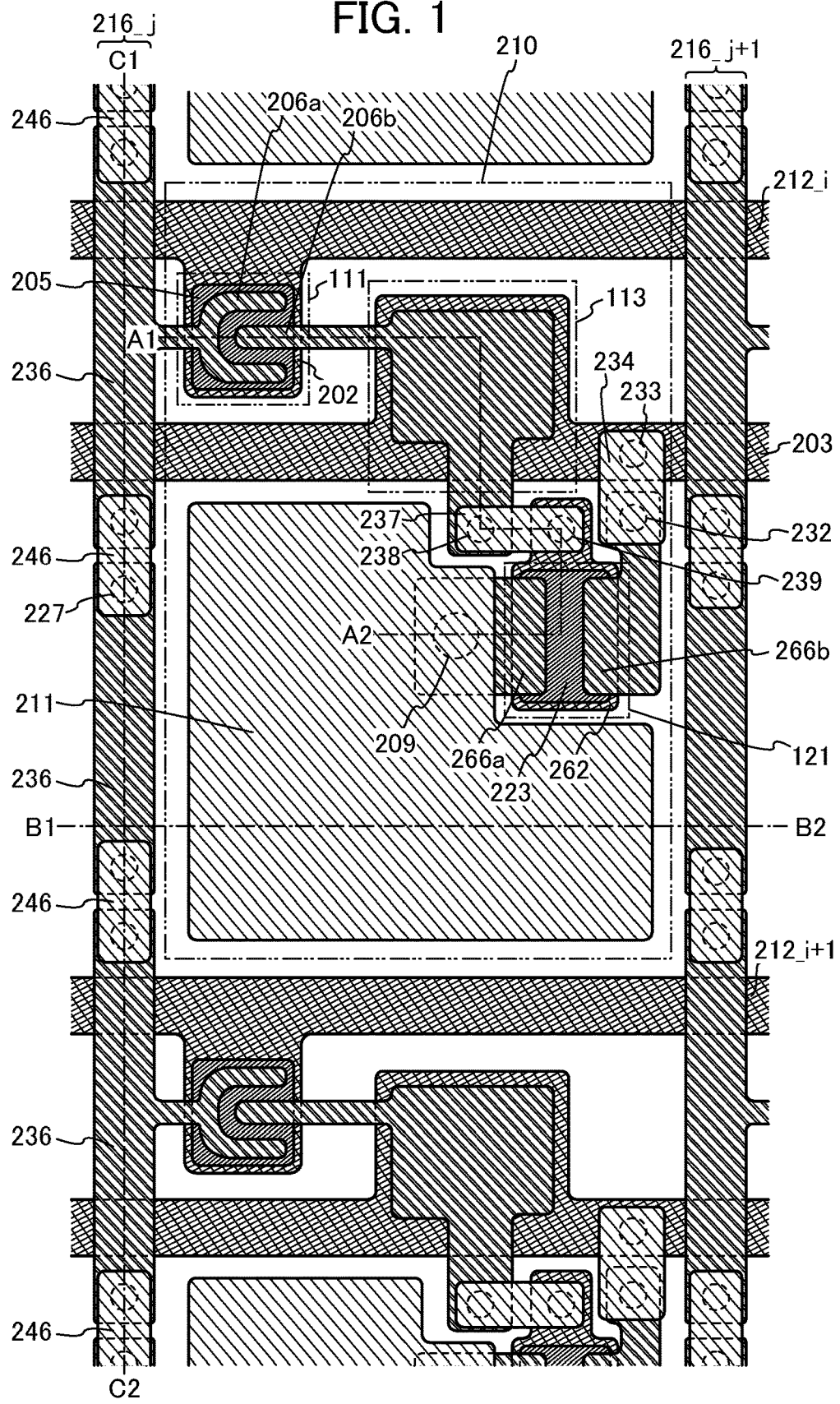
FIG. 1 is a top view illustrating one embodiment of the present invention.

Hereinafter, embodiments of the present invention will be described with reference to the drawings. Note that the present invention is not limited to the following description, and it will be readily appreciated by those skilled in the art that the mode and details can be changed in various different ways without departing from the spirit and the scope of the present invention. Therefore, the present invention should not be construed as being limited to the following description of the embodiments. Note that in the structures of the present invention which are described below, the same reference numerals are commonly used to denote the same components or components having similar functions among different drawings, and description of such components is not repeated.

In addition, in this specification and the like, ordinal numbers such as "first", "second", and "third" are used in order to avoid confusion among components, and the terms do not limit the components numerically.

In addition, the position, size, range, or the like of each structure illustrated in drawings and the like is not accurately represented in some cases for easy understanding. Therefore, the disclosed invention is not necessarily limited to the position, size, range, or the like as disclosed in the drawings and the like.

A transistor is one kind of semiconductor elements and can amplify current or voltage and perform a switching operation for controlling conduction or non-conduction, for example. A transistor in this specification includes an insulated-gate field effect transistor (IGFET) and a thin film transistor (TFT).

Functions of a "source" and a "drain" of a transistor might interchange when a transistor of opposite polarity is used or the direction of current flow is changed in circuit operation, for example. Therefore, the terms "source" and "drain" can be used to denote the drain and the source, respectively, in this specification.

In addition, in this specification and the like, the term such as "electrode" or "wiring" does not limit a function of a component. For example, an "electrode" is sometimes used as part of a "wiring", and vice versa. Further, the term "electrode" or "wiring" can also mean a combination of a plurality of "electrodes" and "wirings" formed in a connected manner.

Embodiment 1

In this embodiment, examples of a structure of a semiconductor device which is prevented from being damaged by electrostatic discharge or the like are described with reference to FIG. 1, FIG. 2, FIGS. 3A and 3B, FIG. 4, FIGS. 9A to 9C, and FIGS. 10A and 10B. Note that in this embodiment, examples of application thereof to a display device which is an embodiment of a semiconductor device are described.

Figure 9A:
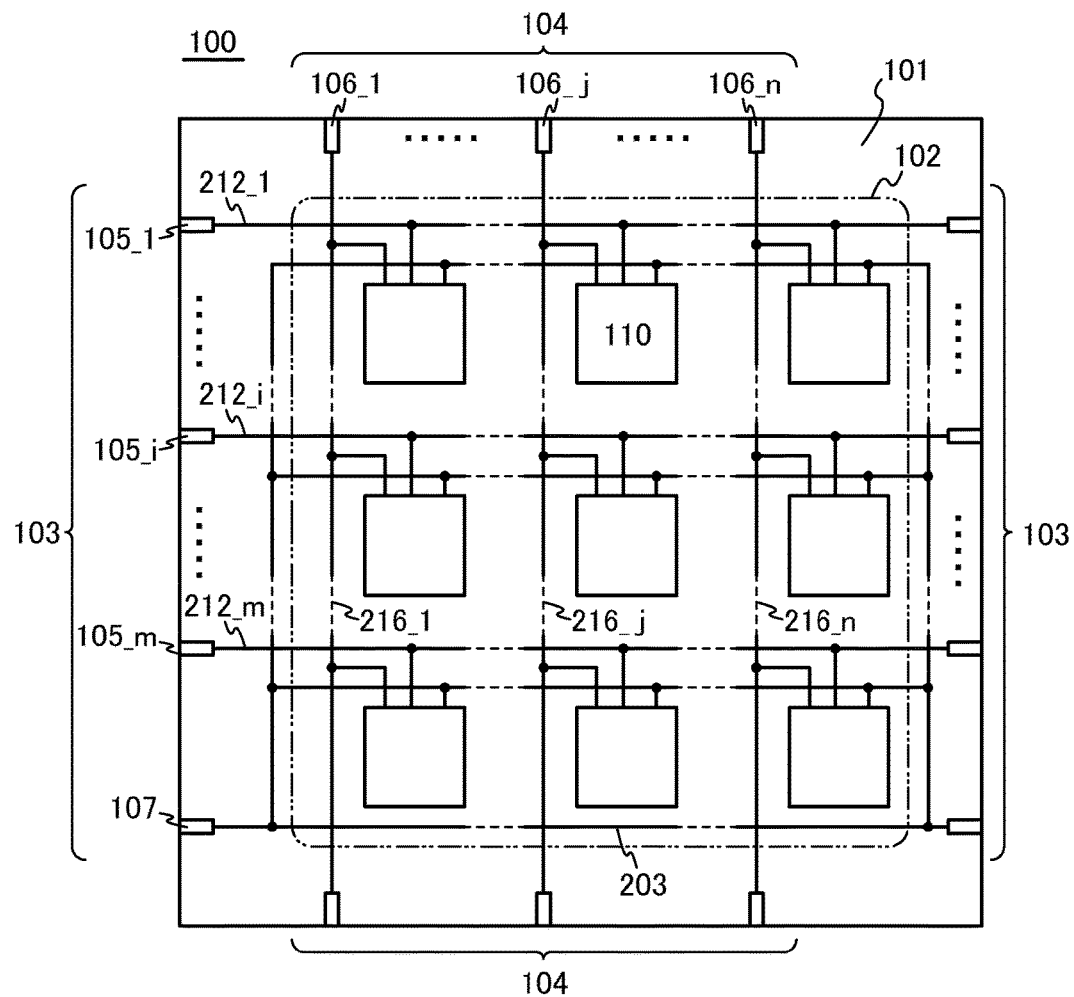
FIGS. 9A to 9C are circuit diagrams illustrating embodiments of the present invention.

FIG. 9A illustrates an example of the circuit configuration of a semiconductor device 100 that is used in a display device. The semiconductor device 100 includes a pixel region 102, a terminal portion 103 including m terminals 105 (m is an integer of greater than or equal to 1) and a terminal 107, and a terminal portion 104 including n terminals 106 (n is an integer of greater than or equal to 1) over a substrate 101. Further, the semiconductor device 100 includes m wirings 212 and a wiring 203 that are electrically connected to the terminal portion 103, and n wirings 216 that are electrically connected to the terminal portion 104. The pixel region 102 includes a plurality of pixels 110 arranged in a matrix of m rows and n columns. A pixel $110(i,j)$ in the i_th row and the j_th column (i is an integer of greater than or equal to 1 and less than or equal to m, and j is an integer of greater than or equal to 1 and less than or equal to n) is electrically connected to a wiring $212\_i$ extending in the row direction and a wiring $216\_j$ extending in the column direction. In addition, each pixel is connected to the wiring 203, and the wiring 203 is electrically connected to the terminal 107. The wiring 203 serves as a capacitor electrode or a capacitor wiring. The wiring $212\_i$ is electrically connected to a terminal 105_i, and the wiring 216_j is electrically connected to a terminal 106_j.

The terminal portion 103 and the terminal portion 104 are external input terminals and are connected to external control circuits with flexible printed circuits (FPCs) or the like. Signals supplied from the external control circuits are input to the semiconductor device 100 through the terminal portion 103 and the terminal portion 104. In FIG. 9A, such terminal portions 103 are provided on the right and left of the pixel region 102, so that signals are input from two directions. Further in FIG. 9A, such terminal portions 104 are provided above and below the pixel region 102, so that signals are input from two directions. By inputting signals from two directions, signal supply capability is increased and high-speed operation of the semiconductor device 100 is facilitated. In addition, influences of signal delay due to an increase in size of the semiconductor device 100 or an increase in wiring resistance that accompanies an increase in definition can be reduced. Moreover, the semiconductor device 100 can have redundancy, so that reliability of the semiconductor device 100 can be improved. Although two terminal portions 103 and two terminal portions 104 are provided in FIG. 9A, a structure in which one terminal portion 103 and one terminal portion 104 are provided may also be employed.

Figure 9B:
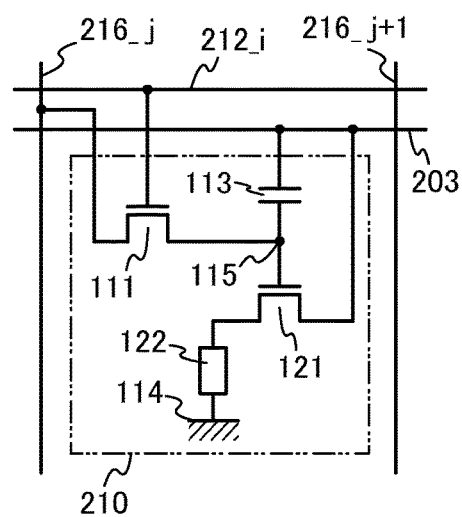

FIG. 9B illustrates a pixel 210 which is an example of a circuit configuration applicable to the pixel 110 in the case where the semiconductor device 100 is used as an EL display device. The pixel 210 in FIG. 9B includes a transistor 111, a transistor 121, an EL element 122, and a capacitor 113. A gate electrode of the transistor 111 is electrically connected to the wiring 212_i, and one of a source electrode and a drain electrode of the transistor 111 is electrically connected to the wiring 216_j. The other of the source electrode and the drain electrode of the transistor 111 is electrically connected to a node 115. One electrode of the capacitor 113 is electrically connected to the node 115, and the other electrode of the capacitor 113 is electrically connected to the wiring 203. In addition, a gate electrode of the transistor 121 is electrically connected to the node 115, one of a source electrode and a drain electrode of the transistor 121 is electrically connected to one electrode of the EL element 122, and the other of the source electrode and the drain electrode of the transistor 121 is electrically connected to the wiring 203. The other electrode of the EL element 122 is electrically connected to the electrode 114. The potential of the electrode 114 may be a fixed potential, e.g., 0 V, GND, or a common potential. Although the potential of the wiring 203 may be an arbitrary fixed potential, at least the difference between the potentials of the wiring 203 and the electrode 114 is set so as to be larger than the total voltage of the threshold voltage of the transistor 121 and the threshold voltage of the EL element 122.

In the pixel 210, the transistor 111 has a function of selecting whether an image signal supplied from the wiring 216_j is input to the gate electrode of the transistor 121. After a signal that turns on the transistor 111 is supplied to the wiring 212_i, an image signal is supplied to the node 115 from the wiring 216_j through the transistor 111.

The transistor 121 has a function of supplying current that corresponds to the potential (image signal) supplied to the node 115, to the EL element 122. The capacitor 113 has a function of keeping the difference between the potentials of the node 115 and the wiring 203 constant. The transistor 121 functions as a source of current for supplying current that corresponds to the image signal to the EL element 122.

Figure 9C:
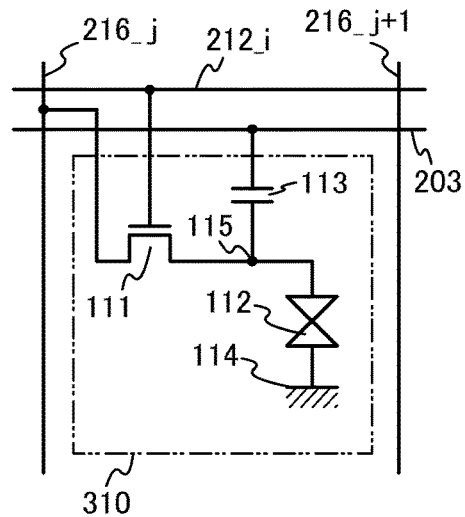

FIG. 9C illustrates a pixel 310 which is an example of a circuit configuration applicable to the pixel 110 in the case where the semiconductor device 100 is used as a liquid crystal display device. The pixel 310 in FIG. 9C includes the transistor 111, a liquid crystal element 112, and the capacitor 113. A gate electrode of the transistor 111 is electrically connected to the wiring 212_i, and one of a source electrode and a drain electrode of the transistor 111 is electrically connected to the wiring 216_j. The other of the source electrode and the drain electrode of the transistor 111 is electrically connected to the node 115. One electrode of the capacitor 113 is electrically connected to the node 115, and the other electrode of the capacitor 113 is electrically connected to the wiring 203. One electrode of the liquid crystal element 112 is electrically connected to the node 115, and the other electrode of the liquid crystal element 112 is electrically connected to the electrode 114. The potential of the electrode 114 may be a fixed potential, e.g., 0 V, GND, or a common potential. Although the potential of the wiring 203 may be a fixed potential, the potential may be changed as needed.

In the pixel 310, the transistor 111 has a function of selecting whether an image signal supplied from the wiring 216_j is input to the node 115. After a signal that turns on the transistor 111 is supplied to the wiring 212_i, an image signal is supplied to the node 115 from the wiring 216_j through the transistor 111. The liquid crystal element 112 controls a polarization state of light which passes through the liquid crystal element 112 in accordance with the image signal (potential) supplied to the node 115. The capacitor 113 functions as a storage capacitor (also referred to as a Cs capacitor) for holding a potential supplied to the node 115. With the capacitor 113, variation in the potential of the node 115, which is caused by a current flowing between the source electrode and the drain electrode in an off state of the transistor 111 (off-state current), can be suppressed.

For a semiconductor layer for forming channels of the transistor 111 and the transistor 121, an amorphous semiconductor, a microcrystalline semiconductor, a polycrystalline semiconductor, or the like can be used. For example, amorphous silicon or microcrystalline germanium can be used. Alternatively, a compound semiconductor such as silicon carbide, gallium arsenide, an oxide semiconductor, or a nitride semiconductor, an organic semiconductor, or the like can be used.

An oxide semiconductor has an energy gap that is as wide as greater than or equal to 3.0 eV, and thus has high transmittance with respect to visible light. In a transistor obtained by processing an oxide semiconductor under appropriate conditions, the off-state current at ambient temperature (e.g., 25° C.) can be less than or equal to 100 zA ($1 \times 10^{-19}$ A), less than or equal to 10 zA ($1 \times 10^{-20}$ A), and further less than or equal to 1 zA ($1 \times 10^{-21}$ A). Therefore, a semiconductor device with low power consumption can be achieved. Since by using an oxide semiconductor for the semiconductor layer, the potential of the node 115 can be held without provision of the capacitor 113, the aperture ratio of the pixel can be increased; accordingly, a display device with high display quality and low power consumption can be provided.

In the case where an oxide semiconductor is used for the semiconductor layer in which a channel is formed, it is preferable to use an i-type (intrinsic) or substantially i-type oxide semiconductor obtained by reducing impurities such as moisture or hydrogen and reducing oxygen vacancies in the oxide semiconductor.

Note that an oxide semiconductor which is purified (purified OS) by reduction of impurities such as moisture or hydrogen which serves as an electron donor (donor) can be made to be an i-type (intrinsic) oxide semiconductor or an oxide semiconductor extremely close to an i-type oxide semiconductor (a substantially i-type oxide semiconductor) by supplying oxygen to the oxide semiconductor to reduce oxygen vacancies in the oxide semiconductor. A transistor including the i-type or substantially i-type oxide semiconductor in a semiconductor layer in which a channel is formed has characteristics of very small off-state current. Specifically, the hydrogen concentration in the purified OS which is measured by secondary ion mass spectrometry (SIMS) is less than or equal to $5\times10^{19}/cm^3$, preferably less than or equal to $5\times10^{18}/cm^3$, further preferably less than or equal to $5\times10^{17}/cm^3$.

In addition, the carrier density of the i-type or substantially i-type oxide semiconductor, which is measured by Hall effect measurement, is less than $1\times10^{14}/cm^3$, preferably less than $1\times10^{12}/cm^3$, further preferably less than $1\times10^{11}/cm^3$. Furthermore, the band gap of the oxide semiconductor is 2 eV or more, preferably 2.5 eV or more, further preferably 3 eV or more. With the use of the i-type or substantially i-type oxide semiconductor for a semiconductor layer in which a channel is formed, off-state current of the transistor can be reduced.

The analysis of the hydrogen concentration in the oxide semiconductor by SIMS is described here. It is known to be difficult to obtain accurate data in the proximity of a surface of a sample or in the proximity of an interface between stacked films formed of different materials by the SIMS analysis in principle. Thus, in the case where the distribution of the hydrogen concentration in the thickness direction of a film is analyzed by SIMS, the average value of the hydrogen concentration in a region of the film where almost the same value can be obtained without significant variation is employed as the hydrogen concentration. Further, in the case where the thickness of the film is small, a region where almost the same value can be obtained cannot be found in some cases due to the influence of the hydrogen concentration of an adjacent film. In this case, the maximum value or the minimum value of the hydrogen concentration in a region where the film is provided is employed as the hydrogen concentration of the film. Furthermore, in the case where a maximum value peak and a minimum value valley do not exist in the region where the film is provided, the value of the inflection point is employed as the hydrogen concentration.

An oxide semiconductor used for the semiconductor layer in which a channel is formed preferably contains at least indium (In) or zinc (Zn). In particular, In and Zn are preferably contained. In addition, as a stabilizer for reducing variation in electric characteristics of the transistor using the oxide semiconductor, gallium (Ga) is preferably contained. Tin (Sn) is preferably contained as a stabilizer. Hafnium (Hf) is preferably contained as a stabilizer. Aluminum (Al) is preferably contained as a stabilizer.

As another stabilizer, one or more kinds of lanthanoid selected from lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor, for example, indium oxide, tin oxide, zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, or a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used. Further, $SiO_2$ may be contained in the above oxide semiconductor.

Here, for example, the In—Ga—Zn-based oxide means an oxide containing indium (In), gallium (Ga), and zinc (Zn) and there is no particular limitation on the ratio of In:Ga:Zn. The In—Ga—Zn-based oxide may contain a metal element other than In, Ga, and Zn. In this case, the amount of oxygen in the oxide semiconductor preferably exceeds the stoichiometric proportion of oxygen. With the excess oxygen, generation of carriers attributed to oxygen vacancies in the oxide semiconductor can be suppressed.

For the oxide semiconductor layer, a thin film represented by a chemical formula $InMO_3(ZnO)_m$ (m>0) can be used, in which M denotes one or more metal elements selected from Sn, Zn, Ga, Al, Mn, and Co. Alternatively, a material represented by $In_2SnO_5(ZnO)_n$ (n>0) may be used as the oxide semiconductor.

For example, an In—Ga—Zn-based oxide with an atomic ratio of In:Ga:Zn=1:1:1, In:Ga:Zn=2:2:1, In:Ga:Zn=1:3:2, or In:Ga:Zn=3:1:4, or any of oxides whose composition is in the neighborhood of the above compositions can be used. Alternatively, an In—Sn—Zn-based oxide with an atomic ratio of In:Sn:Zn=1:1:1, In:Sn:Zn=2:1:3, or In:Sn:Zn=2:1:5, or any of oxides whose composition is in the neighborhood of the above compositions may be used.

However, without limitation to the materials given above, a material with a composition suitable for requisite semiconductor characteristics (e.g., mobility, threshold voltage, and variation) may be used. Further, in order to obtain the requisite semiconductor characteristics, it is preferable that the carrier concentration, the impurity concentration, the defect density, the atomic ratio between a metal element and oxygen, the interatomic distance, the density, and the like be set to appropriate values.

For example, high mobility can be obtained relatively easily with an In—Sn—Zn-based oxide. However, the mobility can be increased by reducing the defect density in a bulk, even with an In—Ga—Zn-based oxide.

Note that for example, the "composition of an oxide containing In, Ga, and Zn at the atomic ratio, In:Ga:Zn=a:b:c (a+b+c=1), is in the neighborhood of the composition of an oxide containing In, Ga, and Zn at the atomic ratio, In:Ga:Zn=A:B:C (A+B+C=1)" means that a, b, and c satisfy the following relation: $(a-A)^2+(b-B)^2+(c-C)^2 \leq r^2$, where r may be 0.05, for example. The same applies to other oxides.

The oxide semiconductor may be either single crystal or non-single-crystal. In the latter case, the oxide semiconductor may be either amorphous or polycrystal. Further, the oxide semiconductor may have a structure including a crystalline portion in an amorphous portion.

In an oxide semiconductor in an amorphous state, a flat surface can be obtained relatively easily, so that interface scattering in a transistor formed using the oxide semiconductor can be suppressed, whereby relatively high mobility can be obtained relatively easily.

In the case where an In—Zn-based oxide material is used as the oxide semiconductor, the atomic ratio, In/Zn is greater than or equal to 0.5 and less than or equal to 50, preferably greater than or equal to 1 and less than or equal to 20, further preferably greater than or equal to 1.5 and less than or equal to 15. When the atomic ratio of Zn is in the above preferred range, the field-effect mobility of the transistor can be improved. Here, when the atomic ratio of the compound is In:Zn:O=X:Y:Z, the relation Z>1.5X+Y is satisfied.

An oxide semiconductor film may be in a non-single-crystal state, for example. The non-single-crystal state is, for example, structured by at least one of c-axis aligned crystal (CAAC), polycrystal, microcrystal, and an amorphous part. The density of defect states of an amorphous part is higher than those of microcrystal and CAAC. The density of defect states of microcrystal is higher than that of CAAC. Note that an oxide semiconductor including CAAC is referred to as a CAAC-OS (c-axis aligned crystalline oxide semiconductor).

For example, an oxide semiconductor film may include a CAAC-OS. In the CAAC-OS, for example, c-axes are aligned, and a-axes and/or b-axes are not macroscopically aligned.

For example, an oxide semiconductor film may include microcrystal. Note that an oxide semiconductor including microcrystal is referred to as a microcrystalline oxide semiconductor. A microcrystalline oxide semiconductor film includes microcrystal (also referred to as nanocrystal) with a size greater than or equal to 1 nm and less than 10 nm, for example.

For example, an oxide semiconductor film may include an amorphous part. Note that an oxide semiconductor including an amorphous part is referred to as an amorphous oxide semiconductor. An amorphous oxide semiconductor film, for example, has disordered atomic arrangement and no crystalline component. Alternatively, an amorphous oxide semiconductor film is, for example, absolutely amorphous and has no crystal part.

Note that an oxide semiconductor film may be a mixed film including any of a CAAC-OS, a microcrystalline oxide semiconductor, and an amorphous oxide semiconductor. The mixed film, for example, includes a region of an amorphous oxide semiconductor, a region of a microcrystalline oxide semiconductor, and a region of a CAAC-OS. Further, the mixed film may have a stacked structure including a region of an amorphous oxide semiconductor, a region of a microcrystalline oxide semiconductor, and a region of a CAAC-OS, for example.

Note that an oxide semiconductor film may be in a single-crystal state, for example.

An oxide semiconductor film preferably includes a plurality of crystal parts. In each of the crystal parts, a c-axis is preferably aligned in a direction parallel to a normal vector of a surface where the oxide semiconductor film is formed or a normal vector of a surface of the oxide semiconductor film. Note that, among crystal parts, the directions of the a-axis and the b-axis of one crystal part may be different from those of another crystal part. An example of such an oxide semiconductor film is a CAAC-OS film.

Note that in most cases, a crystal part in the CAAC-OS film fits inside a cube whose one side is less than 100 nm In an image obtained with a transmission electron microscope (TEM), a boundary between crystal parts in the CAAC-OS film is not clearly detected. Further, with the TEM, a grain boundary in the CAAC-OS film is not clearly found. Thus, in the CAAC-OS film, a reduction in electron mobility due to the grain boundary is suppressed.

In each of the crystal parts included in the CAAC-OS film, for example, a c-axis is aligned in a direction parallel to a normal vector of a surface where the CAAC-OS film is formed or a normal vector of a surface of the CAAC-OS film. Further, in each of the crystal parts, metal atoms are arranged in a triangular or hexagonal configuration when seen from the direction perpendicular to the a-b plane, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a term "perpendicular" includes a range from 80° to 100°, preferably from 85° to 95°. In addition, a term "parallel" includes a range from −10° to 10°, preferably from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, crystallinity of the crystal part in a region to which the impurity is added is lowered in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that the film deposition is accompanied with the formation of the crystal parts or followed by the formation of the crystal parts through crystallization treatment such as heat treatment. Hence, the c-axes of the crystal parts are aligned in the direction parallel to a normal vector of the surface where the CAAC-OS film is formed or a normal vector of the surface of the CAAC-OS film.

In a transistor using the CAAC-OS film, change in electric characteristics due to irradiation with visible light or ultraviolet light is small. Thus, the transistor has high reliability.

In order that the oxide semiconductor film may be the CAAC-OS film, the surface where the oxide semiconductor film is formed is preferably amorphous. When the surface where the oxide semiconductor film is formed is crystalline, crystallinity of the oxide semiconductor film is easily disordered and the CAAC-OS film is not easily formed.

Note that the surface where the oxide semiconductor film is formed may have a CAAC structure. In the case where the surface where the oxide semiconductor film is formed has the CAAC structure, the oxide semiconductor film easily becomes the CAAC-OS film.

Nitrogen may be substituted for part of constituent oxygen of the oxide semiconductor film.

Further, in an oxide semiconductor having a crystal part such as the CAAC-OS, defects in the bulk can be further reduced, and mobility higher than that of an oxide semiconductor in an amorphous state can be obtained by improving the surface flatness. To improve the surface flatness, the oxide semiconductor is preferably formed on a flat surface. Specifically, the oxide semiconductor may be formed on a surface with an average surface roughness (Ra) of less than or equal to 1 nm, preferably less than or equal to 0.3 nm, further preferably less than or equal to 0.1 nm. Ra can be measured using an atomic force microscope (AFM).

Since the transistor described later in this embodiment is a bottom-gate transistor, a gate electrode and a gate insulating layer are positioned under the oxide semiconductor film. Thus, in order to obtain the above-described flat surface, planarization treatment such as chemical mechanical polishing (CMP) treatment may be performed at least on a surface of the gate insulating layer, which overlaps with the gate electrode, after the gate electrode and the gate insulating layer are formed over the substrate.

The oxide semiconductor film has a thickness greater than or equal to 1 nm and less than or equal to 30 nm (preferably greater than or equal to 5 nm and less than or equal to 10 nm) and can be formed by a sputtering method, a molecular beam epitaxy (MBE) method, a CVD method, a pulsed laser deposition method, an atomic layer deposition (ALD) method, or the like as appropriate. The oxide semiconductor film may be formed with a sputtering apparatus which performs deposition with surfaces of a plurality of substrates set substantially perpendicular to a surface of a sputtering target.

Figure 2:
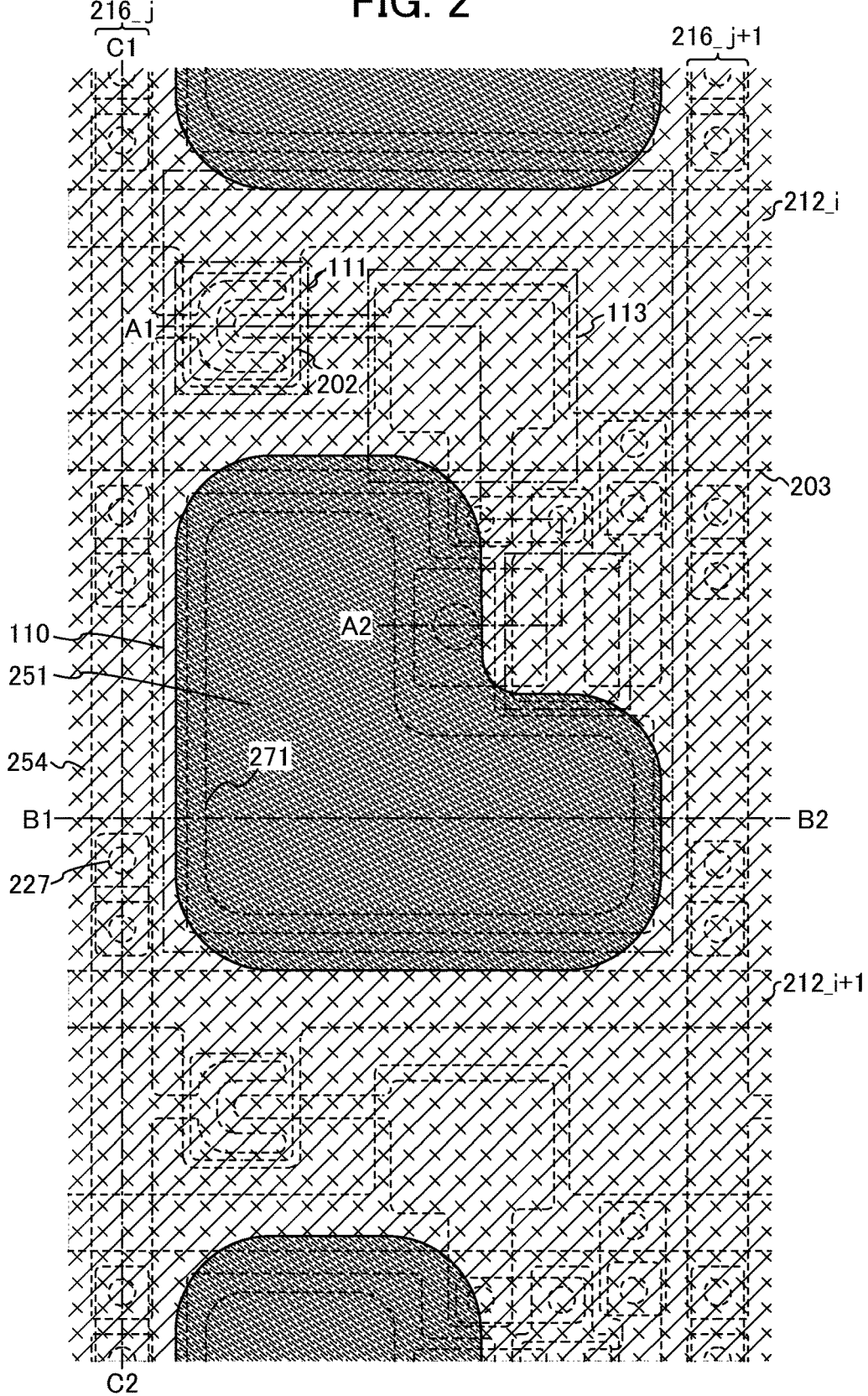
FIG. 2 is a top view illustrating one embodiment of the present invention.

Next, an example of the configuration of the pixel 210 illustrated in FIG. 9B will be described with reference to FIG. 1, FIG. 2, FIGS. 3A and 3B, and FIG. 4. FIG. 1 and FIG. 2 are top views illustrating plan structures of the pixel 210 and wirings connected to the pixel 210. FIG. 1 is a top view illustrating the state where the uppermost layer is a pixel electrode 211, and FIG. 2 is a top view illustrating the state where a partition layer 254 and an EL layer 251 are further formed. For easy viewing, some components are omitted in FIG. 1 and FIG. 2.

Description of this embodiment is given on the assumption that the transistor is an n-channel transistor.

Figure 4:
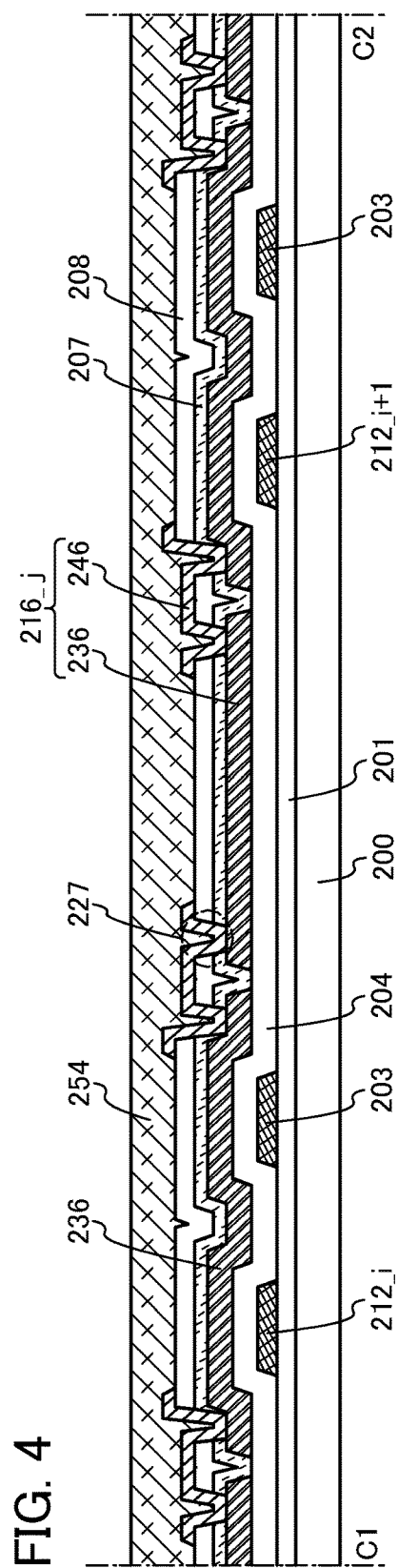
FIG. 4 is a cross-sectional view illustrating one embodiment of the present invention.

FIGS. 3A and 3B and FIG. 4 are cross-sectional views illustrating the stacked structure of the pixel 210. FIG. 3A corresponds to a cross section of a portion taken along dashed-dotted line A1-A2 in FIG. 1 and FIG. 2, and FIG. 3B corresponds to a cross section of a portion taken along dashed-dotted line B1-B2 in FIG. 1 and FIG. 2. FIG. 4 corresponds to a cross section of a portion taken along dashed-dotted line C1-C2 in FIG. 1 and FIG. 2.

In the transistor 111 in FIG. 1, a drain electrode 206b is surrounded by a source electrode 206a that is U-shaped (or C-shaped, square-bracket-like shaped, or horseshoe-shaped). With such a shape, an enough channel width can be ensured even when the area of the transistor is small, and accordingly, the amount of current flowing at the time of conduction of the transistor (also referred to as on-state current) can be increased.

If parasitic capacitance generated between the gate electrode 202 and the drain electrode 206b electrically connected to the pixel electrode 211 is larger than parasitic capacitance generated between the gate electrode 202 and the source electrode 206a, the pixel electrode 211 is easily influenced by feedthrough, which may cause degradation in display quality of the display device because the potential supplied to the node 115 cannot be held accurately. With the structure in which the source electrode 206a is U-shaped and surrounds the drain electrode 206b as described in this embodiment, an enough channel width can be ensured and parasitic capacitance generated between the drain electrode 206b and the gate electrode 202 can be reduced. Therefore, the display quality of a display device can be improved. Further, the gate electrode 202 is connected to the wiring 212_i, and the source electrode 206a is connected to a wiring 236. In FIG. 1, FIG. 2, and FIG. 4, an example where the wiring 216_j is formed by electrically connecting the plurality of wirings 236 in series by the plurality of wirings 246 is shown.

The cross section A1-A2 in FIG. 3A shows the stacked structures of the transistor 111, the transistor 121, and the capacitor 113. The transistor 111 and the transistor 121 each have one kind of bottom-gate structure called a channel-etched type.

In the cross section A1-A2 in FIG. 3A, an insulating layer 201 is formed over a substrate 200, and the gate electrode 202, the wiring 203, and a gate electrode 262 are formed over the insulating layer 201. An insulating layer 204 is formed over the gate electrode 202, the wiring 203, and the gate electrode 262, and a semiconductor layer 205 and a semiconductor layer 223 are formed over the insulating layer 204. The insulating layer 204 serves as a gate insulating layer. The source electrode 206a and the drain electrode 206b are formed over the semiconductor layer 205, and a source electrode 266a and a drain electrode 266b (see FIG. 1) are formed over the semiconductor layer 223. Further, an insulating layer 207 is formed in contact with part of the semiconductor layer 205 and part of the semiconductor layer 223 and over the source electrode 206a, the drain electrode 206b, the source electrode 266a, and the drain electrode 266b, and an insulating layer 208 is formed over the insulating layer 207.

The drain electrode 206b included in the transistor 111 is electrically connected to the gate electrode 262 included in the transistor 121 through a wiring 237. The drain electrode 206b and the wiring 237 are connected to each other through an opening 238 formed in the insulating layer 207 and the insulating layer 208, and the gate electrode 262 and the wiring 237 are connected to each other through an opening 239 formed in the insulating layer 204, the insulating layer 207, and the insulating layer 208. The source electrode 266a included in the transistor 121 is connected to the pixel electrode 211 through an opening 209 formed in the insulating layer 207 and the insulating layer 208. In FIG. 1 and FIG. 2, the drain electrode 266b included in the transistor 121 is electrically connected to the wiring 203 through an opening 232 formed in the insulating layer 207 and the insulating layer 208, an opening 233 formed in the insulating layer 204, the insulating layer 207, and the insulating layer 208, and a wiring 234.

The partition layer 254 for separating the EL layer 251 for each pixel is formed over the insulating layer 208. The EL layer 251 is formed over the pixel electrode 211 and the partition layer 254. A counter electrode 252 is formed over the partition layer 254 and the EL layer 251. In an opening 271, a portion where the pixel electrode 211, the EL layer 251, and the counter electrode 252 overlap with one another functions as an EL element 253.

The gate electrode 202, the wiring 212_i, and the wiring 203 can be formed using the same conductive layer. When the gate electrode 202, the wiring 212_i, and the wiring 203 are formed using a conductive material containing copper (Cu), an increase in wiring resistance can be prevented. Further, a conductive layer containing Cu and a conductive layer containing a metal element having a higher melting point than Cu, such as tungsten (W), tantalum (Ta), molybdenum (Mo), titanium (Ti), or chromium (Cr), or a nitride or an oxide of the above metal element are stacked as the gate electrode 202, the wiring 212_i, and the wiring 203; thus, migration is suppressed and reliability of the semiconductor device can be improved. For example, a stack of tantalum nitride and copper is used.

The insulating layer 204 is preferably formed using a material having barrier properties for preventing Cu diffusion. Examples of the material having barrier properties include silicon nitride and aluminum oxide. A wiring containing Cu is covered with an insulating layer having barrier properties, whereby Cu diffusion can be suppressed.

The source electrode 206a and the drain electrode 206b formed in contact with the semiconductor layer 205 and the source electrode 266a and the drain electrode 266b formed in contact with the semiconductor layer 223 (including a wiring formed using the same layer as the source electrodes and the drain electrodes) are preferably formed without using Cu. When Cu is used for an electrode formed in contact with an oxide semiconductor layer, Cu etched when the electrode is formed is diffused into the oxide semiconductor layer; thus, electric characteristics and reliability of the transistor deteriorate. Note that the source electrode 206a, the drain electrode 206b, the source electrode 266a, and the drain electrode 266b each may have a single-layer structure or a stacked structure of a plurality of layers. For example, a three-layer structure of tungsten, aluminum, and titanium may be used.

A portion in which the wiring 203 and the drain electrode 206b overlap with each other with the insulating layer 204 interposed therebetween functions as the capacitor 113. Thus, the wiring 203 functions as a capacitor electrode or a capacitor wiring. The insulating layer 204 functions as a dielectric layer of the capacitor 113. For the dielectric layer of the capacitor 113, an oxide semiconductor may be used. The relative dielectric constant of an oxide semiconductor layer is as high as 14 to 16. Accordingly, when an oxide semiconductor is used for the dielectric layer, the capacitance of the capacitor 113 can be increased. The dielectric layer formed between the wiring 203 and the drain electrode 206b may have a multi-layer structure. In the case where the dielectric layer is formed to have a multi-layer structure, even when a pinhole is generated in one dielectric layer, the pinhole is covered with another dielectric layer; accordingly, the capacitor 113 can operate normally.

In the cross section B1-B2 in FIG. 3B, the insulating layer 201 is formed over the substrate 200, the insulating layer 204 is formed over the insulating layer 201, and the wiring 236 is formed over the insulating layer 201. The insulating layer 204 is formed over the wiring 236, the insulating layer 207 is formed over the insulating layer 204, and the insulating layer 208 is formed over the insulating layer 207. Further, the pixel electrode 211 is formed over the insulating layer 208. The partition layer 254 is formed over the insulating layer 208 and the pixel electrode 211, and the opening 271 is formed in a position which overlaps with the pixel electrode 211 of the partition layer 254.

The side surfaces of the partition layer 254 where the opening 271 is formed preferably have a taper shape or a shape with a curvature. With use of a photosensitive resin material for the partition layer 254, the side surfaces of the partition layer 254 can have a shape with a continuous curvature. As an organic insulating material for forming the partition layer 254, an acrylic resin, a phenol resin, polystyrene, polyimide, or the like can be used.

The pixel electrode 211 functions as one electrode of the EL element 253. The counter electrode 252 functions as the other electrode of the EL element 253. The counter electrode 252 can be formed using a material similar to that of the source electrode or the drain electrode of the transistor. In the case where the EL element 253 has a bottom emission structure in which light is emitted from the EL element 253 from the substrate 200 side, the counter electrode 252 is preferably formed using a material with high light reflectance such as aluminum or silver.

The EL layer 251 may be formed by stacking a hole injection layer, a hole transport layer, a light-emitting layer, an electron transport layer, an electron injection layer, or the like. In the case where the pixel electrode 211 is used as an anode, a material having a high work function is used for the pixel electrode 211. In the case where the pixel electrode 211 has a stacked structure of a plurality of layers, a material having a high work function is used for at least a layer in contact with the EL layer 251. In the case where the counter electrode 252 is used as a cathode, a metal material having a low work function may be used for the counter electrode 252. Specifically, an alloy of aluminum and lithium can be used for the counter electrode 252. The counter electrode 252 may be a stack of an alloy layer of aluminum and lithium and a conductive layer.

An embodiment of the present invention can also be applied to a top emission structure in which light is emitted from the EL element 253 from the counter electrode 252 side or a dual emission structure in which light is emitted from the EL element 253 from both of the above-mentioned sides. In the case where the EL element 253 has a top emission structure, the pixel electrode 211 is used as a cathode, the counter electrode 252 is used as an anode, and the injection layers, transport layers, light-emitting layer, and the like of the EL layer 251 are stacked in the order reverse to the order of the bottom emission structure.

The cross section C1-C2 in FIG. 4 illustrates the stacked structure of the wiring 216_j. In the cross section C1-C2 illustrated in FIG. 4, the insulating layer 201 is formed over the substrate 200. The wiring 212_i and the wiring 203 are formed over the insulating layer 201, and the insulating layer 204 is formed over the wiring 212_i and the wiring 203. The plurality of wirings 236 is formed over the insulating layer 204. The wiring 236 is electrically connected to the wiring 246 formed over the insulating layer 208 through an opening 227 formed in the insulating layer 207 and the insulating layer 208.

Figure 10A:
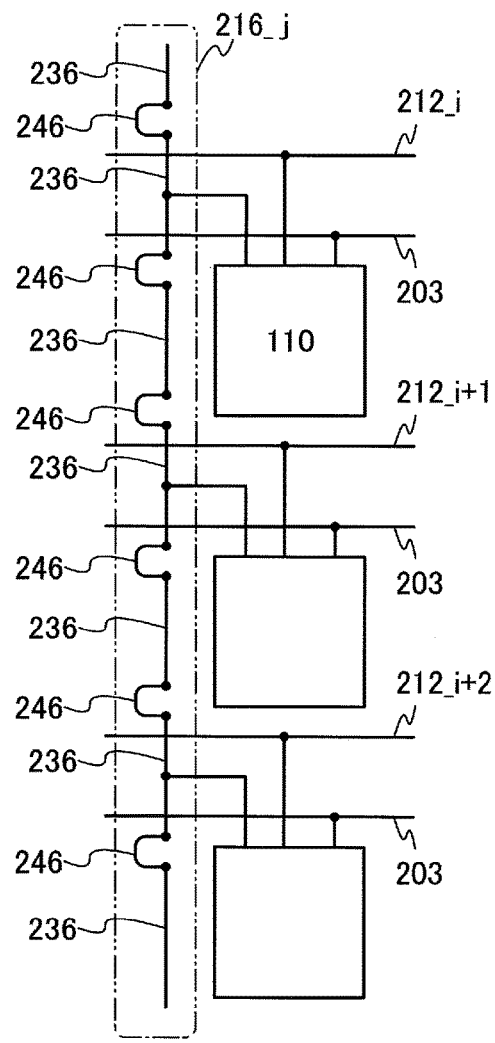
FIGS. 10A and 10B are circuit diagrams each illustrating one embodiment of the present invention.

FIG. 10A is an equivalent circuit diagram of the wiring 216_j described in this embodiment. The wiring 216_j includes the plurality of wirings 236 and the plurality of wirings 246 and is formed by electrically connecting the plurality of wirings 236 in series by the wirings 246.

When a conductive layer formed using metal or the like in a floating state is exposed to a plasma atmosphere, charge supplied from the plasma atmosphere is likely to be accumulated. Further, as a surface area of the conductive layer becomes larger, the amount of charge to be accumulated is increased. Thus, the amount of charge accumulated becomes large in a long lead wiring, and ESD easily occurs. For example, a breakdown due to ESD or the like occurs in a position where a long lead wiring and a wiring in a lower layer overlap with each other with an insulating layer provided therebetween in some cases.

Therefore, as illustrated in FIG. 1 and FIG. 4, the plurality of island-shaped wirings 236 is formed for the long lead wiring 216_j during steps with direct exposure to a plasma atmosphere and electrically connected to one another in series in a later step. Since the plurality of island-shaped wirings 236 is used during the steps with direct exposure to a plasma atmosphere, the amount of accumulated charge can be reduced and ESD can be less likely to occur in positions where the plurality of island-shaped wirings 236 and wirings in a lower layer overlap with one another.

Thus, the thickness of the insulating layer 204 can be reduced, and the capacitance of the capacitor can be increased. By a small thickness of the insulating layer 204 serving as the gate insulating layer, the performance of the transistor can be improved. Since the area occupied by the capacitor or the transistor can be reduced, high definition of the display device is easily realized and display quality can be increased. Further, the semiconductor device is easily highly integrated.

This embodiment can be implemented in appropriate combination with any structure described in the other embodiments.

Embodiment 2

In this embodiment, the wiring 216_j having a structure different from the structure disclosed in Embodiment 1 is described with reference to FIG. 5, FIG. 6, and FIGS. 10A and 10B.

Figure 5:
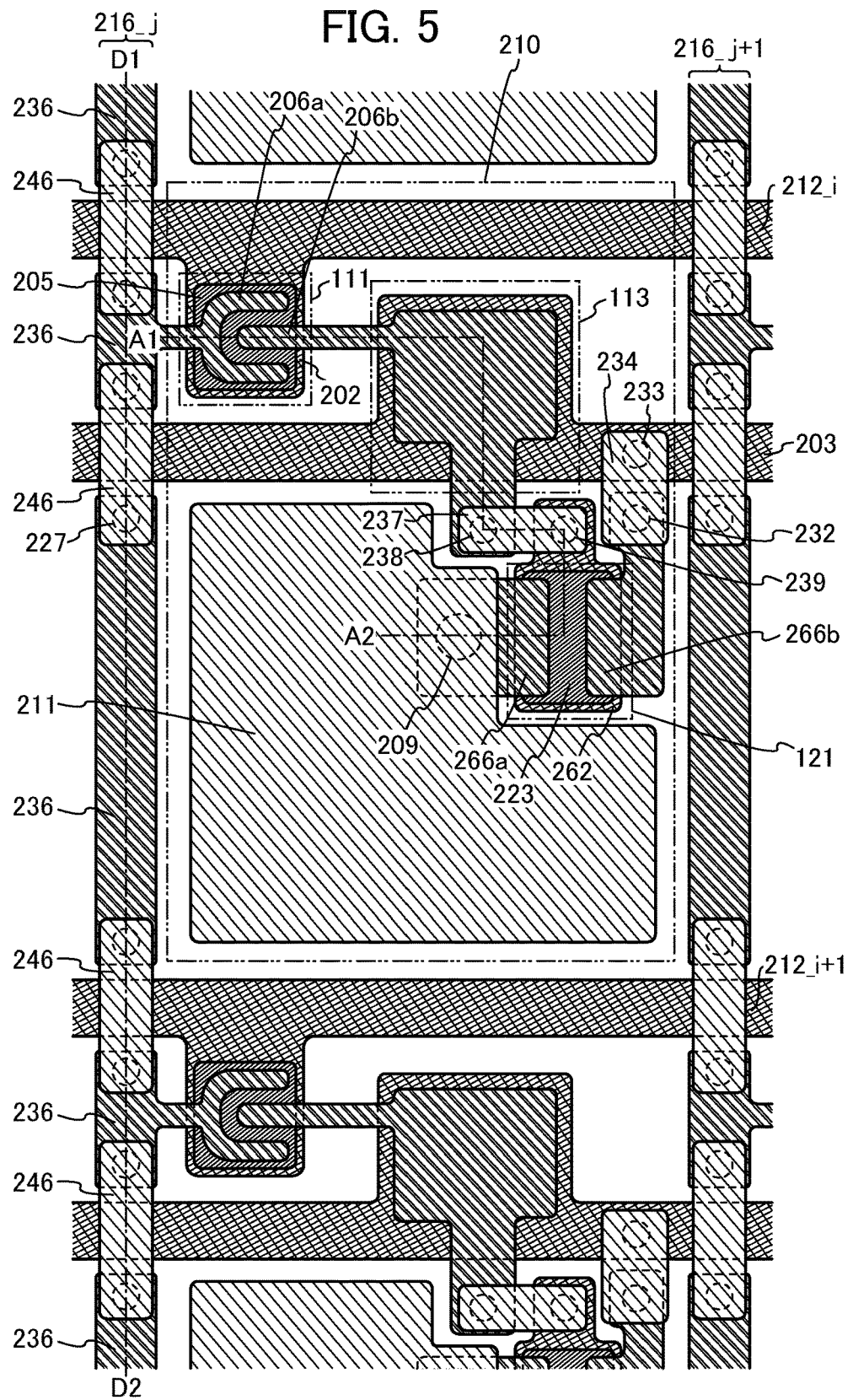
FIG. 5 is a top view illustrating one embodiment of the present invention.
Figure 6:
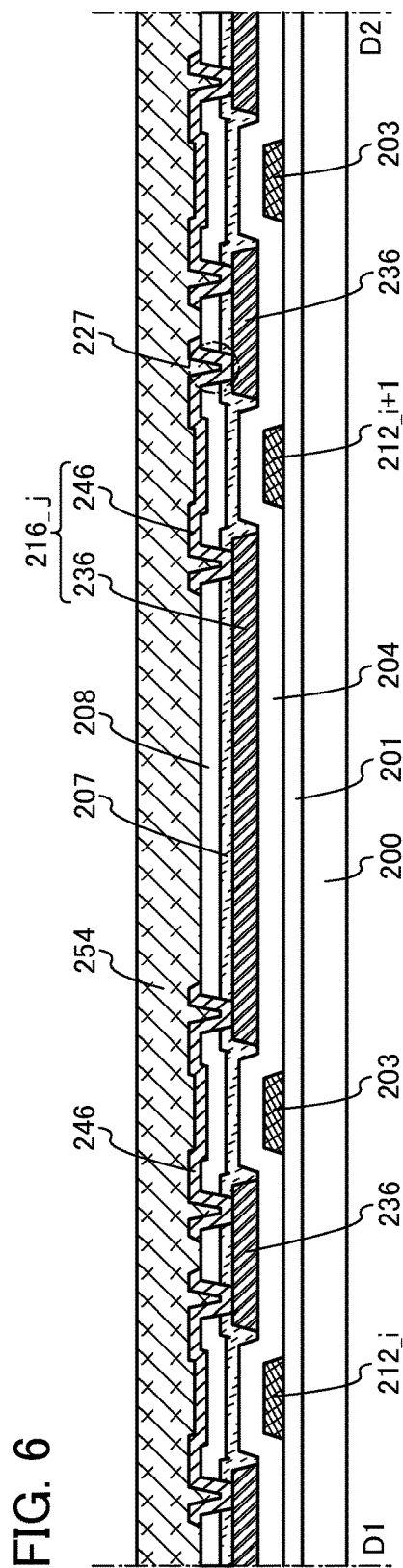
FIG. 6 is a cross-sectional view illustrating one embodiment of the present invention.
Figure 10B:
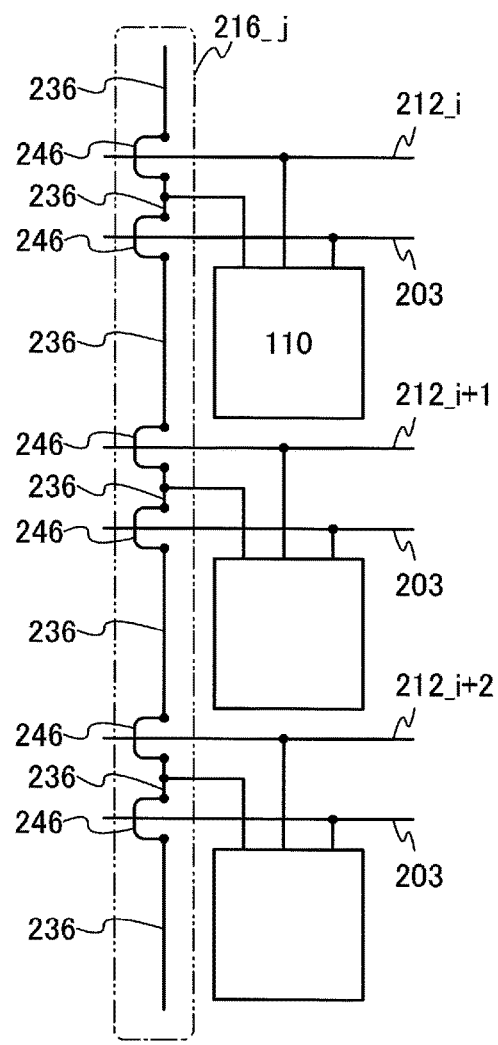

FIG. 5 is a top view illustrating a plan structure of the pixel 210 and wirings connected to the pixel 210. FIG. 6 is a cross-sectional view of a portion taken along dashed-dotted line D1-D2 in FIG. 5. The wiring 216_j described in this embodiment is different from the wiring 216_j disclosed in Embodiment 1 in the arrangement of the wiring 236. In the wiring 216_j described in this embodiment, the wirings 236 included in the wiring 216_j are formed so as not to overlap with a wiring below the wirings 236. Specifically, the wirings 236 are formed so as not to overlap with the wiring 212_i and the wiring 203. FIG. 10B is an equivalent circuit diagram of the wiring 216_j described in this embodiment.

The plurality of island-shaped wirings 236 is formed for the long lead wiring 216_j during steps with direct exposure to a plasma atmosphere and formed so as not to overlap with a wiring below the wiring 236; thus, ESD can be reduced.

Thus, the thickness of the insulating layer 204 can be reduced, and the capacitance of the capacitor can be increased. By a small thickness of the insulating layer 204 serving as the gate insulating layer, the performance of the transistor can be improved. Since the area occupied by the capacitor or the transistor can be reduced, high definition of the display device is easily realized and display quality can be increased. Further, the semiconductor device is easily highly integrated.

This embodiment can be implemented in appropriate combination with any structure described in the other embodiments.

Embodiment 3

In this embodiment, the wiring 216_j having a structure different from the structures disclosed in Embodiments 1 and 2 is described with reference to FIG. 7 and FIG. 8.

Figure 7:
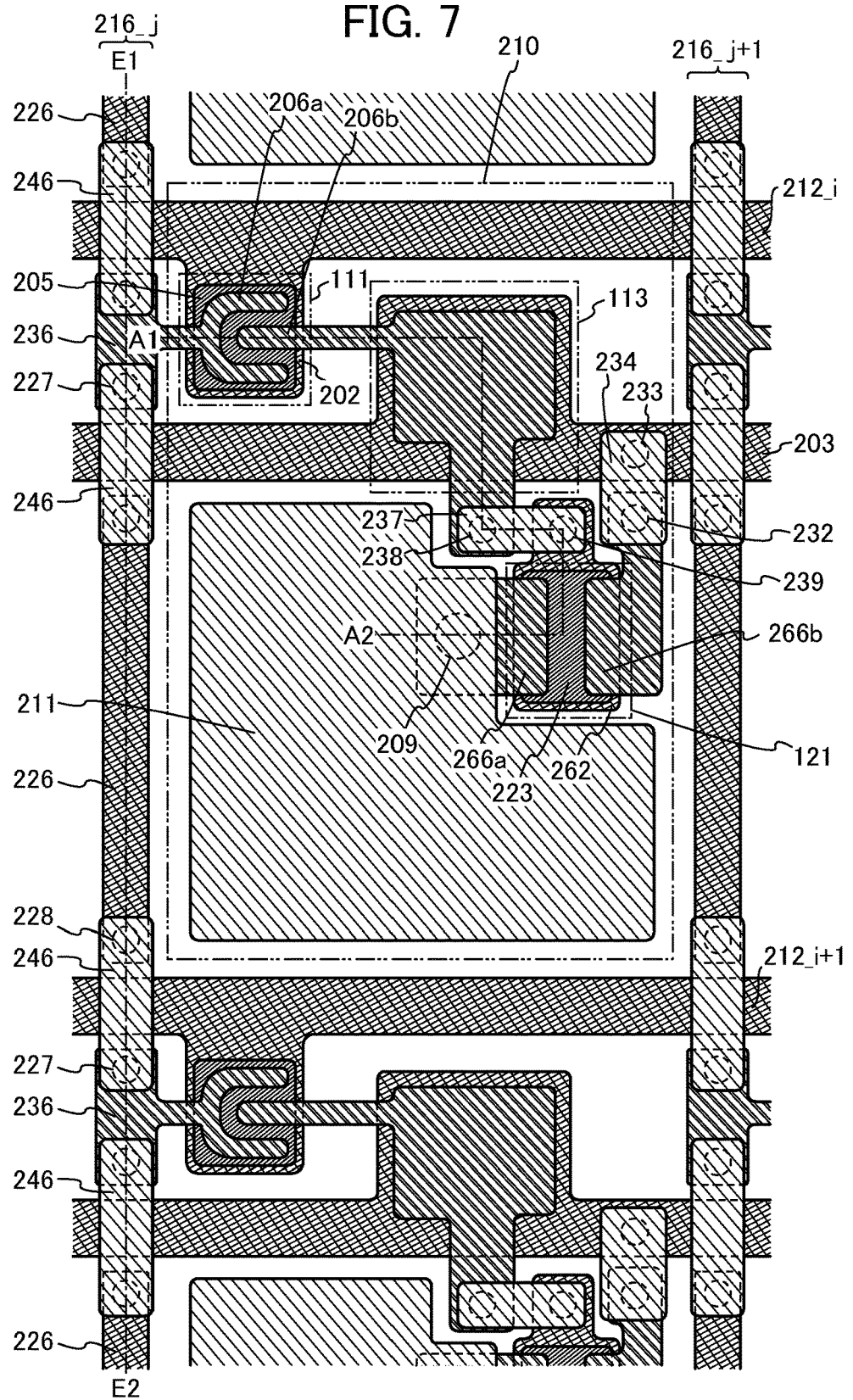
FIG. 7 is a top view illustrating one embodiment of the present invention.
Figure 8:
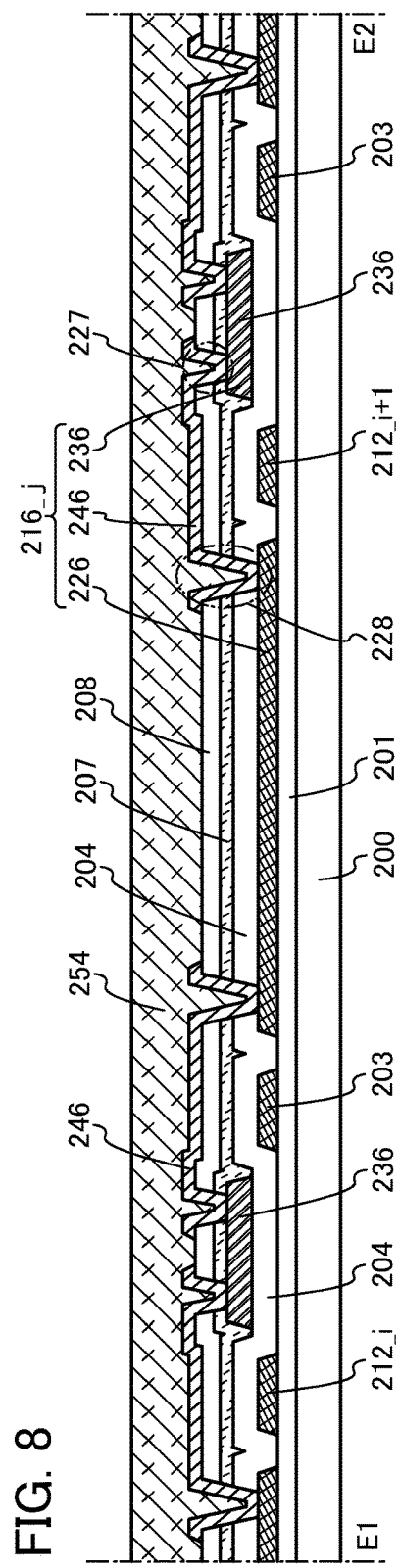
FIG. 8 is a cross-sectional view illustrating one embodiment of the present invention.
Figure 11:
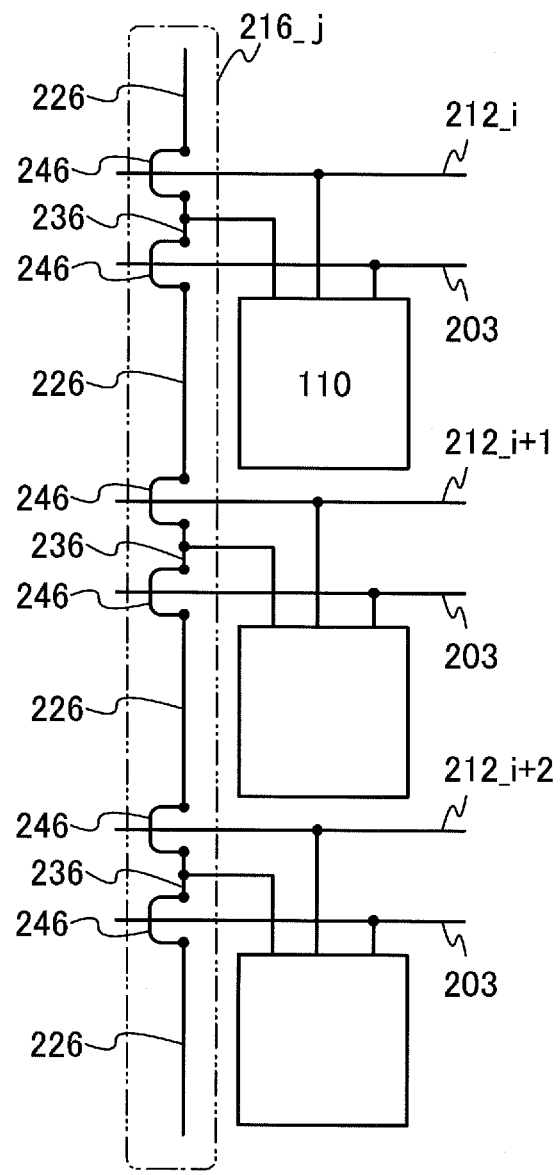
FIG. 11 is a circuit diagram illustrating one embodiment of the present invention.

FIG. 7 is a top view illustrating a plan structure of the pixel 210 and wirings connected to the pixel 210. FIG. 8 is a cross-sectional view of a portion taken along dashed-dotted line E1-E2 in FIG. 6. The wiring 216_j described in this embodiment is different from the wirings 216_j disclosed in Embodiments 1 and 2 in that part of the plurality of wirings 236 included in the wiring 216_j disclosed in Embodiment 2 is a wiring 226 formed using the same conductive layer as the wiring 212_i. FIG. 11 is an equivalent circuit diagram of the wiring 216_j described in this embodiment.

In the case where the wiring 212_i is formed using a conductive layer containing a material having low resistivity, such as Cu, part of the wiring 216_j is the wiring 226 formed using the same conductive layer as the wiring 212_i; thus, wiring resistance of the wiring 216_j can be reduced.

Specifically, the wiring 216_j is formed in such a manner that the wirings 236 and the wirings 226 are electrically connected to one another in series by the wirings 246. The wiring 226 and the wiring 246 are electrically connected to each other through an opening 228 formed in the insulating layer 204, the insulating layer 207, and the insulating layer 208, and the wiring 236 and the wiring 246 are electrically connected to each other through the opening 227. Note that all the wirings 236 may be replaced with the wirings 226.

According to this embodiment, ESD is less likely to occur in a manufacturing process, and the wiring 216_j with low wiring resistance can be formed. Further, by reducing the wiring resistance of the wiring 216_j, delay of a signal which is transmitted through the wiring 216_j, distortion in waveform, or the like is suppressed; thus, a display device with favorable display quality, stable operation, and high reliability can be provided.

The thickness of the insulating layer 204 can be reduced, and the capacitance of the capacitor can be increased. By a small thickness of the insulating layer 204 serving as the gate insulating layer, the performance of the transistor can be improved. Since the area occupied by the capacitor or the transistor can be reduced, high definition of the display device is easily realized and display quality can be increased. Further, the semiconductor device is easily highly integrated.

This embodiment can be implemented in appropriate combination with any structure described in the other embodiments.

Embodiment 4

In this embodiment, methods for manufacturing the pixel portion and the wiring 216_j of the display device described with reference to FIG. 1, FIG. 2, FIGS. 3A and 3B, and FIG. 4 are described with reference to FIGS. 12A to 12C, FIGS. 13A to 13C, FIGS. 14A to 14C, FIGS. 15A and 15B, FIGS. 16A to 16C, FIGS. 17A to 17C, and FIGS. 18A to 18C. Note that cross sections A1-A2 in FIGS. 12A to 12C, FIGS. 13A to 13C, FIGS. 14A to 14C, and FIGS. 15A and 15B are cross-sectional views of the portion taken along dashed-dotted line A1-A2 in FIG. 1 and FIG. 2, and cross sections C1-C2 in FIGS. 16A to 16C, FIGS. 17A to 17C, and FIGS. 18A to 18C are cross-sectional views of the portion taken along dashed-dotted line C1-C2 in FIG. 1 and FIG. 2.

First, an insulating layer to be the insulating layer 201 is formed with a thickness of greater than or equal to 50 nm and less than or equal to 300 nm, preferably greater than or equal to 100 nm and less than or equal to 200 nm over the substrate 200 (see FIG. 12A and FIG. 16A). As the substrate 200, as well as a glass substrate or a ceramic substrate, a plastic substrate or the like having heat resistance to withstand a process temperature in this manufacturing process can be used. In the case where a substrate does not need a light-transmitting property, a metal substrate such as a stainless alloy substrate with a surface provided with an insulating layer may be used. As the glass substrate, for example, an alkali-free glass substrate of barium borosilicate glass, aluminoborosilicate glass, aluminosilicate glass, or the like may be used. In addition, a quartz substrate, a sapphire substrate, or the like can be used. In this embodiment, a substrate of aluminoborosilicate glass is used as the substrate 200.

A flexible substrate may also be used as the substrate 200. In the case where a flexible substrate is used, the transistor, the capacitor, or the like may be directly formed over the flexible substrate, or the transistor, the capacitor, or the like may be formed over a manufacturing substrate, and then separated from the manufacturing substrate and transferred onto the flexible substrate. To separate and transfer the transistor, the capacitor, or the like from the manufacturing substrate to the flexible substrate, a separation layer may be provided between the manufacturing substrate and the transistor, the capacitor, or the like.

The insulating layer 201 functions as a base layer, and can prevent or reduce diffusion of an impurity element from the substrate 200. The insulating layer 201 is formed of a single layer or a stacked layer using one or more of materials selected from aluminum nitride, aluminum oxide, aluminum nitride oxide, aluminum oxynitride, gallium oxide, silicon nitride, silicon oxide, silicon nitride oxide, and silicon oxynitride. In this specification, a nitride oxide refers to a material containing a larger amount of nitrogen than oxygen, and an oxynitride refers to a material containing a larger amount of oxygen than nitrogen. The content of each element can be measured by Rutherford backscattering spectrometry (RBS), for example. The insulating layer 201 can be formed by a sputtering method, a CVD method, a coating method, a printing method, or the like.

Further, a halogen element such as chlorine or fluorine may be contained in the insulating layer 201, whereby the function of preventing or reducing diffusion of impurity elements from the substrate 200 can be further improved. The concentration of a halogen element contained in the insulating layer 201 is preferably greater than or equal to $1 \times 10^{15}/cm^3$ and less than or equal to $1 \times 10^{20}/cm^3$ in its peak measured by secondary ion mass spectrometry (SIMS).

The insulating layer 201 can be formed by a sputtering method, an MBE method, a CVD method, a pulsed laser deposition method, an ALD method, or the like as appropriate. Alternatively, a high-density plasma CVD method using microwaves (e.g., a frequency of 2.45 GHz) or the like can be applied. The insulating layer 201 may be formed using a sputtering apparatus which performs deposition with surfaces of a plurality of substrates set substantially perpendicular to a surface of a sputtering target.

In this embodiment, as the insulating layer 201, a 200-nm-thick silicon oxynitride layer is formed over the substrate 200 by a plasma CVD method. Further, the temperature in the formation of the insulating layer 201 is preferably high as much as possible but is lower than or equal to the temperature that the substrate 200 can withstand. For example, the insulating layer 201 is formed while the substrate 200 is heated at a temperature higher than or equal to 350° C. and lower than or equal to 450° C. The temperature in the formation of the insulating layer 201 is preferably constant. For example, the insulating layer 201 is formed while the substrate 200 is heated at 350° C.

After the insulating layer 201 is formed, heat treatment may be performed thereon under reduced pressure, a nitrogen atmosphere, a rare gas atmosphere, or a nitrogen atmosphere with the ultra-dry air. By the heat treatment, the concentration of hydrogen, moisture, a hydride, a hydroxide, or the like contained in the insulating layer 201 can be reduced. It is preferable that the temperature of the heat treatment be as high as possible among temperatures that the substrate 200 can withstand. Specifically, the heat treatment is preferably performed at a temperature higher than or equal to the temperature in the formation of the insulating layer 201 and lower than the strain point of the substrate 200.

Note that the hydrogen concentration in the insulating layer 201 is preferably lower than $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$, further more preferably lower than or equal to $1 \times 10^{16}$ atoms/cm$^3$.

After the insulating layer 201 is formed, oxygen doping treatment may be performed on the insulating layer 201 so that the insulating layer 201 includes a region containing oxygen in a proportion higher than that of oxygen in the stoichiometric composition (includes an oxygen-excess region). The "oxygen doping treatment" means that oxygen (which includes at least one of an oxygen radical, an oxygen atom, an oxygen molecule, ozone, an oxygen ion (oxygen molecule ion), and an oxygen cluster ion) is added to a bulk. The term "bulk" is used in order to clarify that oxygen is added not only to a surface of a thin film but also to the inside of the thin film. The "oxygen doping treatment" includes "oxygen plasma doping treatment" in which oxygen which is made to be plasma is added to a bulk. For the oxygen doping treatment, an ion implantation method, an ion doping method, a plasma immersion ion implantation method, plasma treatment performed under an oxygen atmosphere, or the like can be employed. For the ion implantation method, a gas cluster ion beam may be used.

A gas containing oxygen can be used for the oxygen doping treatment. As the gas containing oxygen, oxygen, dinitrogen monoxide, nitrogen dioxide, carbon dioxide, carbon monoxide, or the like can be used. Further, a rare gas may be added to the gas containing oxygen for the oxygen doping treatment.

By introduction of oxygen, a bond between hydrogen and a constituent element of the insulating layer 201 or a bond between the constituent element and a hydroxyl group is cut, and the hydrogen or the hydroxyl group reacts with the oxygen, so that water is produced. Accordingly, heat treatment performed after introduction of oxygen facilitates elimination of hydrogen or the hydroxyl group which is an impurity as water. Therefore, heat treatment may be performed after introduction of oxygen into the insulating layer 201. After that, oxygen may be further introduced into the insulating layer 201 so that the insulating layer 201 is in an oxygen-excess state. The introduction of oxygen and the heat treatment on the insulating layer 201 may be performed alternately plural times. The heat treatment and the introduction of oxygen may be performed at the same time.

Then, a conductive layer is formed to a thickness greater than or equal to 100 nm and less than or equal to 500 nm, preferably greater than or equal to 200 nm and less than or equal to 300 nm, over the insulating layer 201 by a sputtering method, a vacuum evaporation method, or a plating method. A resist mask is formed over the conductive layer by a photolithography method, an inkjet method, or the like and the conductive layer is etched using the resist mask; thus, the gate electrode 202, the wiring 212_i, the wiring 203, and the wiring 226 are formed (see FIG. 12A and FIG. 16A). Note that the gate electrode 202, the wiring 212_i, the wiring 203, and the gate electrode 262 can be formed by discharging a conductive nanopaste of copper or the like over the substrate by an inkjet method and baking the conductive nanopaste, without using a resist mask.

The above conductive layer can be formed using a metal material selected from aluminum (Al), chromium (Cr), copper (Cu), tantalum (Ta), titanium (Ti), molybdenum (Mo), tungsten (W), neodymium (Nd), and scandium (Sc); an alloy material containing the above metal element; a nitride material of the above metal element; or the like. Alternatively, a material containing one or more metal elements selected from manganese (Mn), magnesium (Mg), zirconium (Zr), and beryllium (Be) may be used. Further alternatively, a semiconductor typified by polycrystalline silicon including an impurity element such as phosphorus, or silicide such as nickel silicide may be used.

The above conductive layer may have a single-layer structure or a stacked structure of two or more layers. For example, a single-layer structure of aluminum containing silicon, a two-layer structure in which titanium is stacked over aluminum, a two-layer structure in which titanium is stacked over titanium nitride, a two-layer structure in which tungsten is stacked over titanium nitride, a two-layer structure in which tungsten is stacked over tantalum nitride, a two-layer structure in which copper is stacked over a Cu—Mg—Al alloy, a three-layer structure in which titanium nitride, copper, and tungsten are stacked in this order, a three-layer structure in which tungsten, copper, and tantalum nitride are stacked in this order, and the like can be given. When copper is used for the above conductive layer, the resistance of the wirings formed using the above conductive layer can be reduced. Further, copper is stacked with a refractory metal such as tungsten, molybdenum, or tantalum or a nitride of the metal, whereby adhesion of the copper used as the wiring can be improved or resistance to migration caused by hillocks or the like can be improved.

For the above conductive layer, a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added can be used. Alternatively, a stacked-layer structure of the above light-transmitting conductive material and a material containing the above metal element may be employed.

For the above conductive layer, a metal oxide containing nitrogen, specifically, an In—Ga—Zn-based metal oxide containing nitrogen, an In—Sn-based metal oxide containing nitrogen, an In—Ga-based metal oxide containing nitrogen, an In—Zn-based metal oxide containing nitrogen, tin oxide containing nitrogen, indium oxide containing nitrogen, or a metal nitride (InN, SnN, or the like), can be used. These materials each have a work function higher than or equal to 5 eV (electron volts); thus, when these materials are used for the gate electrode layer, the threshold voltage, which is one of electric characteristics of the transistor, can be positive. Accordingly, a so-called normally-off switching element can be achieved. Note that in the case where the above conductive layer has a stacked structure, a metal oxide containing nitrogen is used for a layer in contact with an insulating layer functioning as a gate insulating layer; thus, a normally-off switching element can be obtained.

In this embodiment, as the conductive layer, a layer in which tantalum nitride and copper are stacked is formed over the insulating layer 201 by a sputtering method. Then, with a resist mask formed by a photolithography process, part of the conductive layer is selectively etched, so that the gate electrode 202, the wiring 212_i, the wiring 203, and the gate electrode 262 are formed. As the etching, a dry etching method or a wet etching method can be used. The conductive layer may be etched by both a dry etching method and a wet etching method in combination. For example, Cu may be etched by a wet etching method and tantalum nitride may be etched by a dry etching method.

In the case where the conductive layer is etched by a dry etching method, a gas containing a halogen element can be used as the etching gas. As an example of the gas containing a halogen element, a chlorine-based gas such as chlorine ($Cl_2$), boron trichloride ($BCl_3$), silicon tetrachloride ($SiCl_4$), or carbon tetrachloride ($CCl_4$)); a fluorine-based gas such as carbon tetrafluoride ($CF_4$), sulfur hexafluoride ($SF_6$), nitrogen trifluoride ($NF_3$), or trifluoromethane ($CHF_3$)); hydrogen bromide (HBr); or oxygen can be used as appropriate. An inert gas may be added to the etching gas. As a dry etching method, a reactive ion etching (RIE) method can be used.

As a plasma source, a capacitively coupled plasma (CCP), an inductively coupled plasma (ICP), an electron cyclotron resonance (ECR) plasma, a helicon wave plasma (HWP), a microwave-excited surface wave plasma (SWP), or the like can be used. In particular, with ICP, ECR, HWP, and SWP, a high density plasma can be generated. In the case of performing etching by a dry etching method (hereinafter also referred to as "dry etching treatment"), the etching conditions (the amount of electric power applied to a coil-shaped electrode, the amount of electric power applied to an electrode on a substrate side, the temperature of the electrode on the substrate side, and the like) are adjusted as appropriate so that the layer can be etched into a desired shape.

Note that a process in which a resist mask having an appropriate shape is formed over a conductive layer or an insulating layer by a photolithography method is referred to as a photolithography process; in general, after the formation of the resist mask, an etching step and a removal step of the resist mask are performed in many cases. Thus, unless otherwise specified, a photolithography process in this specification includes a step of forming a resist mask, a step of etching a conductive layer or an insulating layer, and a step of removing the resist mask.

Further, the cross-sectional shape of the formed wiring or electrode, specifically, the cross-sectional shape (e.g., the taper angle or the thickness) of an end portion of the wiring or electrode is devised, whereby the coverage with the layer formed later can be improved.

For example, the end portion of the gate electrode 202 is etched to have a taper shape such that the cross-sectional shape of the gate electrode 202 becomes trapezoidal or triangle. Here, the end portion of the gate electrode 202 has a taper angle θ (see FIG. 12A) of 80° or less, preferably 60° or less, further preferably 45° or less. Note that the taper angle θ refers to an inclination angle formed by the side surface and bottom surface of the layer having a taper shape when the layer is seen from the direction perpendicular to the cross section of the layer (i.e., the plane perpendicular to the surface of the substrate). A taper angle smaller than 90° is called forward tapered angle and a taper angle of larger than or equal to 90° is called inverse tapered angle.

Alternatively, the cross-sectional shape of the end portion of the gate electrode 202 has a plurality of steps, so that the coverage with the layer formed thereon can be improved. The above is not limited to the gate electrode 202, and by providing a forward taper shape or a step-like shape for a cross section of an end portion of each layer, a phenomenon in that a layer formed over the end portion is separated (disconnection) can be prevented, so that the coverage becomes good.

Next, the insulating layer 204 and the semiconductor layer 205 are formed over the gate electrode 202, the wiring 212_i, the wiring 203, and the gate electrode 262 (see FIG. 12B and FIG. 16B).

The insulating layer 204 can be formed by a sputtering method, an MBE method, a CVD method, a pulsed laser deposition method, an ALD method, or the like as appropriate. Alternatively, a high-density plasma CVD method using microwaves or the like can be applied. The insulating layer 204 may be formed using a sputtering apparatus which performs deposition with surfaces of a plurality of substrates set substantially perpendicular to a surface of a sputtering target.

The insulating layer 204 can be formed using a single layer or a stacked layer using one or more of materials selected from silicon oxide, silicon nitride, silicon oxynitride, silicon nitride oxide, aluminum oxide, aluminum nitride, aluminum oxynitride, aluminum nitride oxide, tantalum oxide, gallium oxide, yttrium oxide, lanthanum oxide, hafnium oxide, hafnium silicate, hafnium silicate to which nitrogen is added, and hafnium aluminate to which nitrogen is added.

In this embodiment, as the insulating layer 204, a stack of silicon nitride and silicon oxynitride is formed at a substrate temperature of 200° C. to 350° C. by a high-density plasma CVD method using microwaves. The insulating layer 204 is preferably formed to have a thickness greater than or equal to 50 nm and less than or equal to 800 nm, preferably greater than or equal to 100 nm and less than or equal to 600 nm. The thickness of the insulating layer 204 is preferably formed in consideration of the size of the transistor and the step coverage of the gate electrode 202 with the insulating layer 204.

Generally, a capacitor has such a structure that a dielectric is sandwiched between two electrodes that face to each other, and as the thickness of the dielectric is smaller (as the distance between the two facing electrodes is shorter) or as the dielectric constant of the dielectric is higher, the capacitance becomes higher. However, if the thickness of the dielectric is reduced in order to increase the capacitance of the capacitor, leakage current flowing between the two electrodes tends to increase and the withstand voltage of the capacitor tends to lower.

A portion where a gate electrode, a gate insulating layer, and a semiconductor layer of a transistor overlap with each other functions as the above-described capacitor (hereinafter also referred to as "gate capacitor"). A channel is formed in a region in the semiconductor layer, which overlaps with the gate electrode with the gate insulating layer provided therebetween. In other words, the gate electrode and the channel formation region function as two electrodes of the capacitor, and the gate insulating layer functions as a dielectric of the capacitor. Although it is preferable that the capacitance of the gate capacitor be as high as possible, a reduction in the thickness of the gate insulating layer for the purpose of increasing the capacitance increases the probability of occurrence of an increase in the leakage current or a reduction in the withstand voltage.

In the case where a high-k material such as hafnium silicate ($HfSi_xO_y$ (x>0, y>0)), hafnium silicate to which nitrogen is added ($HfSi_xO_yN_z$ (x>0, y>0, z>0)), hafnium aluminate to which nitrogen is added ($HfAl_xO_yN_z$ (x>0, y>0, z>0)), hafnium oxide, or yttrium oxide is used for the insulating layer 204, even if the thickness of the insulating layer 204 is made thick, sufficient capacitance between the gate electrode 202 and the semiconductor layer 205 can be ensured.

For example, in the case where a high-k material with a dielectric constant higher than that of silicon oxide is used for the insulating layer 204, even if the insulating layer 204 is made thick, a capacitance equivalent to that in the case of using silicon oxide for the insulating layer 204 can be obtained, so that the leakage current between the gate electrode 202 and the semiconductor layer 205 can be reduced. Further, leakage current between the wiring formed of the same layer as the gate electrode 202 and another wiring that overlaps with the wiring can also be reduced. The insulating layer 204 may have a stacked-layer structure of the high-k material and the above-described material.

Further, the insulating layer 204 preferably contains oxygen in a portion which is in contact with the semiconductor layer 205 formed later. The insulating layer 204 in contact with the semiconductor layer 205 preferably contains oxygen which exceeds at least the stoichiometric composition in the film (bulk). For example, in the case where a silicon oxide film is used as the insulating layer 204, the composition formula is $SiO_{2+\alpha}$ ($\alpha$>0). By using this silicon oxide film as the insulating layer 204, oxygen can be supplied to the semiconductor layer 205, so that favorable characteristics can be obtained.

Further, in the case where the gate electrode 202 (including a wiring or an electrode formed using the same layer as the gate electrode) is formed using a conductive layer containing Cu, a portion of the insulating layer 204 which is in contact with the gate electrode 202 is preferably formed using a material having barrier properties for suppressing Cu diffusion. As the material having barrier properties, for example, silicon nitride or aluminum oxide can be given. By covering the gate electrode 202 with an insulating layer having barrier properties, Cu diffusion can be suppressed. When the insulating layer 201 functioning as a base layer is also formed using a material having barrier properties and the gate electrode 202 is sandwiched between the materials having barrier properties, an effect of suppressing Cu diffusion can be improved.

Silicon nitride, aluminum oxide, or the like has barrier properties against oxygen and impurities such as hydrogen, moisture, a hydride, or a hydroxide. By forming the insulating layer 204 with use of the material having barrier properties, not only entry of the above-described impurities from the substrate side but also diffusion of oxygen contained in the insulating layer 204 into the substrate side can be prevented.

In this embodiment, over the gate electrode 202 (including a wiring or an electrode formed using the same layer as the gate electrode), a stack of silicon nitride and silicon oxynitride is formed as the insulating layer 204 by a high-density plasma CVD method using microwaves.

Further, before the insulating layer 204 is formed, an impurity such as moisture or an organic substance which is attached to the surface of a plane on which the layer is formed is preferably removed by plasma treatment using oxygen, dinitrogen monoxide, a rare gas (typically argon), or the like.

After the insulating layer 204 is formed, heat treatment may be performed thereon under reduced pressure, a nitrogen atmosphere, a rare gas atmosphere, or a nitrogen atmosphere with the ultra-dry air. By the heat treatment, the concentration of hydrogen, moisture, a hydride, a hydroxide, or the like contained in the insulating layer 204 can be reduced. It is preferable that the temperature of the heat treatment be as high as possible among temperatures that the substrate 200 can withstand. Specifically, the heat treatment is preferably performed at a temperature higher than or equal to the temperature in the formation of the insulating layer 204 and lower than the strain point of the substrate 200.

Further, after the insulating layer 204 is formed, oxygen doping treatment may be performed on the insulating layer 204 to make the insulating layer 204 an oxygen-excess state. The oxygen doping treatment on the insulating layer 204 is preferably performed after the above-described heat treatment.

The insulating layer 204 containing a large (excessive) amount of oxygen, which serves as an oxygen supply source, is provided so as to be in contact with the semiconductor layer 205, so that oxygen can be supplied from the insulating layer 204 to the semiconductor layer 205 by the heat treatment performed later. By the oxygen supplied to the semiconductor layer 205, oxygen vacancies in the semiconductor layer 205 can be filled.

The insulating layer 204 may be a stack of an insulating layer A and an insulating layer B, the insulating layer A may be formed using a material having barrier properties over the gate electrode 202 (including a wiring or an electrode formed using the same layer as the gate electrode) formed using the conductive layer containing Cu, and the insulating layer B may be formed using a material containing oxygen over the insulating layer A. For example, a silicon nitride film may be formed over the gate electrode 202 as the insulating layer A and a silicon oxynitride film may be formed thereover as the insulating layer B.

In the case where the insulating layer 204 is formed using a single layer or a stacked layer, a layer of the insulating layer 204, which is in contact with the semiconductor layer 205, may be formed using gallium oxide or gallium oxide zinc. In particular, in the case where an oxide semiconductor is used for the semiconductor layer 205, a material containing the same kind of component as the oxide semiconductor of the semiconductor layer 205 is preferably used for the layer in contact with the semiconductor layer 205. This is because such a material is compatible with the oxide semiconductor, and therefore, the use of such a material for the insulating layer 204 in contact with the semiconductor layer 205 enables a state of the interface between the semiconductor layer 205 and the insulating layer 204 to be kept well. Here, containing "the same kind of component as the oxide semiconductor" means containing one or more of elements selected from constituent elements of the oxide semiconductor. For example, in the case where the oxide semiconductor is formed using an In—Ga—Zn-based oxide semiconductor material, gallium oxide, gallium oxide zinc, and the like are given as an insulating material containing the same kind of component as the oxide semiconductor.

Next, a semiconductor layer 215 (not illustrated) to be the semiconductor layer 205 is formed over the insulating layer 204. The semiconductor layer 215 can be formed using an amorphous semiconductor, a microcrystalline semiconductor, a polycrystalline semiconductor, or the like by a CVD method, a sputtering method, or the like. For example, amorphous silicon or microcrystalline germanium can be used. Alternatively, a compound semiconductor such as silicon carbide, gallium arsenide, an oxide semiconductor, or a nitride semiconductor, an organic semiconductor, or the like can be used.

In this embodiment, an oxide semiconductor is used for the semiconductor layer 215. Planarization treatment may be performed on a region of the insulating layer 204 with which the semiconductor layer 215 is formed in contact before the formation of the semiconductor layer 215. There is no particular limitation on the planarization treatment; polishing treatment (e.g., CMP treatment), dry etching treatment, or plasma treatment can be used.

As the plasma treatment, reverse sputtering in which an argon gas is introduced and plasma is generated can be performed. The reverse sputtering is a method in which voltage is applied to the substrate side with use of an RF power source in an argon atmosphere and plasma is generated in the vicinity of the substrate so that a surface is modified. Instead of an argon atmosphere, a nitrogen atmosphere, a helium atmosphere, an oxygen atmosphere, or the like may be used. With the reverse sputtering, particle substances (also referred to as particles or dust) attached to the surface of the insulating layer 204 can be removed.

Further, as the planarization treatment, polishing treatment, dry etching treatment, or plasma treatment may be performed plural times, or these treatments may be performed in combination. In the case where the treatments are performed in combination, there is no particular limitation on the order of steps and the order can be set as appropriate depending on the roughness of the surface of the insulating layer 204.

Further, before the semiconductor layer 215 is formed, an impurity such as moisture or an organic substance which is attached to the surface of a plane on which the layer is formed is preferably removed by plasma treatment using oxygen, dinitrogen monoxide, a rare gas (typically argon), or the like.

A rare gas (typically argon) atmosphere, an oxygen gas atmosphere, or a mixed gas of a rare gas and oxygen is used as appropriate as a sputtering gas used for forming the semiconductor layer 215 by a sputtering method. It is preferable that a high-purity gas from which impurities such as hydrogen, water, a hydroxyl group, and a hydride are removed be used as the sputtering gas.

The semiconductor layer 215 is preferably formed under a condition that much oxygen is contained (e.g., by a sputtering method in an atmosphere where the proportion of oxygen is 100%) so as to contain much or oversaturated oxygen (preferably include a region containing oxygen in excess of the stoichiometric composition of the oxide semiconductor in a crystalline state).

For example, in the case where an oxide semiconductor layer is formed by a sputtering method, it is preferably performed under conditions where the proportion of oxygen in the sputtering gas is large; it is preferable that the sputtering gas contain an oxygen gas at 100%. The deposition under the conditions where the proportion of oxygen in the sputtering gas is large, in particular, in an atmosphere containing an oxygen gas at 100% enables release of Zn from the oxide semiconductor layer to be suppressed even when the deposition temperature is, for example, higher than or equal to 300° C.

It is preferable that the semiconductor layer 215 be purified so as to contain impurities such as copper, aluminum, and chlorine as little as possible. In a process for manufacturing the transistor, a step which has no risk that such impurities are mixed or attached to the surface of the oxide semiconductor layer is preferably selected as appropriate. Specifically, the copper concentration in the oxide semiconductor layer is lower than or equal to $1\times10^{18}$ atoms/$cm^3$, preferably lower than or equal to $1\times10^{17}$ atoms/$cm^3$. In addition, the aluminum concentration in the oxide semiconductor layer is lower than or equal to $1\times10^{18}$ atoms/$cm^3$. Further, the chlorine concentration in the oxide semiconductor layer is lower than or equal to $2\times10^{18}$ atoms/$cm^3$.

The concentrations of alkali metals such as sodium (Na), lithium (Li), and potassium (K) in the semiconductor layer 215 are as follows: the concentration of Na is lower than or equal to $5\times10^{16}$ $cm^{-3}$, preferably lower than or equal to $1\times10^{16}$ $cm^{-3}$, further preferably lower than or equal to $1\times10^{15}$ $cm^{-3}$; the concentration of Li is lower than or equal to $5\times10^{15}$ $cm^{-3}$, preferably lower than or equal to $1\times10^{15}$ cm$^{-3}$; and the concentration of K is lower than or equal to 5×10$^{15}$ cm$^{-3}$, preferably lower than or equal to 1×10$^{15}$ cm$^{-3}$.

In this embodiment, as the semiconductor layer 215, a 35-nm-thick In—Ga—Zn-based oxide (IGZO) film is formed by a sputtering method using a sputtering apparatus including an AC power supply device. As a target in the sputtering method, a metal oxide target whose composition is In:Ga:Zn=1:1:1 (atomic ratio) is used.

The semiconductor layer 215 is formed over the insulating layer 204 in such a manner that the substrate 200 is held in a deposition chamber kept under reduced pressure, a sputtering gas from which hydrogen and moisture are removed is introduced into the deposition chamber while moisture remaining therein is removed, and the above target is used. To remove moisture remaining in the deposition chamber, an entrapment vacuum pump such as a cryopump, an ion pump, or a titanium sublimation pump is preferably used. As an exhaustion unit, a turbo molecular pump to which a cold trap is added may be used. A hydrogen atom, a compound containing a hydrogen atom, such as water (H$_2$O), (preferably a compound containing a carbon atom), or the like is removed from the deposition chamber which is evacuated with the cryopump, whereby the concentration of impurities in the semiconductor layer 215 formed in the deposition chamber can be reduced.

Further, the insulating layer 204 and the semiconductor layer 215 may be formed continuously without exposure to the air. Such continuous formation of the insulating layer 204 and the semiconductor layer 215 without exposure to the air can prevent impurities such as hydrogen and moisture from being attached to a surface of the insulating layer 204.

Next, part of the semiconductor layer 215 is selectively etched by a photolithography process to form the island-shaped semiconductor layer 205 (see FIG. 12B). A resist mask used for forming the semiconductor layer 205 may be formed by an inkjet method. Formation of the resist mask by an inkjet method needs no photomask; thus, manufacturing cost can be reduced.

Note that the etching of the semiconductor layer 215 may be conducted by a dry etching method, a wet etching method, or both of them. In the case where the semiconductor layer 215 is etched by a wet etching method, a solution obtained by mixing phosphoric acid, acetic acid, and nitric acid, a solution containing oxalic acid, or the like can be used as the etchant. Alternatively, ITO-07N (produced by KANTO CHEMICAL CO., INC.) may be used. In the case where the semiconductor layer 215 is etched by a dry etching method, for example, a dry etching method using a high-density plasma source such as ECR or ICP can be used. As a dry etching method by which uniform electric discharge can be performed over a large area, there is a dry etching method using an enhanced capacitively coupled plasma (ECCP) mode. This dry etching method can be applied even to the case where a substrate of the tenth generation, the size of which exceeds 3 m, is used as the substrate, for example.

Further, heat treatment may be performed in order to remove excess hydrogen (including water or a hydroxyl group) from the semiconductor layer 205 (to perform dehydration or dehydrogenation) after the formation of the semiconductor layer 205. The temperature of the heat treatment is higher than or equal to 300° C. and lower than or equal to 700° C., or lower than the strain point of the substrate. The heat treatment can be performed under reduced pressure, a nitrogen atmosphere, or the like. For example, the substrate may be put in an electric furnace which is a kind of heat treatment apparatus, and the semiconductor layer 205 may be subjected to heat treatment at 450° C. for one hour in a nitrogen atmosphere.

The heat treatment apparatus is not limited to the electric furnace; a device for heating an object by heat conduction or heat radiation from a heating element such as a resistance heating element may be alternatively used. For example, a rapid thermal anneal (RTA) apparatus such as a gas rapid thermal anneal (GRTA) apparatus or a lamp rapid thermal anneal (LRTA) apparatus can be used. The LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. The GRTA apparatus is an apparatus for heat treatment using a high-temperature gas. As the high-temperature gas, an inert gas which does not react with an object to be processed by heat treatment, such as nitrogen or a rare gas like argon, is used.

For example, as the heat treatment, GRTA may be performed as follows; the substrate is put in an inert gas heated at a high temperature of 650° C. to 700° C., is heated for several minutes, and is taken out of the inert gas.

In the heat treatment, it is preferable that water, hydrogen, and the like be contained as less as possible in nitrogen or a rare gas such as helium, neon, or argon. The purity of the nitrogen or the rare gas such as helium, neon, or argon which is introduced into the heat treatment apparatus is set to preferably 6N (99.9999%) or higher, further preferably 7N (99.99999%) or higher (that is, the impurity concentration is preferably 1 ppm or lower, further preferably 0.1 ppm or lower).

After the semiconductor layer 205 is heated by the heat treatment, a high-purity oxygen gas, a high-purity dinitrogen monoxide gas, or ultra-dry air (air with a moisture amount of less than or equal to 20 ppm (−55° C. by conversion into a dew point), preferably less than or equal to 1 ppm, more preferably less than or equal to 10 ppb according to the measurement with use of a dew point meter of a cavity ring down spectroscopy (CRDS) system) may be introduced into the same furnace. It is preferable that water, hydrogen, or the like be contained as less as possible in the oxygen gas or the dinitrogen monoxide gas. Alternatively, the purity of the oxygen gas or the dinitrogen monoxide gas which is introduced into the heat treatment apparatus is preferably 6N or higher, further preferably 7N or higher (i.e., the impurity concentration in the oxygen gas or the dinitrogen monoxide gas is preferably 1 ppm or less, further preferably 0.1 ppm or less). By the effect of the oxygen gas or the dinitrogen monoxide gas, oxygen which is a main component of the oxide semiconductor and which has been reduced at the same time as the step for removing impurities by dehydration or dehydrogenation is supplied, so that oxygen vacancies in the oxide semiconductor can be reduced; thus, the semiconductor layer 205 formed using an oxide semiconductor can be made i-type (intrinsic) or substantially i-type. In this respect, it can be said that an embodiment of the disclosed invention includes a novel technical idea because it is different from an i-type semiconductor such as silicon added with an impurity element.

The timing of performing the heat treatment for dehydration or dehydrogenation is either before or after the island-shaped semiconductor layer 205 is formed as long as it is after formation of the oxide semiconductor layer. The heat treatment for dehydration or dehydrogenation may be performed plural times and may also serve as another heat treatment.

By the dehydration or dehydrogenation treatment, oxygen which is a main component of the oxide semiconductor might be eliminated and thus reduced. There is an oxygen vacancy in a portion where oxygen is eliminated in the oxide semiconductor layer, which causes a donor level which causes a change in the electric characteristics of the transistor owing to the oxygen vacancy.

For the above reason, oxygen doping treatment may be performed on the semiconductor layer 205 after the dehydration or dehydrogenation treatment is performed, so that oxygen can be supplied to the semiconductor layer 205.

Such supply of oxygen by introduction of oxygen into the semiconductor layer 205 after the dehydration or dehydrogenation treatment is performed enables a reduction in oxygen vacancies generated in the oxide semiconductor by the step of removing impurities by the dehydration or dehydrogenation treatment, so that the semiconductor layer 205 formed using an oxide semiconductor can be made i-type (intrinsic). Change in electric characteristics of a transistor including the i-type (intrinsic) semiconductor layer 205 is suppressed, and thus the transistor is electrically stable.

In the case where oxygen is introduced into the semiconductor layer 205 formed using an oxide semiconductor, the oxygen doping treatment is performed either directly or through another layer into the semiconductor layer 205.

By the introduction of oxygen, a bond between a constituent element of the oxide semiconductor and hydrogen or a bond between the constituent element and a hydroxyl group is cut, and the hydrogen or the hydroxyl group reacts to oxygen, so that water is generated. Therefore, hydrogen or a hydroxyl group, which is an impurity, is more likely to be eliminated in the form of water by performing heat treatment after the oxygen introduction. From the reason above, heat treatment may be performed after oxygen is introduced into the semiconductor layer 205. After that, oxygen may be further introduced into the semiconductor layer 205 so that the semiconductor layer 205 is in an oxygen-excess state. The introduction of oxygen and the heat treatment on the semiconductor layer 205 may be performed alternately plural times. The introduction of oxygen and the heat treatment may be performed at the same time. In order that the semiconductor layer 205 formed using an oxide semiconductor may be supersaturated with oxygen by sufficient supply of oxygen, it is preferable that insulating layers each containing much oxygen (such as silicon oxide layers) be provided so as to surround and be in contact with the semiconductor layer 205.

Here, the hydrogen concentration in the insulating layer containing much oxygen is also important because it affects upon the characteristics of the transistor. In the case where the hydrogen concentration in the insulating layer containing much oxygen is higher than or equal to $7.2 \times 10^{20}$ atoms/cm$^3$, variation in initial characteristics of the transistor is increased, L length dependence is increased, and the transistor is significantly degraded by a BT stress test; therefore, the hydrogen concentration in the insulating layer containing much oxygen is preferably lower than $7.2 \times 10^{20}$ atoms/cm$^3$. That is, it is preferable that the hydrogen concentration in the semiconductor layer 205 be lower than or equal to $5 \times 10^{19}$ atoms/cm$^3$ and the hydrogen concentration in the insulating layer containing excess oxygen is lower than $7.2 \times 10^{20}$ atoms/cm$^3$.

The semiconductor layer 205 may have a structure in which a plurality of oxide semiconductor layers is stacked. For example, the semiconductor layer 205 may be a stack of a first oxide semiconductor layer and a second oxide semiconductor layer which are formed using metal oxides with different compositions. For example, the first oxide semiconductor layer may be formed using a three-component metal oxide, and the second oxide semiconductor layer may be formed using a two-component metal oxide. Alternatively, for example, both the first oxide semiconductor layer and the second oxide semiconductor layer may be formed using three-component metal oxides.

Further, the constituent elements of the first oxide semiconductor layer and the second oxide semiconductor layer may be the same as each other but the composition of the constituent elements of the first oxide semiconductor layer and the second oxide semiconductor layer may be different from each other. For example, the first oxide semiconductor layer may have an atomic ratio of In:Ga:Zn=1:1:1, and the second oxide semiconductor layer may have an atomic ratio of In:Ga:Zn=3:1:2. Alternatively, the first oxide semiconductor layer may have an atomic ratio of In:Ga:Zn=1:3:2, and the second oxide semiconductor layer may have an atomic ratio of In:Ga:Zn=1:1:1.

At this time, one of the first oxide semiconductor layer and the second oxide semiconductor layer, which is closer to the gate electrode (on a channel side), preferably contains In and Ga at a proportion of In>Ga. The other which is farther from the gate electrode (on a back channel side) preferably contains In and Ga at a proportion of In≤Ga.

In an oxide semiconductor, the s orbital of heavy metal mainly contributes to carrier transfer, and when the In content in the oxide semiconductor is increased, overlap of the s orbitals is likely to be increased. Therefore, an oxide having a composition of In>Ga has higher mobility than an oxide having a composition of In≤Ga. Further, in Ga, the formation energy of an oxygen vacancy is larger and thus an oxygen vacancy is less likely to occur than in In; therefore, the oxide having a composition of In≤Ga has more stable characteristics than the oxide having a composition of In>Ga.

Application of an oxide semiconductor containing In and Ga at a proportion of In>Ga on a channel side, and an oxide semiconductor containing In and Ga at a proportion of In≤Ga on a back channel side allows the mobility and reliability of the transistor to be further improved.

Further, oxide semiconductors whose crystallinities are different from each other may be applied to the first and second oxide semiconductor layers. That is, two of a single crystal oxide semiconductor, a polycrystalline oxide semiconductor, an amorphous oxide semiconductor, and a CAAC-OS may be combined as appropriate. By applying an amorphous oxide semiconductor to at least one of the first oxide semiconductor layer and the second oxide semiconductor layer, internal stress or external stress of the semiconductor layer 205 can be relieved, variation in characteristics of the transistor is reduced, and reliability of the transistor can be further improved.

On the other hand, an amorphous oxide semiconductor is likely to absorb impurities such as hydrogen which generate donors, and is likely to generate oxygen vacancies, so that the amorphous oxide semiconductor is likely to be made n-type. For this reason, it is preferable to apply an oxide semiconductor having crystallinity such as a CAAC-OS to the oxide semiconductor layer on the channel side.

Further, in a bottom-gate transistor of a channel-etch type, oxygen vacancies are likely to be generated by etching treatment for forming the source electrode and the drain electrode to make the transistor n-type, in the case where an amorphous oxide semiconductor is used on the back channel side. Therefore, in the case of the transistor of a channel-etch type, it is preferable to apply an oxide semiconductor having crystallinity to the oxide semiconductor layer on the back channel side.

Further, the semiconductor layer 205 may have a stacked structure of three or more oxide semiconductor layers in which an amorphous oxide semiconductor layer is interposed between a plurality of oxide semiconductor layers each having crystallinity. A structure in which an oxide semiconductor layer having crystallinity and an amorphous oxide semiconductor layer are alternately stacked may also be employed.

In the case where the semiconductor layer 205 has a stacked structure of a plurality of layers, the above structures can be combined as appropriate.

Further, in the case where the semiconductor layer 205 has a stacked structure of a plurality of oxide semiconductor layers, oxygen doping treatment may be performed each time the oxide semiconductor layer is formed. Such oxygen doping treatment each time the oxide semiconductor layer is formed leads to improvement in the effect of reducing oxygen vacancies in the oxide semiconductor.

Next, a conductive layer 217 (not illustrated) is formed over the semiconductor layer 205, and part of the conductive layer 217 is selectively etched by a photolithography process, whereby the source electrode 206a, the drain electrode 206b, the source electrode 266a, the drain electrode 266b (see FIG. 1), and the wirings 236 are formed (see FIG. 12C and FIG. 16C).

The conductive layer 217 is formed using a material which can withstand heat treatment performed later. Further, the conductive layer 217 can be formed using a material and a structure similar to those of the gate electrode 202. For the conductive layer 217, a metal containing an element selected from Al, Cu, Cr, Ta, Ti, Mo, and W, a metal nitride containing any of the above elements as a component (e.g., titanium nitride, molybdenum nitride, or tungsten nitride), or the like can be used, for example. A refractory metal film of Ti, Mo, W, or the like or a metal nitride film of any of these elements (a titanium nitride film, a molybdenum nitride film, or a tungsten nitride film) may be stacked either under or on or both of under and on the metal layer of Al or the like. Alternatively, the conductive layer 217 may be formed using a conductive metal oxide. As the conductive metal oxide, indium oxide ($In_2O_3$), tin oxide ($SnO_2$), zinc oxide (ZnO), indium oxide-tin oxide ($In_2O_3$—$SnO_2$; abbreviated to ITO), indium oxide-zinc oxide ($In_2O_3$—ZnO), or any of these metal oxide materials in which silicon oxide is contained can be used.

In the case where an oxide semiconductor is used for the semiconductor layer 205, it is preferable that the conductive layer 217 to be the source electrode 206a and the drain electrode 206b do not contain Cu. In particular, it is preferable that the conductive layer 217 do not contain Cu at the main component level (1 wt % or higher). The conductive layer 217 to be the source electrode 206a and the drain electrode 206b is formed in contact with the semiconductor layer 205; therefore, Cu is attached to an exposed surface of the semiconductor layer 205 at the etching of the conductive layer 217, and the attached Cu is diffused into the semiconductor layer 205, which causes degradation of electric characteristics of the transistor and a decrease in reliability.

In this embodiment, a stack of W, Al, and Ti is formed as the conductive layer 217 by a sputtering method. The conductive layer 217 can be etched by a wet etching method or a dry etching method. For example, an ICP etching method (dry etching method) can be used under conditions in which the etching gas is $BCl_3$: $Cl_2$=750 sccm:150 sccm, the bias power is 1500 W, the ICP power source is 0 W, and the pressure is 2.0 Pa.

Figure 13A:
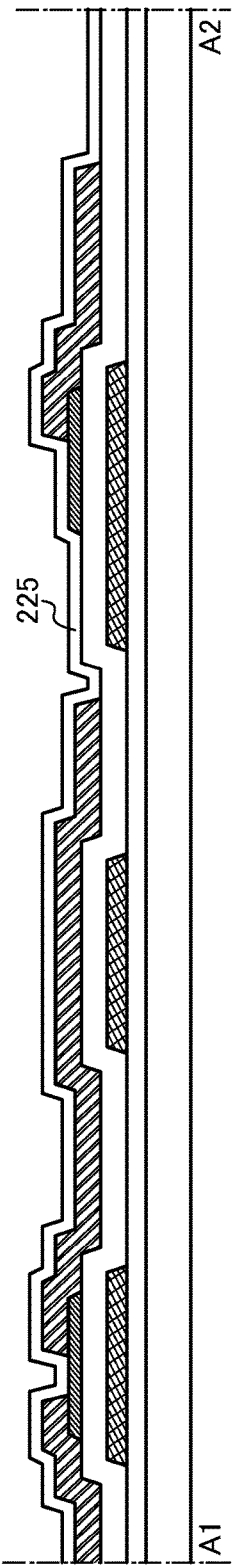
FIGS. 13A to 13C illustrate a manufacturing method.

Next, an insulating layer 225 with a thickness of 20 nm to 50 nm which is in contact with part of the semiconductor layer 205 and part of the semiconductor layer 223 is formed over the source electrode 206a, the drain electrode 206b, the source electrode 266a, the drain electrode 266b, and the wirings 236 (see FIG. 13A and FIG. 17A). The insulating layer 225 can be formed using a material and a method similar to those of the insulating layer 201 or the insulating layer 204. For example, a silicon oxide film or a silicon oxynitride film can be formed to be the insulating layer 225 by a sputtering method or a CVD method.

In this embodiment, as the insulating layer 225, a 30-nm-thick silicon oxynitride film is formed by a plasma CVD method. The deposition conditions of the insulating layer 225 may be as follows: the gas flow rate ratio of $SiH_4$ to $N_2O$ is 20 sccm:3000 sccm; the pressure is 40 Pa; the RF power supply (power supply output) is 100 W; and the substrate temperature is 350° C.

Gallium oxide or gallium oxide zinc may be used for the insulating layer 225. In particular, in the case where an oxide semiconductor is used for the semiconductor layer 205, a material containing the same kind of component as the oxide semiconductor of the semiconductor layer 205 is preferably used for the insulating layer 225. This is because such a material is compatible with the oxide semiconductor, and therefore, the use of such a material for the insulating layer 225 in contact with the semiconductor layer 205 enables a state of the interface between the semiconductor layer 205 and the insulating layer 225 to be kept well.

Figure 13B:
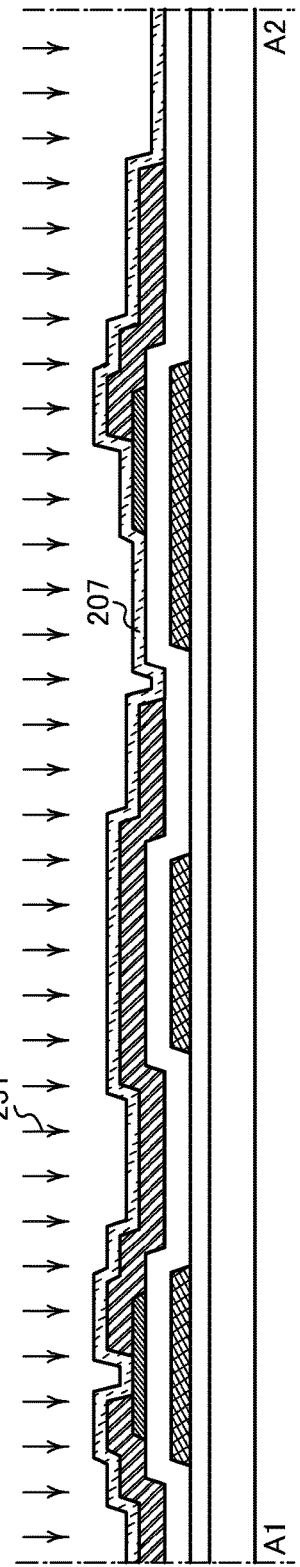

Next, oxygen 231 is introduced into the insulating layer 225, whereby the insulating layer 225 is made to be the insulating layer 207 which contains excess oxygen (see FIG. 13B and FIG. 17B). At least one of an oxygen radical, ozone, an oxygen atom, and an oxygen ion (including a molecular ion and a cluster ion) is contained in the oxygen 231. The introduction of the oxygen 231 can be performed by oxygen doping treatment.

The introduction of the oxygen 231 may be performed on the entire surface of the insulating layer 225 by plasma treatment at a time, for example, using a linear ion beam. In the case of using the linear ion beam, the substrate 200 or the ion beam is relatively moved (scanned), whereby the oxygen 231 can be introduced into the entire surface of the insulating layer 225.

As a gas for supplying the oxygen 231, a gas containing an oxygen atom may be used; for example, an $O_2$ gas, an $N_2O$ gas, a $CO_2$ gas, a CO gas, or an $NO_2$ gas can be used. A rare gas (e.g., Ar) may be contained in the gas for supplying the oxygen.

Further, in the case where an ion implantation method is used for introducing the oxygen, the dose of the oxygen 231 is preferably greater than or equal to $1\times10^{13}$ ions/cm$^2$ and less than or equal to $5\times10^{16}$ ions/cm$^2$. The content of oxygen in the insulating layer 207 preferably exceeds that of the stoichiometric composition. Such a region containing oxygen in excess of the stoichiometric composition exists in at least part of the insulating layer 207. The depth at which oxygen is implanted may be adjusted as appropriate by implantation conditions.

In this embodiment, the oxygen 231 is introduced by plasma treatment under an oxygen atmosphere. Note that the insulating layer 207 preferably contains impurities such as water or hydrogen as little as possible because it is an insulating layer in contact with the semiconductor layer 205.

Therefore, it is preferable to perform heat treatment for removing excess hydrogen (including water or a hydroxyl group) in the insulating layer 225 before the introduction of the oxygen 231. The temperature of the heat treatment for dehydration or dehydrogenation is higher than or equal to 300° C. and lower than or equal to 700° C., or lower than the strain point of the substrate. The heat treatment for dehydration or dehydrogenation can be performed in a manner similar to that of the above-described heat treatment.

The plasma treatment for introducing the oxygen 231 (oxygen plasma treatment) is performed under conditions in which the oxygen flow rate is 250 sccm, the ICP power source is 0 W, the bias power is 4500 W, and the pressure is 15 Pa. Part of oxygen introduced into the insulating layer 225 by the oxygen plasma treatment is introduced into the semiconductor layer 205 through the insulating layer 225. Owing to the introduction of oxygen into the semiconductor layer 205 through the insulating layer 225, plasma damage on the surface of the semiconductor layer 205 can be attenuated, whereby the reliability of the semiconductor device can be improved. It is preferable that the insulating layer 225 be thicker than 10 nm and thinner than 100 nm. If the thickness of the insulating layer 225 be less than or equal to 10 nm, the semiconductor layer 205 is likely to be damaged by the oxygen plasma treatment. On the other hand, if the thickness of the insulating layer 225 be greater than or equal to 100 nm, oxygen introduced by the oxygen plasma treatment might not be supplied sufficiently to the semiconductor layer 205. The heat treatment for dehydration or dehydrogenation of the insulating layer 225 and/or the introduction of the oxygen 231 may be performed plural times. The introduction of oxygen into the insulating layer 225 enables the insulating layer 207 to serve as an oxygen supply layer.

Figure 13C:
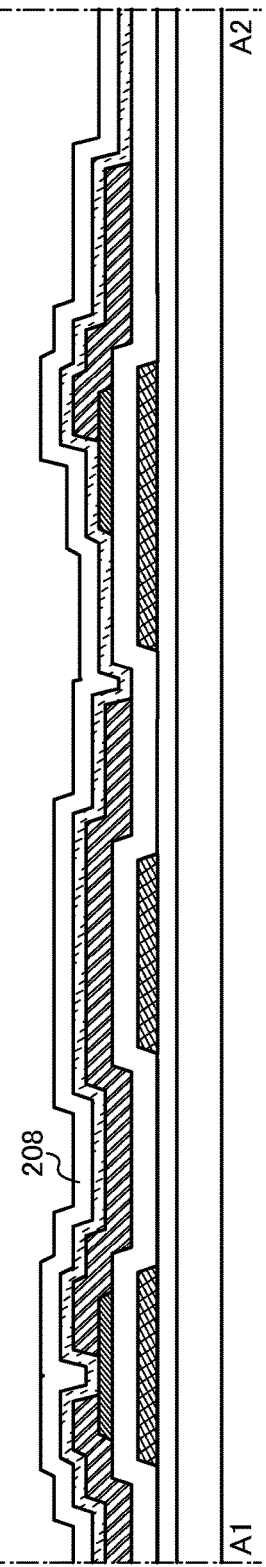

Next, the insulating layer 208 is formed to have a thickness of 200 nm to 500 nm over the insulating layer 207 (see FIG. 13C and FIG. 17C). The insulating layer 208 can be formed using a material and a method similar to those of the insulating layer 201 or the insulating layer 204. For example, a silicon oxide film or a silicon oxynitride film can be formed as the insulating layer 208 by a sputtering method or a CVD method.

In this embodiment, as the insulating layer 208, a 370-nm-thick silicon oxynitride film is formed by a plasma CVD method. The deposition conditions of the insulating layer 208 may be as follows: the gas flow rate ratio of $SiH_4$ to $N_2O$ is 30 sccm:4000 sccm; the pressure is 200 Pa; the RF power supply (power supply output) is 150 W; and the substrate temperature is 220° C.

After the formation of the insulating layer 208, heat treatment may be performed thereon under an inert gas atmosphere, an oxygen atmosphere, or an atmosphere of a mixture of an inert gas and oxygen at a temperature higher than or equal to 250° C. and lower than or equal to 650° C., preferably higher than or equal to 300° C. and lower than or equal to 600° C. By this heat treatment, oxygen contained in the insulating layer 207 can be supplied to the semiconductor layer 205, so that oxygen vacancies in the semiconductor layer 205 can be filled. The formation of the insulating layer 208 over the insulating layer 207 enables oxygen included in the insulating layer 207 to be supplied efficiently to the semiconductor layer 205.

Further, oxygen doping treatment may be performed on the insulating layer 208 to introduce the oxygen 231 into the insulating layer 208, whereby the insulating layer 208 is made an oxygen-excess state. The introduction of the oxygen 231 into the insulating layer 208 may be performed in a manner similar to that of the introduction of the oxygen 231 into the insulating layer 207. After the introduction of the oxygen 231 into the insulating layer 208, heat treatment may be performed thereon under an inert gas atmosphere, an oxygen atmosphere, or an atmosphere of a mixture of an inert gas and oxygen at a temperature higher than or equal to 250° C. and lower than or equal to 650° C., preferably higher than or equal to 300° C. and lower than or equal to 600° C.

In a transistor using an oxide semiconductor for its semiconductor layer in which a channel is formed, the interface state density between the oxide semiconductor layer and the insulating layer can be reduced by supplying oxygen into the oxide semiconductor layer. As a result, carrier trapping at the interface between the oxide semiconductor layer and the insulating layer, caused by the operation of the transistor or the like, can be suppressed, and thus, a highly reliable transistor can be obtained.

Further, a carrier may be generated due to oxygen vacancies in the oxide semiconductor layer. In general, oxygen vacancies in the oxide semiconductor layer cause generation of electrons which are carriers in the oxide semiconductor layer. As a result, the threshold voltage of the transistor shifts in the negative direction. By sufficiently supplying oxygen to the oxide semiconductor layer preferably so that the oxide semiconductor layer contains excess oxygen, the density of oxygen vacancies in the oxide semiconductor layer can be reduced.

Next, part of the insulating layer 204, part of the insulating layer 207, and part of the insulating layer 208 are selectively removed by a photolithography process, so that the opening 209, the opening 238, the opening 239, the opening 232 (see FIG. 1), the opening 233 (see FIG. 1), and the openings 227 (see FIG. 14A and FIG. 18A). A dry etching method or a wet etching method can be used for the etching of the insulating layer 204, the insulating layer 207, and the insulating layer 208. Further, the etching may be performed by a combination of a dry etching method and a wet etching method.

Next, a light-transmitting conductive layer (also referred to as a transparent conductive layer) is formed to have a thickness greater than or equal to 30 nm and less than or equal to 200 nm, preferably greater than or equal to 50 nm and less than or equal to 100 nm by a sputtering method, a vacuum evaporation method, or the like, and the pixel electrode 211, the wiring 234 (see FIG. 1), the wiring 237 (see FIG. 1), and the wirings 246 are formed by a photolithography process (see FIGS. 14B and 18B).

For the light-transmitting conductive layer, a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added can be used. Further, a material formed of 1 to 10 graphene sheets may be used. In this embodiment, a 80-nm-thick ITO layer is formed as the light-transmitting conductive layer.

The pixel electrode 211 is electrically connected to the source electrode 266a of the transistor 121 through the opening 209. The wiring 237 electrically connects the gate electrode 262 and the drain electrode 206b through the opening 238 and the opening 239. The wiring 234 electrically connects the wiring 203 and the drain electrode 266b through the opening 232 and the opening 233. The wiring 246 is electrically connected to the wiring 236 through the opening 227. The wiring 216_j includes the wirings 236 and the wirings 246.

Note that between after the insulating layer 204 is formed and before the conductive layer 217 is formed, openings can be formed in part of the insulating layer 204, and the gate electrode 262 and the wiring 203 can be directly connected to the drain electrode 206b and the drain electrode 266b, respectively, through the openings.

However, in order to form openings in the insulating layer 204, a photolithography process for the formation of the openings is necessary. An increase in the number of photolithography processes causes an increase in manufacturing cost of semiconductor devices and a decrease in productivity.

According to this embodiment, it is possible to connect the gate electrode 262 and the wiring 203 to the drain electrode 206b and the drain electrode 266b, respectively, without an increase in the number of photolithography processes; thus, an increase in manufacturing cost can be suppressed and productivity of semiconductor devices can be favorable.

Next, the partition layer 254 is provided over the insulating layer 208 and the wiring 216_j (see FIG. 2, FIG. 14C, and FIG. 18C). The partition layer 254 can be formed using an organic insulating material or an inorganic insulating material. By a photolithography process, the opening 271 is formed in the partition layer 254 in a position that overlaps with the pixel electrode 211 (see FIG. 2 and FIG. 14C). The sidewalls of the partition layer 254 (the end portions of the opening 271) preferably have a tapered shape or a shape with a curvature. With use of a photosensitive resin material for the partition layer 254, the sidewalls of the partition layer 254 can have a shape with a continuous curvature. As an organic insulating material for forming the partition layer 254, an acrylic resin, a phenol resin, polystyrene, polyimide, or the like can be used. In this embodiment, photosensitive polyimide is used for the partition layer 254.

Next, the EL layer 251 is formed in a region of the opening 271, which is in contact with the pixel electrode 211 (see FIG. 15A). Then, the counter electrode 252 is formed over the EL layer 251 (see FIG. 15B).

The pixel electrode 211 functions as one electrode of the EL element 253. The counter electrode 252 functions as the other electrode of the EL element 253. The EL layer 251 may be formed by stacking a hole injection layer, a hole transport layer, a light-emitting layer, an electron transport layer, an electron injection layer, or the like. In the case where the pixel electrode 211 is used as an anode, a material having a high work function is used for the pixel electrode 211. In the case where the pixel electrode 211 has a stacked structure of a plurality of layers, a material having a high work function is used for at least a layer in contact with the EL layer 251. In the case where the counter electrode 252 is used as a cathode, a metal material having a low work function may be used for the counter electrode 252. Specifically, an alloy of aluminum and lithium can be used for the counter electrode 252.

Note that although an example of applying an embodiment of the present invention to a bottom emission structure in which light is emitted from the EL element 253 from the substrate 200 side has been described in this embodiment, an embodiment of the present invention can also be applied to a top emission display device in which light is emitted from the EL element 253 from the side opposite to the substrate 200 side or a dual emission display device in which light is emitted from the EL element 253 from both of the above-mentioned sides. In the case where the EL element 253 has a top emission structure, the pixel electrode 211 is used as a cathode, the counter electrode 252 is used as an anode, and the injection layers, transport layers, light-emitting layer, and the like of the EL layer 251 are stacked in the order reverse to the order of the bottom emission structure.

As described in this embodiment, the plurality of island-shaped wirings 236 is formed for the long lead wiring 216_j during steps with direct exposure to a plasma atmosphere, covered with an insulating layer so as not to be directly exposed to the plasma atmosphere, and electrically connected to one another in series in a later step. Since the plurality of island-shaped wirings 236 is used during the steps with direct exposure to a plasma atmosphere, the amount of accumulated charge can be reduced and ESD can be less likely to occur in positions where the plurality of island-shaped wirings 236 and wirings in a lower layer overlap with one another.

Thus, the thickness of the insulating layer 204 can be reduced, and the capacitance of the capacitor can be increased. By a small thickness of the insulating layer 204 serving as the gate insulating layer, the performance of the transistor can be improved. Since the area occupied by the capacitor or the transistor can be reduced, high definition of the display device is easily realized and display quality can be increased. Further, the semiconductor device is easily highly integrated.

This embodiment can be freely combined with the other embodiments.

Embodiment 5

In this embodiment, transistors each having a structure different from that of the transistor described in the above embodiment are described with reference to cross-sectional views in FIGS. 19A to 19C and FIGS. 20A to 20D. Note that the same portions as those in the above embodiment, portions having functions similar to those in the above embodiment, the same steps as those in the above embodiment, and steps similar to those in the above embodiment may be described as in the above embodiment, and repeated description is omitted in this embodiment. In addition, detailed description of the same portions is omitted.

Figure 19A:
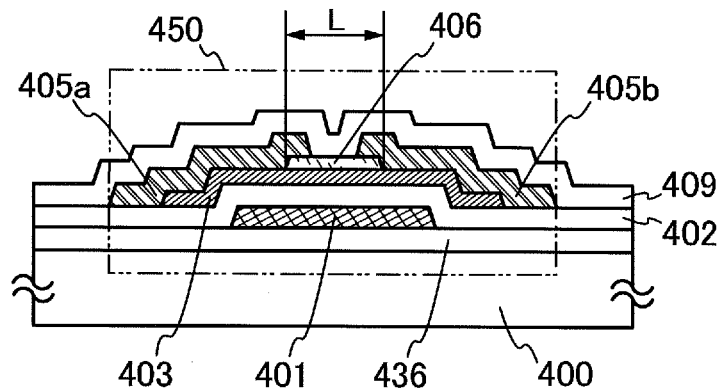
FIGS. 19A to 19C are cross-sectional views each illustrating a structure of a transistor.

A transistor 450 illustrated in FIG. 19A includes, over a substrate 400, an insulating layer 436 functioning as a base layer, a gate electrode 401, an insulating layer 402 functioning as a gate insulating layer, a semiconductor layer 403, a channel protective layer 406, a source electrode 405a, a drain electrode 405b, and an insulating layer 409. The transistor 450 has a kind of bottom-gate structure referred to as a channel-protective type (channel-stop type) and is also referred to as an inverted staggered transistor.

The semiconductor layer 403 and the channel protective layer 406 are preferably formed successively without exposing the interface between the semiconductor layer 403 and the channel protective layer 406 to the air. By forming the semiconductor layer 403 and the channel protective layer 406 successively without exposure to the air, impurities such as water, hydrogen, or hydrocarbon can be prevented from being attached to the interface between the semiconductor layer 403 and the channel protective layer 406.

The channel protective layer 406 can be formed using a material and a method similar to those of the insulating layer 402. Alternatively, the channel protective layer 406 may be formed using a material and a method similar to those of the insulating layer 207. For the channel protective layer 406, a material containing the same kind of component as the semiconductor layer 403 may be used. Specifically, for the channel protective layer 406, a material containing one or more of elements selected from constituent elements of the semiconductor layer 403 is preferably used.

The insulating layer 409 can be formed using a material and a method similar to those of the insulating layer 208 in the above embodiment.

The insulating layer 436 can be formed in a manner similar to that of the insulating layer 201 described in the above embodiment. For the insulating layer 436, a material containing the same kind of component as the semiconductor layer 403 may be used.

Note that the channel length L of the transistor 450 is determined by the width of the channel protective layer 406 in contact with the semiconductor layer 403 in a direction parallel with a carrier flow direction.

Figure 20A:
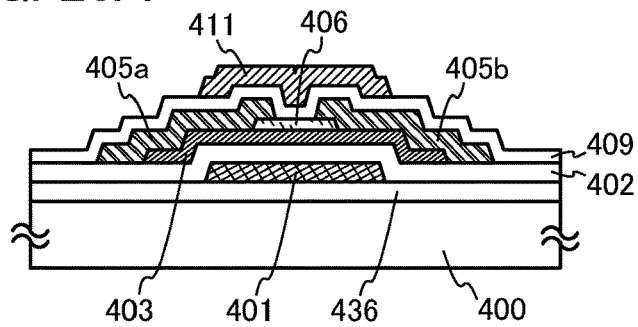
FIGS. 20A to 20D are cross-sectional views each illustrating a structure of a transistor.

An example in which a back gate electrode 411 is formed in the transistor 450 is illustrated in FIG. 20A. The back gate electrode 411 is formed over the channel formation region of the semiconductor layer 403 with the insulating layer 409 provided therebetween. Although FIG. 20A illustrates the example in which the back gate electrode 411 is formed over the insulating layer 409, the back gate electrode 411 may be formed over the channel protective layer 406 by using the same layer as the source electrode 405a and the drain electrode 405b.

The back gate electrode 411 is positioned so that the channel formation region of the semiconductor layer 403 is interposed between the gate electrode 401 and the back gate electrode 411. The back gate electrode 411 can be formed using a material and a method similar to those of the gate electrode 401, the source electrode 405a, or the drain electrode 405b.

The back gate electrode 411 may be electrically connected to one of the source electrode 405a and the drain electrode 405b or electrically connected to the gate electrode 401. Alternatively, the back gate electrode 411 may be connected nowhere and electrically floating (in a floating state). The placement of the back gate electrode 411 can reduce variations in characteristics which are caused when a plurality of transistors is formed, and realize high stability in operation of the semiconductor device. By changing a potential of the back gate electrode, the threshold voltage of the transistor 450 can be changed.

Figure 19B:
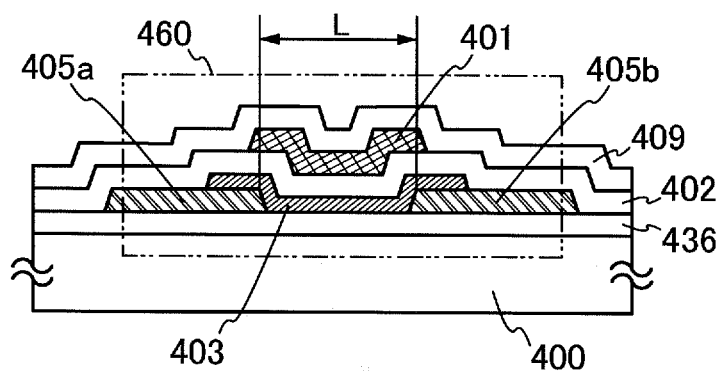

A transistor 460 illustrated in FIG. 19B includes, over the substrate 400, the source electrode 405a, the drain electrode 405b, the semiconductor layer 403, the insulating layer 402, and the gate electrode 401. The insulating layer 436 is formed between the substrate 400 and the semiconductor layer 403. The insulating layer 409 is formed over the transistor 460. The transistor 460 is referred to as a staggered transistor which is one of top-gate structures.

In the transistor 460, after a conductive layer is formed over the insulating layer 436, the source electrode 405a and the drain electrode 405b are formed by a photolithography process. The source electrode 405a and the drain electrode 405b can be formed by using a material and a method similar to those of the source electrode 206a and the drain electrode 206b described in the above embodiment.

Exposure at the time of the formation of the resist mask in the photolithography process may be performed using ultraviolet light, KrF laser light, or ArF laser light. The channel length L of the transistor 460 is determined by the distance between the source electrode 405a and the drain electrode 405b which are in contact with the semiconductor layer 403. In the case where light exposure is performed for a channel length L of less than 25 nm, the light exposure at the time of the formation of the resist mask in the photolithography process is preferably performed using extreme ultraviolet light having an extremely short wavelength of several nanometers to several tens of nanometers. In the light exposure by extreme ultraviolet light, the resolution is high and the focus depth is large. Therefore, the channel length L of the transistor to be formed later can be longer than or equal to 10 nm and shorter than or equal to 1000 nm, whereby operation speed of a circuit can be increased.

The insulating layer 409 which prevents impurities such as moisture or hydrogen from entering from the outside is preferably formed over the gate electrode 401 and the insulating layer 402 so that these impurities are not included in the semiconductor layer 403 again.

Figure 20B:
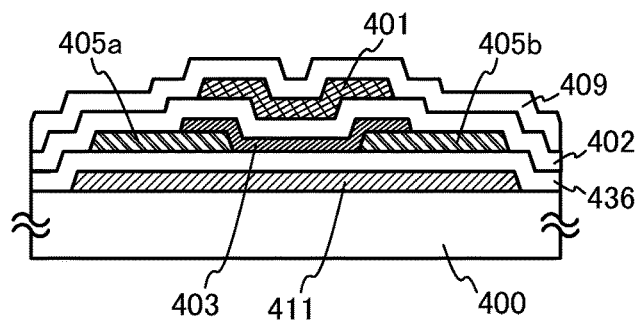

An example in which the back gate electrode 411 is formed in the transistor 460 is illustrated in FIG. 20B. The back gate electrode 411 is formed in a region overlapping with the channel formation region of the semiconductor layer 403 with the insulating layer 436 provided therebetween. By changing a potential of the back gate electrode 411, the threshold voltage of the transistor 460 can be changed.

Figure 19C:
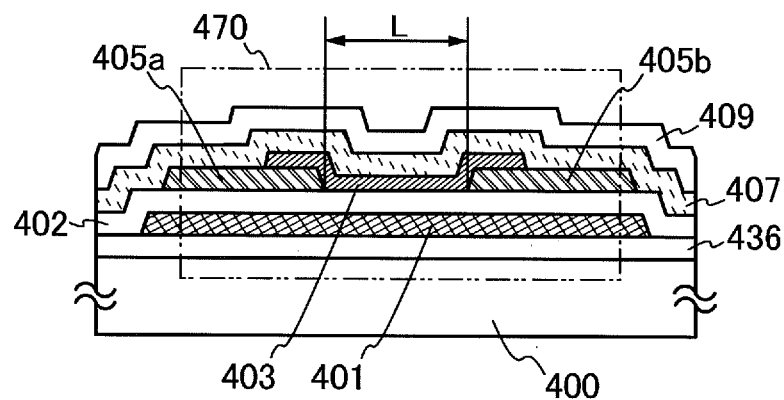

The transistor 470 illustrated in FIG. 19C includes, over the substrate 400, the gate electrode 401, the insulating layer 402, the semiconductor layer 403, the source electrode 405a, and the drain electrode 405b. An insulating layer 407 and the insulating layer 409 are stacked over the transistor 470 in this order. The transistor 470 is one of bottom-gate transistors.

The channel length L of the transistor 470 is determined by the distance between the source electrode 405a and the drain electrode 405b which are in contact with the semiconductor layer 403.

The insulating layer 407 can be formed using a material and a method similar to those of the insulating layer 207 described in the above embodiment.

Figure 20C:
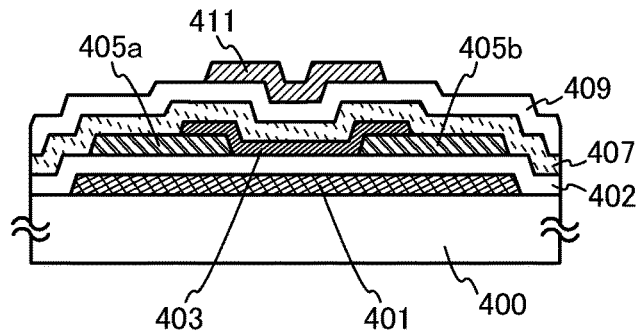

An example in which the back gate electrode 411 is formed over the transistor 470 is illustrated in FIG. 20C. The back gate electrode 411 is positioned so that the channel formation region of the semiconductor layer is interposed between the gate electrode and the back gate electrode. The back gate electrode 411 is formed using a conductive layer and is made to function in a manner similar to that of the gate electrode. By changing a potential of the back gate electrode, the threshold voltage of the transistor 470 can be changed.

Figure 20D:
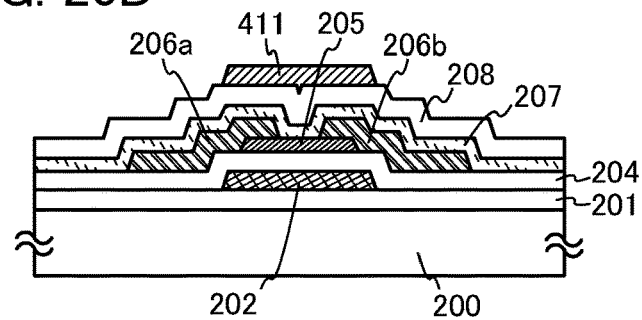

An example in which the back gate electrode 411 is formed over the transistor 111 described in the above embodiment is illustrated in FIG. 20D. By changing a potential of the back gate electrode, the threshold voltage of the transistor 111 can be changed. Although FIG. 20D illustrates the example in which the back gate electrode 411 is formed over the insulating layer 208, the back gate electrode 411 may be formed between the insulating layer 207 and the insulating layer 208.

This embodiment can be implemented in appropriate combination with any structure described in the other embodiments.

Embodiment 6

In this embodiment, examples of the display device described in the above embodiment are described with reference to FIGS. 21A to 21C and FIGS. 22A and 22B. Moreover, some or all of driver circuits which include the transistor an example of which is described in the above embodiment can be formed over a substrate where a pixel portion is formed, whereby a system-on-panel can be obtained.

Figure 21A:
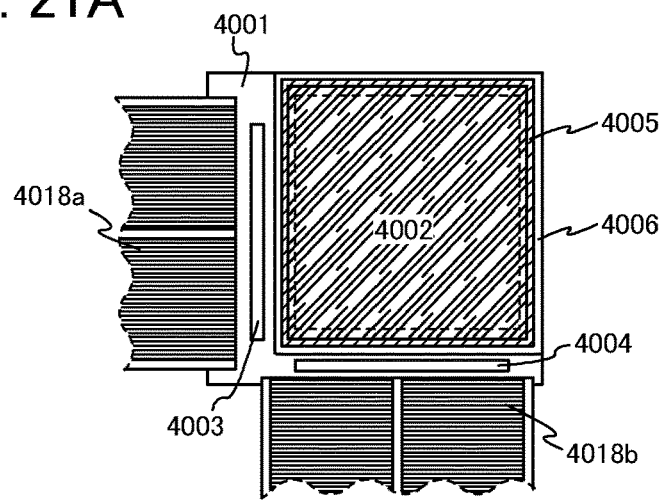
FIGS. 21A to 21C illustrate embodiments of the present invention.

In FIG. 21A, a sealant 4005 is provided to surround a pixel portion 4002 provided over a first substrate 4001, and the pixel portion 4002 is sealed using a second substrate 4006. In FIG. 21A, a signal line driver circuit 4003 and a scan line driver circuit 4004 each are formed using a single-crystal semiconductor or a polycrystalline semiconductor over a substrate prepared separately, and mounted in a region different from the region surrounded by the sealant 4005 over the first substrate 4001. Further, a variety of signals and potentials are supplied to the signal line driver circuit 4003, the scan line driver circuit 4004, and the pixel portion 4002 from flexible printed circuits (FPCs) 4018a and 4018b.

Figure 21B:
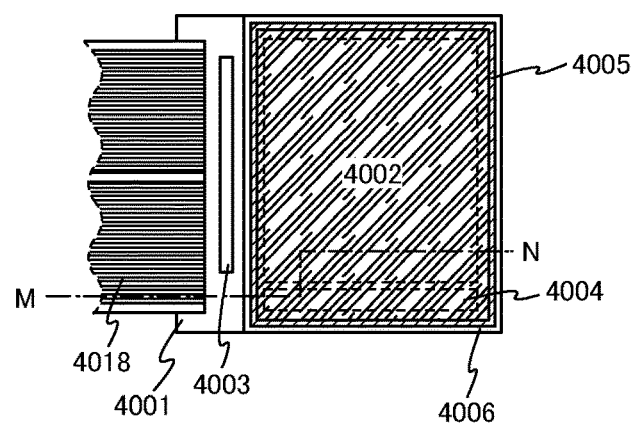
Figure 21C:
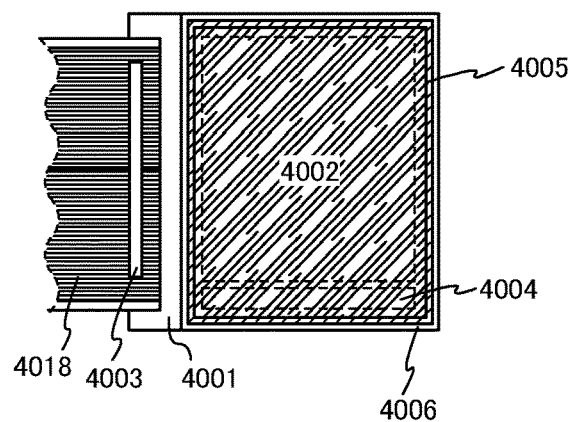

In FIGS. 21B and 21C, the sealant 4005 is provided to surround the pixel portion 4002 and the scan line driver circuit 4004 which are provided over the first substrate 4001. The second substrate 4006 is provided over the pixel portion 4002 and the scan line driver circuit 4004. Consequently, the pixel portion 4002 and the scan line driver circuit 4004 are sealed together with a display element, by the first substrate 4001, the sealant 4005, and the second substrate 4006. In FIGS. 21B and 21C, the signal line driver circuit 4003 which is formed using a single-crystal semiconductor or a polycrystalline semiconductor over a substrate prepared separately is mounted in a region different from the region surrounded by the sealant 4005 over the first substrate 4001. In FIGS. 21B and 21C, a variety of signals and potentials are supplied to the signal line driver circuit 4003, the scan line driver circuit 4004, and the pixel portion 4002 from an FPC 4018.

Although FIGS. 21B and 21C each illustrate the example in which the signal line driver circuit 4003 is formed separately and mounted over the first substrate 4001, one embodiment of the present invention is not limited to this structure. The scan line driver circuit may be separately formed and then mounted, or only part of the signal line driver circuit or part of the scan line driver circuit may be separately formed and then mounted.

The connection method of such a separately formed driver circuit is not particularly limited; a chip on glass (COG) method, a wire bonding method, a tape automated bonding (TAB) method, or the like can be used. FIG. 21A illustrates an example in which the signal line driver circuit 4003 and the scan line driver circuit 4004 are mounted by a COG method; FIG. 21B illustrates an example in which the signal line driver circuit 4003 is mounted by a COG method; and FIG. 21C illustrates an example in which the signal line driver circuit 4003 is mounted by a TAB method.

Further, the display device includes in its category, a panel in which the display element is sealed and a module in which an IC or the like including a controller is mounted over the panel.

The display device in this specification means an image display device, a display device, or a light source (including a lighting device). Further, the display device also includes the following modules in its category: a module to which a connector such as an FPC, a TAB tape, or a TCP is attached; a module having a TAB tape or a TCP at the tip of which a printed wiring board is provided; and a module in which an integrated circuit (IC) is directly mounted over the display element by a COG method.

The pixel portion and the scan line driver circuit provided over the first substrate include a plurality of transistors, and the transistor described in the above embodiment can be applied thereto.

As the display element provided in the display device, a liquid crystal element (also referred to as a liquid crystal display element) or a light-emitting element (also referred to as a light-emitting display element) can be used. The light-emitting element includes, in its category, an element whose luminance is controlled by a current or a voltage, and specifically includes, in its category, an inorganic EL element, an organic EL element, and the like. Furthermore, a display medium whose contrast is changed by an electric effect, such as electronic ink, can be used.

FIGS. 22A and 22B are cross-sectional views of a portion taken along chain line M-N in FIG. 21B. As illustrated in FIGS. 22A and 22B, the semiconductor device includes an electrode 4015 and an electrode 4016. The electrode 4015 and the electrode 4016 are electrically connected to a terminal included in the FPC 4018 through an anisotropic conductive layer 4019. The electrode 4016 is electrically connected to a wiring 4014 through an opening formed in an insulating layer 4022.

The electrode 4015 is formed using the same conductive layer as a first electrode layer 4030. The electrode 4016 is formed using the same conductive layer as source and drain electrodes of transistors 4010 and 4011. The wiring 4014 is formed using the same conductive layer as gate electrodes of the transistors 4010 and 4011. The electrode 4016 and the wiring 4014 are connected to each other through an opening formed in the insulating layer 4022.

The pixel portion 4002 and the scan line driver circuit 4004 which are provided over the first substrate 4001 include a plurality of transistors. FIGS. 22A and 22B illustrate the transistor 4010 included in the pixel portion 4002 and the transistor 4011 included in the scan line driver circuit 4004 as an example. Further, FIGS. 22A and 22B show an example of using a structure in which ESD is less likely to occur in a manufacturing process for the scan line driver circuit 4004. The structure in which ESD is less likely to occur in a manufacturing process, which is described in the above embodiment, can be used for the signal line driver circuit 4003, the scan line driver circuit 4004, and the like in addition to the pixel portion 4002.

In FIG. 22A, an insulating layer 4020 is provided over the transistors 4010 and 4011. In FIG. 22B, a planarization layer 4021 is further provided over an insulating layer 4024. An insulating layer 4023 is an insulating layer serving as a base layer, and the insulating layer 4022 is an insulating layer serving as a gate insulating layer.

For the planarization layer 4021, an organic material such as acrylic, polyimide, a benzocyclobutene-based resin, polyamide, an epoxy resin, or a siloxane-based resin can be used. In addition to such organic materials, it is also possible to use a low-dielectric constant material (a low-k material), phosphosilicate glass (PSG), borophosphosilicate glass (BPSG), or the like. Note that the planarization layer 4021 may be formed by stacking a plurality of insulating layers formed using these materials.

In this embodiment, the transistor using an oxide semiconductor for its semiconductor layer in which a channel is formed, which is described in the above embodiment, can be applied to the transistors 4010 and 4011.

A change in the electric characteristics of the transistor using an oxide semiconductor for its semiconductor layer is suppressed and thus the transistor is electrically stable. Accordingly, a semiconductor device with high reliability can be provided as the semiconductor devices of this embodiment in FIGS. 22A and 22B.

FIG. 22B illustrates an example in which a conductive layer 4017 is provided over the insulating layer 4024 so as to overlap with a channel formation region of the transistor 4011 for the driver circuit. In this embodiment, the conductive layer 4017 is formed of the same conductive layer as the first electrode layer 4030. The conductive layer 4017 is provided in the position overlapping with the channel formation region of the semiconductor layer, whereby the conductive layer 4017 functions as a back gate electrode and the amount of change in the threshold voltage of the transistor 4011 by a BT test can be further reduced. The potential of the conductive layer 4017 is either the same as or different from that of the gate electrode of the transistor 4011, and the conductive layer 4017 can function as a second gate electrode. The potential of the conductive layer 4017 may be GND, 0 V, or in a floating state. By controlling the potential applied to the conductive layer 4017, the threshold voltage of the transistor can be controlled. Note that a back gate electrode may be formed in the transistor 4010.

In addition, the conductive layer 4017 has a function of blocking an external electric field. In other words, the conductive layer 4017 has a function of preventing an external electric field (particularly, a function of preventing static electricity) from affecting the inside (a circuit portion including a thin film transistor). The blocking function of the conductive layer 4017 can prevent a change in electric characteristics of the transistor due to the effect of external electric field such as static electricity.

When the semiconductor layer is covered with the conductive layer 4017, light is prevented from entering the semiconductor layer from the conductive layer 4017 side. Therefore, photodegradation of the semiconductor layer can be prevented and deterioration in electric characteristics such as a shift of the threshold voltage of the transistor can be prevented.

The transistor 4010 included in the pixel portion 4002 is electrically connected to the display element in the display panel. There is no particular limitation on the kind of the display element as long as display can be performed; various kinds of display elements can be employed.

An example of a liquid crystal display device using a liquid crystal element as a display element is illustrated in FIG. 22A. In FIG. 22A, a liquid crystal element 4013 which is a display element includes the first electrode layer 4030, a second electrode layer 4031, and a liquid crystal layer 4008. Insulating layers 4032 and 4033 serving as alignment films are provided so that the liquid crystal layer 4008 is interposed therebetween. The second electrode layer 4031 is provided on the second substrate 4006 side. The second electrode layer 4031 overlaps with the first electrode layer 4030 with the liquid crystal layer 4008 interposed therebetween.

A spacer 4035 is a columnar spacer obtained by selective etching of an insulating layer and is provided in order to control the distance between the first electrode layer 4030 and the second electrode layer 4031 (a cell gap). Alternatively, a spherical spacer may be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. The above liquid crystal material exhibits a cholesteric phase, a smectic phase, a cubic phase, a chiral nematic phase, an isotropic phase, or the like depending on conditions.

Alternatively, a liquid crystal exhibiting a blue phase for which an alignment film is unnecessary may be used. The blue phase is one of liquid crystal phases, which is generated just before a cholesteric phase changes into an isotropic phase while the temperature of a cholesteric liquid crystal is increased. Since the blue phase appears only in a narrow temperature range, a liquid crystal composition into which a chiral agent is mixed at 5 wt % or more is used for the liquid crystal layer in order to improve the temperature range. The liquid crystal composition which includes a liquid crystal showing a blue phase and a chiral agent has a short response time of 1 msec or less, has optical isotropy, which makes the alignment process unneeded, and has a small viewing angle dependence. In addition, since an alignment film does not need to be provided and rubbing treatment is unnecessary, electrostatic discharge damage caused by the rubbing treatment can be prevented and defects and damage of the liquid crystal display device can be reduced in the manufacturing process. Thus, productivity of the liquid crystal display device can be increased. A transistor that uses an oxide semiconductor layer particularly has a possibility that electric characteristics of the transistor may change significantly by the influence of static electricity and deviate from the designed range. Therefore, it is more effective to use a liquid crystal material exhibiting a blue phase for the liquid crystal display device including the transistor using an oxide semiconductor layer.

The specific resistivity of the liquid crystal material is greater than or equal to $1 \times 10^9$ $\Omega \cdot cm$, preferably greater than or equal to $1 \times 10^{11}$ $\Omega \cdot cm$, further preferably greater than or equal to $1 \times 10^{12}$ $\Omega \cdot cm$. The specific resistivity in this specification is measured at 20° C.

In the transistor used in this embodiment, which uses an oxide semiconductor for its semiconductor layer in which a channel is formed, the current in an off state (the off-state current) can be made small. Accordingly, an electrical signal such as an image signal can be retained for a long period, and thus a writing interval can be set long in a power-on state. Accordingly, frequency of refresh operation can be reduced, which leads to an effect of suppressing power consumption.

The size of storage capacitor formed in the liquid crystal display device is set considering the leakage current of the transistor provided in the pixel portion or the like so that charge can be held for a predetermined period. The size of the storage capacitor may be set considering the off-state current of the transistor or the like. Owing to the transistor using an oxide semiconductor for its semiconductor layer, the size of the storage capacitor can be less than or equal to ⅓, preferably less than or equal to ⅕ of the liquid crystal capacitance of each pixel.

In the transistor using an oxide semiconductor for the above semiconductor layer in which a channel is formed, relatively high field-effect mobility can be obtained, which enables high-speed operation. Consequently, when the above transistor is used in a pixel portion of a semiconductor device having a display function, high-quality images can be displayed. In addition, since a driver circuit portion and a pixel portion can be formed separately over one substrate, the number of components of the semiconductor device can be reduced.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an antiferroelectric liquid crystal (AFLC) mode, or the like can be used.

The liquid crystal display device described in this embodiment may be a normally black liquid crystal display device such as a transmissive liquid crystal display device utilizing a vertical alignment (VA) mode. The vertical alignment mode is a method of controlling alignment of liquid crystal molecules of a liquid crystal display panel, in which liquid crystal molecules are aligned vertically to a panel surface when no voltage is applied. Some examples are given as the vertical alignment mode. For example, a multi-domain vertical alignment (MVA) mode, a patterned vertical alignment (PVA) mode, an advanced super view (ASV) mode, or the like can be used. Moreover, it is possible to use a method called domain multiplication or multi-domain design, in which a pixel is divided into some regions (subpixels) and molecules are aligned in different directions in their respective regions.

In the display device, a black matrix (light-blocking layer), an optical member (optical substrate) such as a polarizing member, a retardation member, or an anti-reflection member, and the like are provided as appropriate. For example, circular polarization may be obtained with a polarizing substrate and a retardation substrate. In addition, a backlight, a side light, or the like may be used as a light source.

As the display method in the pixel portion, a progressive method, an interlace method, or the like can be employed. Further, color elements controlled in the pixel for color display are not limited to three colors: R, G, and B (R, G, and B correspond to red, green, and blue, respectively). For example, R, G, B, and W (W corresponds to white); R, G, B, and one or more of yellow, cyan, magenta, and the like; or the like can be used. Further, the sizes of display regions may be different between respective dots of color elements. The present invention is not limited to a display device for color display but can also be applied to a display device for monochrome display.

Alternatively, as the display element included in the display device, a light-emitting element utilizing electroluminescence can be used. Light-emitting elements utilizing electroluminescence are classified according to whether the light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from its pair of electrodes into a layer containing a light-emitting organic compound, and current flows. The carriers (electrons and holes) are recombined, and thus, the light-emitting organic compound is excited; the light-emitting organic compound returns to a ground state from the excited state, thereby emitting light. Owing to such a mechanism, this light-emitting element is referred to as a current-excitation light-emitting element.

Inorganic EL elements are classified according to their element structures into a dispersion-type inorganic EL element and a thin-film inorganic EL element. The dispersion-type inorganic EL element has a light-emitting layer where particles of a light-emitting material are dispersed in a binder, and its light emission mechanism is donor-acceptor recombination type light emission that utilizes a donor level and an acceptor level. The thin-film inorganic EL element has a structure where a light-emitting layer is sandwiched between dielectric layers, which are further sandwiched between electrodes, and its light emission mechanism is localized type light emission that utilizes inner-shell electron transition of metal ions. An example in which the organic EL element is used as the light-emitting element is described here.

To extract light emitted from the light-emitting element, at least one of the pair of electrodes is transparent. The light-emitting element can have a top emission structure in which light emission is extracted through the surface on the side opposite to the substrate; a bottom emission structure in which light emission is extracted through the surface on the substrate side; or a dual emission structure in which light emission is extracted through the surface on the side opposite to the substrate and the surface on the substrate side. A light-emitting element having any of these emission structures can be used.

FIG. 22B illustrates an example of a light-emitting device in which a light-emitting element is used as a display element. A light-emitting element 4513 which is a display element is electrically connected to the transistor 4010 provided in the pixel portion 4002. The structure of the light-emitting element 4513 is not limited to a stacked-layer structure illustrated in FIG. 22B, which includes the first electrode layer 4030, an electroluminescent layer 4511, and the second electrode layer 4031. The structure of the light-emitting element 4513 can be changed as appropriate depending on the direction in which light is extracted from the light-emitting element 4513, or the like.

A partition 4510 can be formed using an organic insulating material or an inorganic insulating material. It is particularly preferable that the partition 4510 be formed using a photosensitive resin material to have an opening over the first electrode layer 4030 so that a sidewall of the opening is formed as a tilted surface with a continuous curvature.

The electroluminescent layer 4511 is formed either of a single layer or a plurality of layers stacked.

A protective layer may be formed over the second electrode layer 4031 and the partition 4510 in order to prevent entry of oxygen, hydrogen, moisture, carbon dioxide, or the like into the light-emitting element 4513. As the protective layer, a silicon nitride film, a silicon nitride oxide film, an aluminum oxide film, an aluminum nitride film, an aluminum oxynitride film, an aluminum nitride oxide film, a DLC film, or the like can be formed. In addition, in a space which is formed with the first substrate 4001, the second substrate 4006, and the sealant 4005, a filler 4514 is provided for sealing. It is preferable that a panel be packaged (sealed) with a protective film (such as a laminate film or an ultraviolet curable resin film) or a cover material with high air-tightness and little degasification so that the panel is not exposed to the outside air, in this manner.

As the filler 4514, as well as an inert gas such as nitrogen or argon, an ultraviolet curable resin or a thermosetting resin can be used; polyvinyl chloride (PVC), an acrylic resin, polyimide, an epoxy resin, a silicone resin, polyvinyl butyral (PVB), ethylene vinyl acetate (EVA), or the like can be used. For example, nitrogen is used for the filler.

Further, if needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

The first electrode layer and the second electrode layer (each of which may be called a pixel electrode layer, a common electrode layer, a counter electrode layer, or the like) for applying voltage to the display element may have light-transmitting properties or light-reflecting properties, which depends on the direction in which light is extracted, the position where the electrode layer is provided, and the pattern structure of the electrode layer.

The first electrode layer 4030 and the second electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

The first electrode layer 4030 and the second electrode layer 4031 each can be formed using one or more kinds selected from metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); alloys thereof; and nitrides thereof.

A conductive composition containing a conductive high molecule (also referred to as a conductive polymer) can also be used for the first electrode layer 4030 and the second electrode layer 4031. As the conductive high molecule, a so-called π-electron conjugated conductive polymer can be used. For example, polyaniline or a derivative thereof, polypyrrole or a derivative thereof, polythiophene or a derivative thereof, a copolymer of two or more kinds of aniline, pyrrole, and thiophene or a derivative thereof can be given.

Since the transistor is easily damaged by static electricity or the like, a protection circuit for protecting the driver circuit is preferably provided. The protection circuit is preferably formed using a nonlinear element.

Application of the transistor using an oxide semiconductor for its semiconductor layer in which a channel is formed enables a highly reliable semiconductor device having a display function (display device) to be provided. With the use of the wiring structure described in the above embodiment, ESD can be less likely to occur in a manufacturing process. Thus, a semiconductor device which has high integration, a large size, and a display function with high display quality can be provided. Further, a semiconductor device with low power consumption can be provided.

This embodiment can be implemented in appropriate combination with any structure described in the other embodiments.

Embodiment 7

The display device described in the above embodiment can be applied to semiconductor devices that display a 3D image. In this embodiment, with the use of a display device which switches between an image for a left eye and an image for a right eye at high speed, an example in which a 3D image which is a moving image or a still image is seen with dedicated glasses with which videos of the display device are synchronized is described with reference to FIGS. 23A and 23B.

Figure 23A:
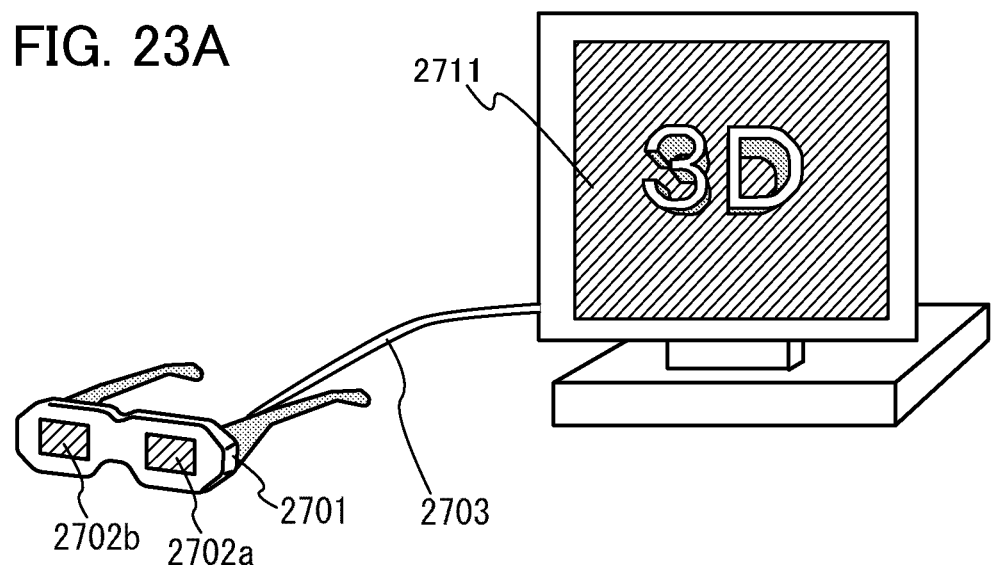
FIGS. 23A and 23B illustrate one embodiment of the present invention.

FIG. 23A illustrates an external view in which a display device 2711 and dedicated glasses 2701 are connected to each other with a cable 2703. Any of the display devices disclosed in this specification can be used as the display device 2711. In the dedicated glasses 2701, shutters provided in a panel 2702a for a left eye and a panel 2702b for a right eye are alternately opened and closed, whereby a user can see an image of the display device 2711 as a 3D image.

Figure 23B:
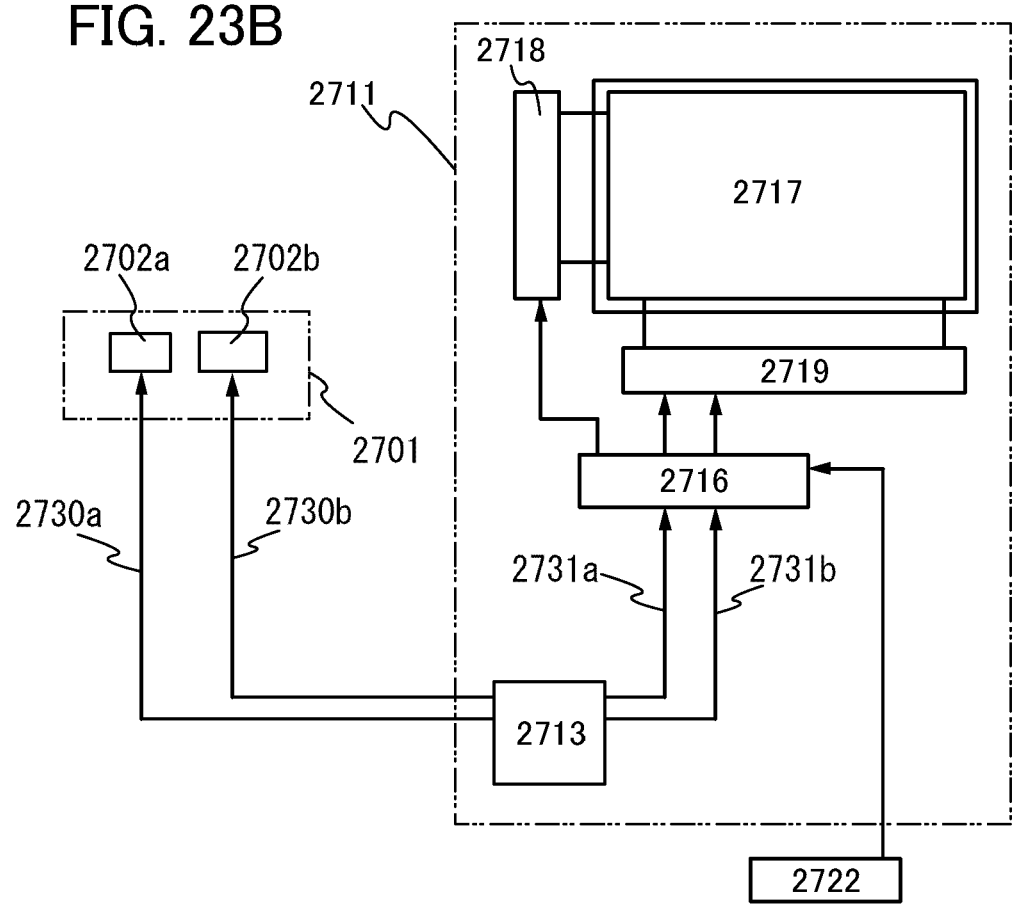

In addition, FIG. 23B is a block diagram illustrating a main structure of the display device 2711 and the dedicated glasses 2701.

The display device 2711 illustrated in FIG. 23B includes a display control circuit 2716, a display portion 2717, a timing generator 2713, a source line driver circuit 2718, an external operation unit 2722, and a gate line driver circuit 2719. Note that an output signal changes in accordance with operation by the external operation unit 2722 such as a keyboard.

In the timing generator 2713, a start pulse signal and the like are formed, and a signal for synchronizing an image for a left eye and the shutter of the panel 2702a for a left eye, a signal for synchronizing an image for a right eye and the shutter of the panel 2702b for a right eye, and the like are formed.

A synchronization signal 2731a of the image for a left eye is input to the display control circuit 2716, so that the image for a left eye is displayed on the display portion 2717. At the same time, a synchronization signal 2730a for opening the shutter of the panel 2702a for a left eye is input to the panel 2702a for a left eye. In addition, a synchronization signal 2731b of the image for a right eye is input to the display control circuit 2716, so that the image for a right eye is displayed on the display portion 2717. At the same time, a synchronization signal 2730b for opening the shutter of the panel 2702b for a right eye is input to the panel 2702b for a right eye.

Since switching between an image for a left eye and an image for a right eye is performed at high speed, the display device 2711 preferably employs a successive color mixing method (a field sequential method) in which color display is performed by time division with use of light-emitting diodes (LEDs).

Further, since a field sequential method is employed, it is preferable that the timing generator 2713 input signals that synchronize with the synchronization signals 2730a and 2730b to the backlight portion of the light-emitting diodes. Note that the backlight portion includes LEDs of R, G, and B colors.

This embodiment can be implemented in appropriate combination with any of the other embodiments disclosed in this specification.

Embodiment 8

In this embodiment, examples of electronic devices each including the display device described in the above embodiment are described.

Figure 24A:
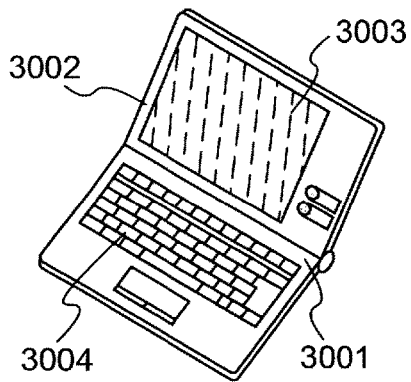
FIGS. 24A to 24F illustrate electronic devices.

FIG. 24A illustrates a laptop personal computer, which includes a main body 3001, a housing 3002, a display portion 3003, a keyboard 3004, and the like. By using the display device described in the above embodiment, a highly reliable laptop personal computer can be obtained.

Figure 24B:
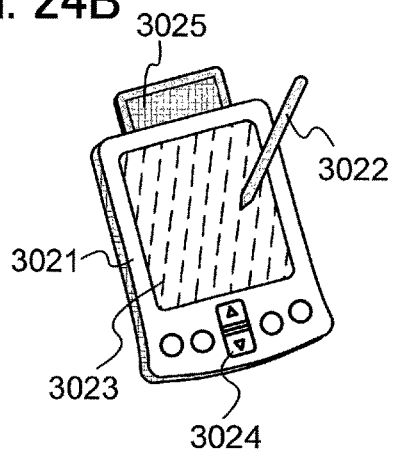

FIG. 24B is a personal digital assistant (PDA) which includes a main body 3021 provided with a display portion 3023, an external interface 3025, operation buttons 3024, and the like. A stylus 3022 is included as an accessory for operation. By using the display device described in the above embodiment, a highly reliable personal digital assistant (PDA) can be obtained.

Figure 24C:
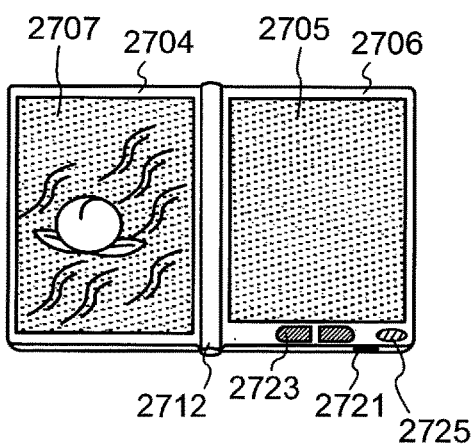

FIG. 24C illustrates an example of an e-book reader. For example, the e-book reader includes two housings, a housing 2706 and a housing 2704. The housing 2706 is combined with the housing 2704 by a hinge 2712, so that the e-book reader can be opened and closed using the hinge 2712 as an axis. With such a structure, the e-book reader can operate like a paper book.

A display portion 2705 and a display portion 2707 are incorporated in the housing 2706 and the housing 2704, respectively. The display portion 2705 and the display portion 2707 may display a continuous image or different images. In the structure where different images are displayed on different display portions, for example, the right display portion (the display portion 2705 in FIG. 24C) displays text and the left display portion (the display portion 2707 in FIG. 24C) displays graphics. By using the display device described in the above embodiment, a highly reliable e-book reader can be obtained.

FIG. 24C illustrates an example in which the housing 2706 is provided with an operation portion and the like. For example, the housing 2706 is provided with a power supply terminal 2721, operation keys 2723, a speaker 2725, and the like. With the operation keys 2723, pages can be turned. Note that a keyboard, a pointing device, or the like may also be provided on the surface of the housing, on which the display portion is provided. Furthermore, an external connection terminal (an earphone terminal, a USB terminal, or the like), a recording medium insertion portion, and the like may be provided on the back surface or the side surface of the housing. Further, the e-book reader may have a function of an electronic dictionary.

The e-book reader may transmit and receive data wirelessly. Through wireless communication, desired book data or the like can be purchased and downloaded from an e-book server.

Figure 24D:
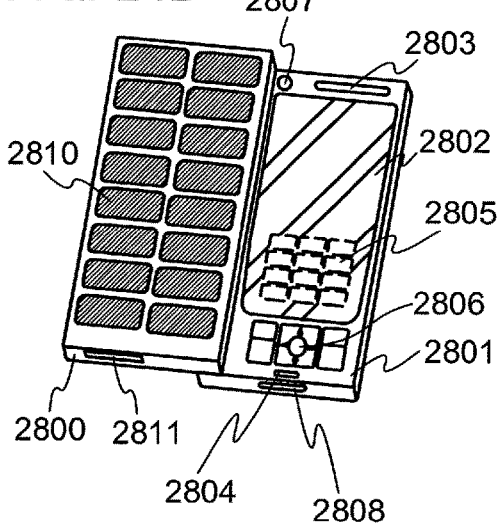

FIG. 24D illustrates a mobile phone, which includes two housings, a housing 2800 and a housing 2801. The housing 2801 includes a display panel 2802, a speaker 2803, a microphone 2804, a pointing device 2806, a camera lens 2807, an external connection terminal 2808, and the like. In addition, the housing 2800 includes a solar cell 2810 having a function of charge of the mobile phone, an external memory slot 2811, and the like. Further, an antenna is incorporated in the housing 2801.

The display panel 2802 is provided with a touch screen. A plurality of operation keys 2805 which is displayed as images is illustrated by dashed lines in FIG. 24D. Note that a boosting circuit by which a voltage output from the solar cell 2810 is increased to be sufficiently high for each circuit is also included.

In the display panel 2802, the display direction can be appropriately changed depending on a usage pattern. Further, the mobile phone is provided with the camera lens 2807 on the same surface as the display panel 2802, and thus it can be used as a video phone. The speaker 2803 and the microphone 2804 can be used for videophone calls, recording and playing sound, and the like as well as voice calls. Moreover, the housings 2800 and 2801 in a state where they are developed as illustrated in FIG. 24D can shift by sliding so that one is lapped over the other; therefore, the size of the mobile phone can be reduced, which makes the mobile phone suitable for being carried.

The external connection terminal 2808 can be connected to an AC adapter and various types of cables such as a USB cable, and charging and data communication with a personal computer or the like are possible. Moreover, a large amount of data can be stored by inserting a storage medium into the external memory slot 2811 and can be moved.

Further, in addition to the above functions, an infrared communication function, a television reception function, or the like may be provided. By using the display device described in the above embodiment, a highly reliable mobile phone can be provided.

Figure 24E:
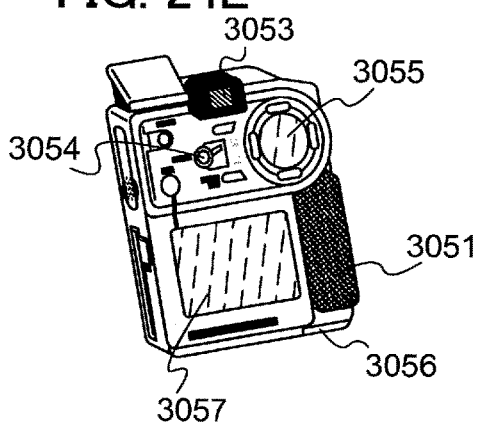

FIG. 24E illustrates a digital video camera which includes a main body 3051, a display portion A 3057, an eyepiece 3053, an operation switch 3054, a display portion B 3055, a battery 3056, and the like. By using the display device described in the above embodiment, a highly reliable digital video camera can be provided.

Figure 24F:
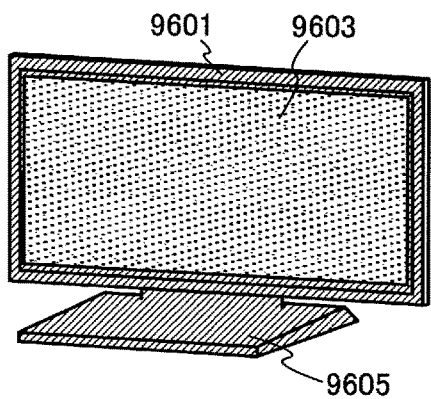

FIG. 24F illustrates an example of a television set. In the television set, a display portion 9603 is incorporated in a housing 9601. The display portion 9603 can display images. Here, the housing 9601 is supported by a stand 9605. By using the display device described in the above embodiment, a highly reliable television set can be provided.

The television set can be operated by an operation switch of the housing 9601 or a separate remote controller. Further, the remote controller may be provided with a display portion for displaying data output from the remote controller.

Note that the television set is provided with a receiver, a modem, and the like. With the use of the receiver, general television broadcasting can be received. Moreover, when the television set is connected to a communication network with or without wires via the modem, one-way (from a sender to a receiver) or two-way (between a sender and a receiver or between receivers) information communication can be performed.

This embodiment can be implemented in appropriate combination with any structure described in the other embodiments.

This application is based on Japanese Patent Application serial no. 2012-092351 filed with Japan Patent Office on Apr. 13, 2012, the entire contents of which are hereby incorporated by reference.

What is claimed is:

1. A semiconductor device comprising:
a first gate wiring;
a second gate wiring;
a first wiring extending in parallel with the first gate wiring and the second gate wiring;
a gate insulating layer over the first gate wiring, the second gate wiring, and the first wiring;
a semiconductor layer over the gate insulating layer;
a second wiring over the semiconductor layer, the first gate wiring, the first wiring, and the gate insulating layer;
a third wiring over the gate insulating layer;
a fourth wiring over the second gate wiring and the gate insulating layer;
an insulating layer over the second wiring, the third wiring, and the fourth wiring;
a fifth wiring over the insulating layer; and
a sixth wiring over the insulating layer,
wherein the second wiring, the third wiring, and the fourth wiring are in direct contact with a top surface of the gate insulating layer,
wherein the insulating layer comprises a first opening, a second opening, a third opening, and a fourth opening,
wherein the fifth wiring is electrically connected to the second wiring through the first opening,
wherein the fifth wiring is electrically connected to the third wiring through the second opening, wherein the sixth wiring is electrically connected to the third wiring through the third opening, and wherein the sixth wiring is electrically connected to the fourth wiring through the fourth opening.

2. The semiconductor device according to claim 1, wherein the second wiring comprises the same material as the third wiring.

3. The semiconductor device according to claim 1, wherein each of the second wiring and the third wiring comprises a nitride of a metal element.

4. The semiconductor device according to claim 1, wherein each of the first gate wiring and the second gate wiring comprises copper.

5. The semiconductor device according to claim 1, wherein the gate insulating layer comprises aluminum oxide.

6. The semiconductor device according to claim 1, wherein an entirety of the semiconductor layer overlaps the first gate wiring.

7. The semiconductor device according to claim 1, wherein the semiconductor layer comprises an oxide semiconductor.

8. A semiconductor device comprising:
a first gate wiring;
a second gate wiring;
a first wiring extending in parallel with the first gate wiring and the second gate wiring;
a gate insulating layer over the first gate wiring, the second gate wiring, and the first wiring;
a semiconductor layer over the gate insulating layer;
a second wiring over the semiconductor layer, the first gate wiring, the first wiring, and the gate insulating layer;
a third wiring over the gate insulating layer;
a fourth wiring over the second gate wiring and the gate insulating layer;
an insulating layer over the second wiring, the third wiring, and the fourth wiring;
a fifth wiring over the insulating layer; and
a sixth wiring over the insulating layer,
wherein the second wiring, the third wiring, and the fourth wiring are in direct contact with a top surface of the gate insulating layer,
wherein the insulating layer comprises a first opening, a second opening, a third opening, and a fourth opening,
wherein the fifth wiring is electrically connected to the second wiring through the first opening,
wherein the fifth wiring is electrically connected to the third wiring through the second opening,
wherein the second wiring intersects the first gate wiring and the first wiring,
wherein the fourth wiring intersects the second gate wiring,
wherein the sixth wiring is electrically connected to the third wiring through the third opening, and
wherein the sixth wiring is electrically connected to the fourth wiring through the fourth opening.

9. The semiconductor device according to claim 8, wherein the second wiring comprises the same material as the third wiring.

10. The semiconductor device according to claim 8, wherein each of the second wiring and the third wiring comprises a nitride of a metal element.

11. The semiconductor device according to claim 8, wherein each of the first gate wiring and the second gate wiring comprises copper.

12. The semiconductor device according to claim 8, wherein the gate insulating layer comprises aluminum oxide.

13. The semiconductor device according to claim 8, wherein an entirety of the semiconductor layer overlaps the first gate wiring.

14. The semiconductor device according to claim 8, wherein the semiconductor layer comprises an oxide semiconductor.

* * * * *